United States Patent
Mitsuhashi et al.

(10) Patent No.: US 9,153,490 B2
(45) Date of Patent: Oct. 6, 2015

(54) SOLID-STATE IMAGING DEVICE, MANUFACTURING METHOD OF SOLID-STATE IMAGING DEVICE, MANUFACTURING METHOD OF SEMICONDUCTOR DEVICE, SEMICONDUCTOR DEVICE, AND ELECTRONIC DEVICE

(75) Inventors: Ikue Mitsuhashi, Kanagawa (JP); Kentaro Akiyama, Kanagawa (JP); Koji Kikuchi, Kanagawa (JP)

(73) Assignee: SONY CORPORATION (JP)

( * ) Notice: Subject to any disclaimer, the term of this patent is extended or adjusted under 35 U.S.C. 154(b) by 372 days.

(21) Appl. No.: 13/547,698

(22) Filed: Jul. 12, 2012

(65) Prior Publication Data

US 2013/0020468 A1    Jan. 24, 2013

(30) Foreign Application Priority Data

Jul. 19, 2011 (JP) ................................ 2011-157977
Jul. 25, 2011 (JP) ................................ 2011-162228
Sep. 9, 2011 (JP) ................................ 2011-196785

(51) Int. Cl.
H01L 21/768    (2006.01)
H01L 23/48    (2006.01)
H01L 27/146    (2006.01)

(52) U.S. Cl.
CPC ........ *H01L 21/76898* (2013.01); *H01L 23/481* (2013.01); *H01L 27/1464* (2013.01); *H01L 27/1469* (2013.01); *H01L 27/14634* (2013.01); *H01L 27/14636* (2013.01); *H01L 27/14621* (2013.01); *H01L 27/14623* (2013.01); *H01L 27/14627* (2013.01); *H01L 27/14685* (2013.01); *H01L 2924/0002* (2013.01)

(58) Field of Classification Search
USPC .............. 257/431, 432, 433, 434; 250/208.1, 250/208.2, 214.1, 214 R, 214 DC
See application file for complete search history.

(56) References Cited

U.S. PATENT DOCUMENTS 7,193,289 B2 * 3/2007 Adkisson et al. ............. 257/431
2009/0250777 A1 * 10/2009 Takamiya ..................... 257/432
2010/0032782 A1 2/2010 Yun

FOREIGN PATENT DOCUMENTS

| CN | 102110700 | 6/2011 |
|---|---|---|
| JP | 2005-123327 | 5/2005 |
| JP | 2005-150140 | 6/2005 |
| JP | 2005-150463 | 6/2005 |
| JP | 2006-120805 | 5/2006 |
| JP | 2006-269766 | 10/2006 |
| JP | 2006-303062 | 11/2006 |
| JP | 2008-071980 | 3/2008 |
| JP | 2008-108917 | 5/2008 |
| JP | 2008-182142 | 8/2008 |

(Continued)

*Primary Examiner* — Francis M Legasse, Jr.
(74) *Attorney, Agent, or Firm* — Sheridan Ross P.C.

(57) ABSTRACT

A solid-state imaging device has a sensor substrate having a pixel region on which photoelectric converters are arrayed; a driving circuit provided on a front face side that is opposite from a light receiving face as to the photoelectric converters on the sensor substrate; an insulation layer, provided on the light receiving face, and having a stepped construction wherein the film thickness of the pixel region is thinner than the film thickness in a periphery region provided on the outside of the pixel region; a wiring provided to the periphery region on the light receiving face side; and on-chip lenses provided to positions corresponding to the photoelectric converters on the insulation layer.

12 Claims, 50 Drawing Sheets

(56) References Cited

FOREIGN PATENT DOCUMENTS

| JP | 4349232 | 7/2009 |
| JP | 2009-194361 | 8/2009 |
| JP | 2009-252949 | 10/2009 |
| JP | 2009-290000 | 12/2009 |
| JP | 2010-135844 | 6/2010 |
| JP | 2010-219339 | 9/2010 |
| JP | 2010-245506 | 10/2010 |
| JP | 2011-096851 | 5/2011 |
| JP | 2011-109099 | 6/2011 |

* cited by examiner

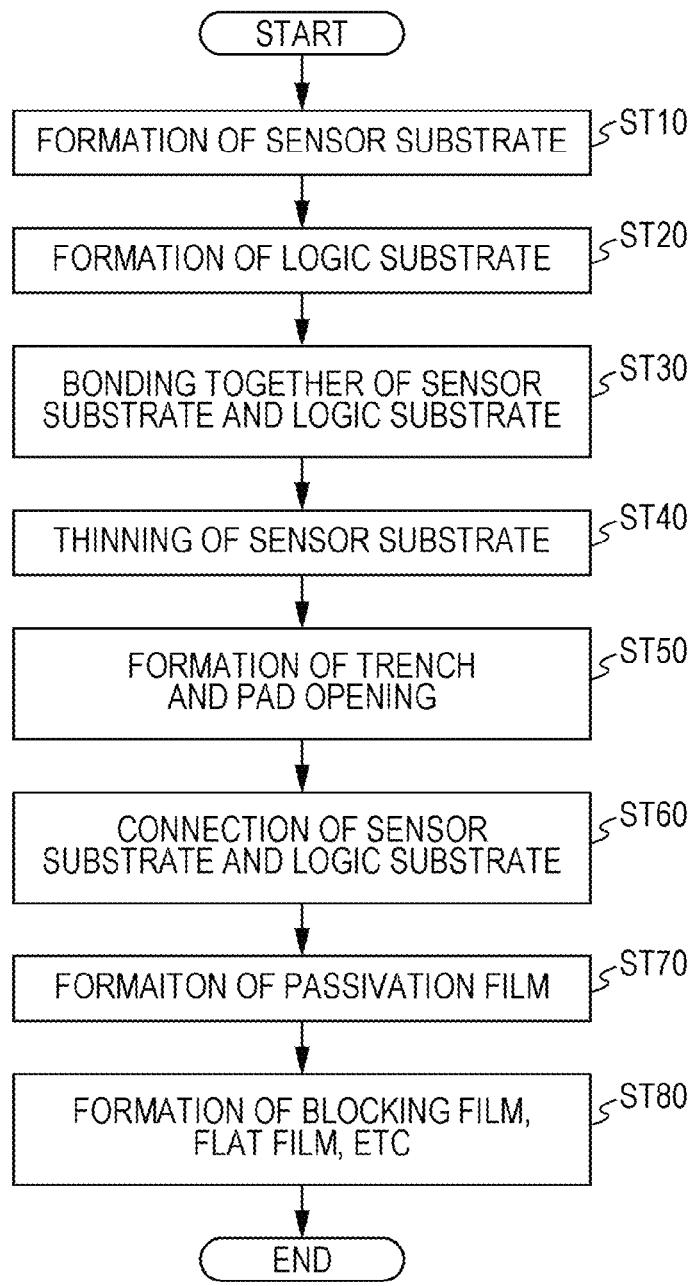

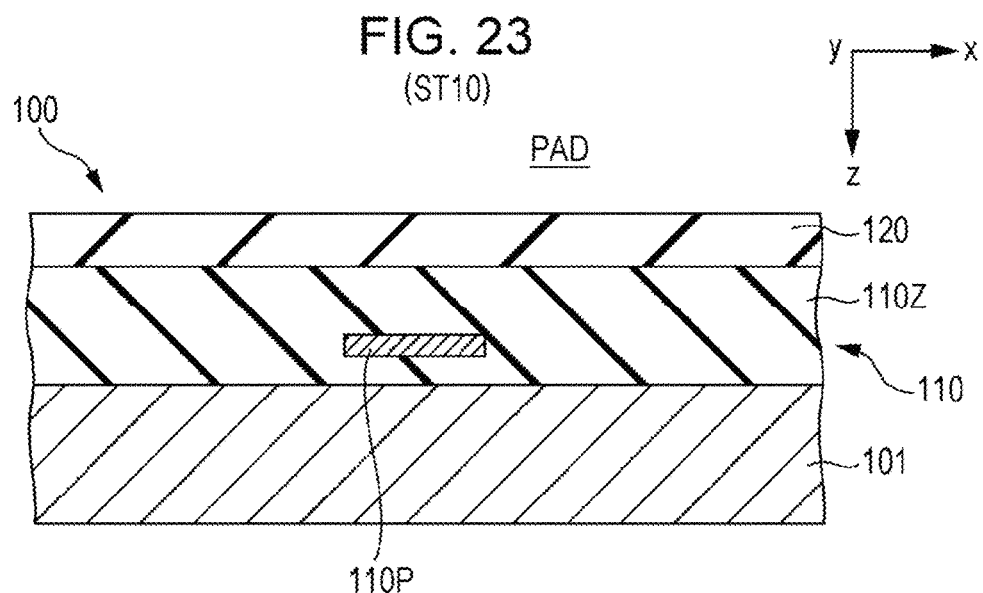
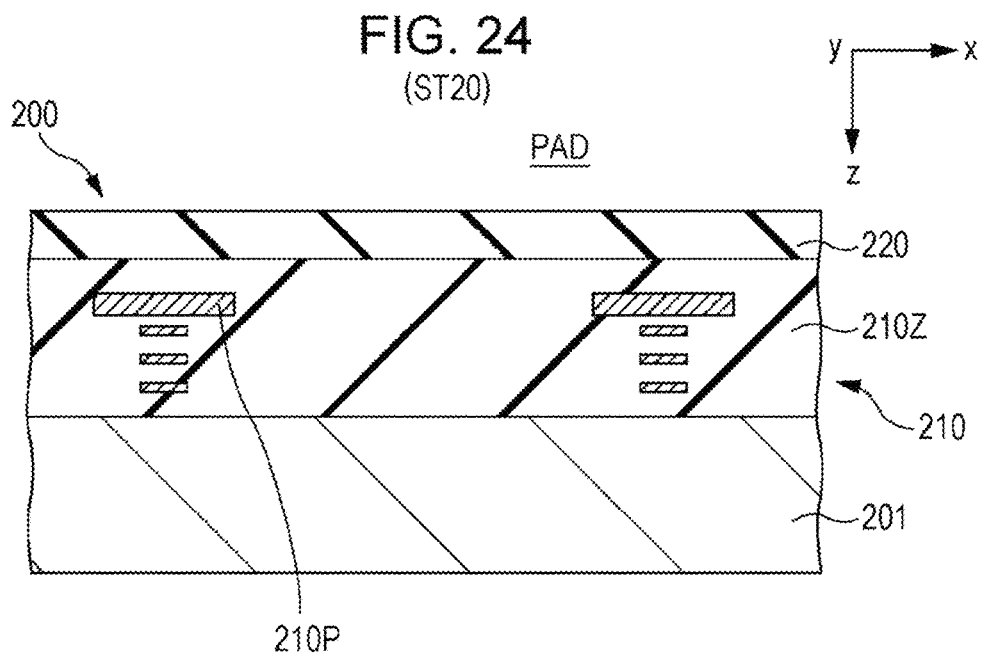

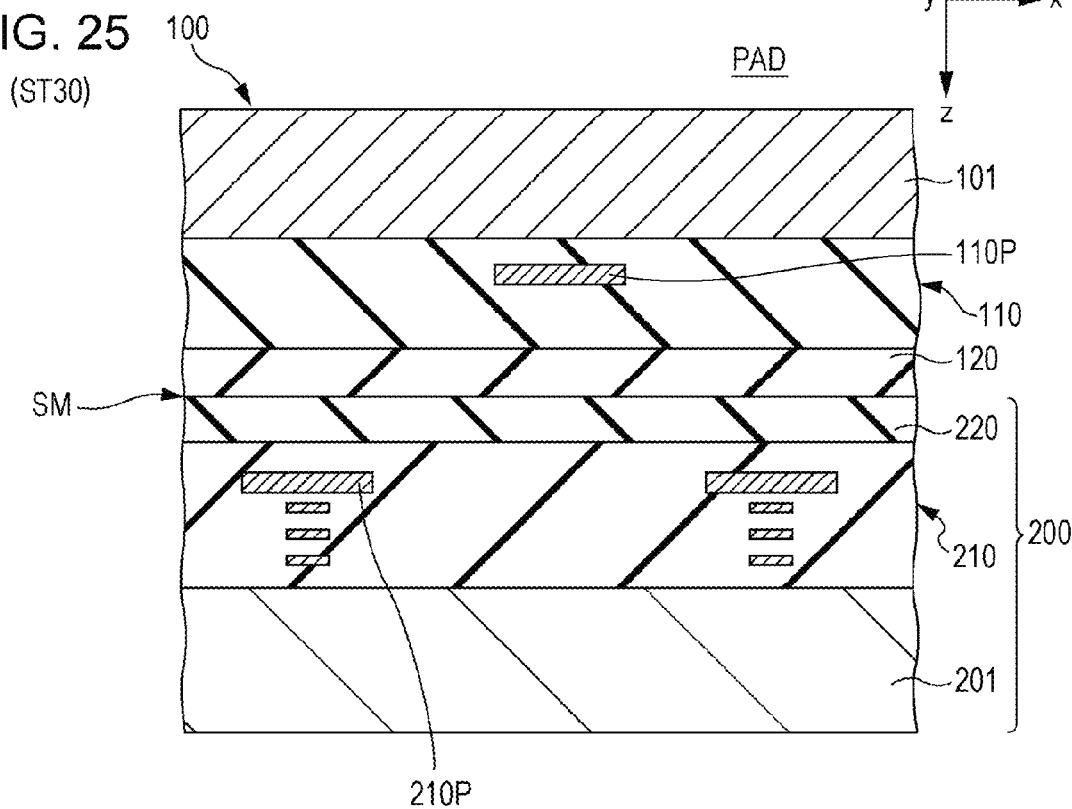
FIG. 25 (ST30)
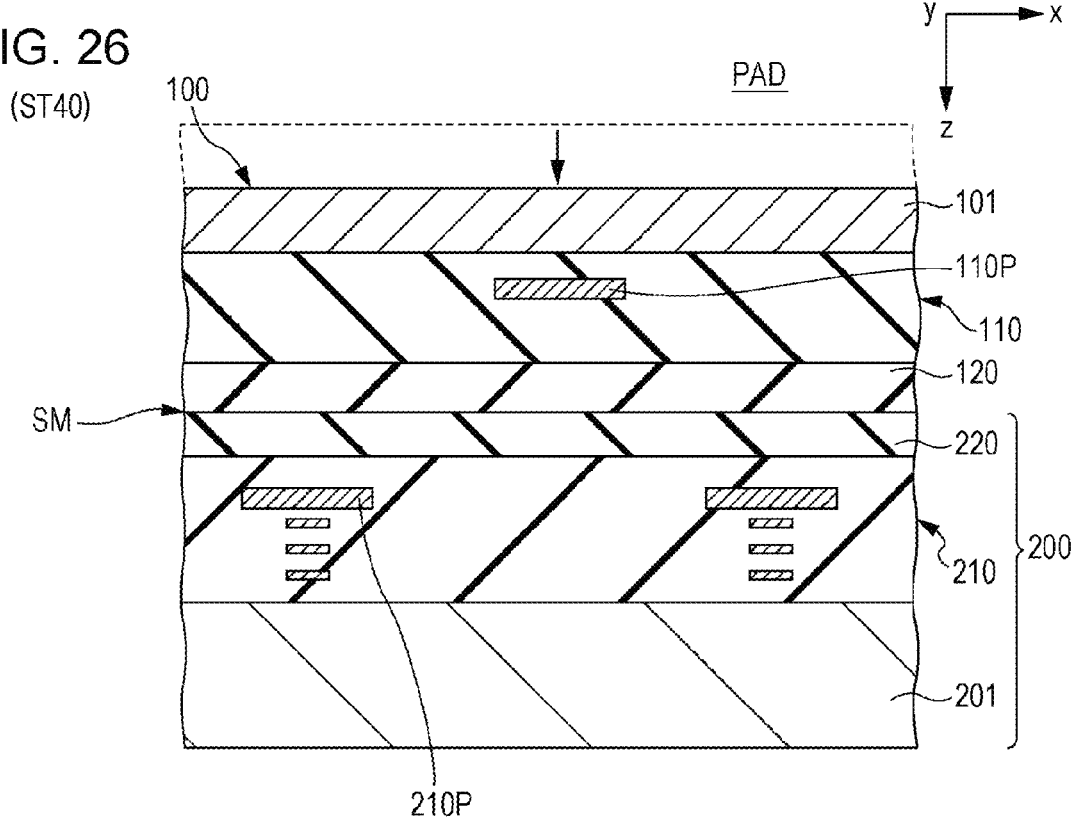
FIG. 26 (ST40)

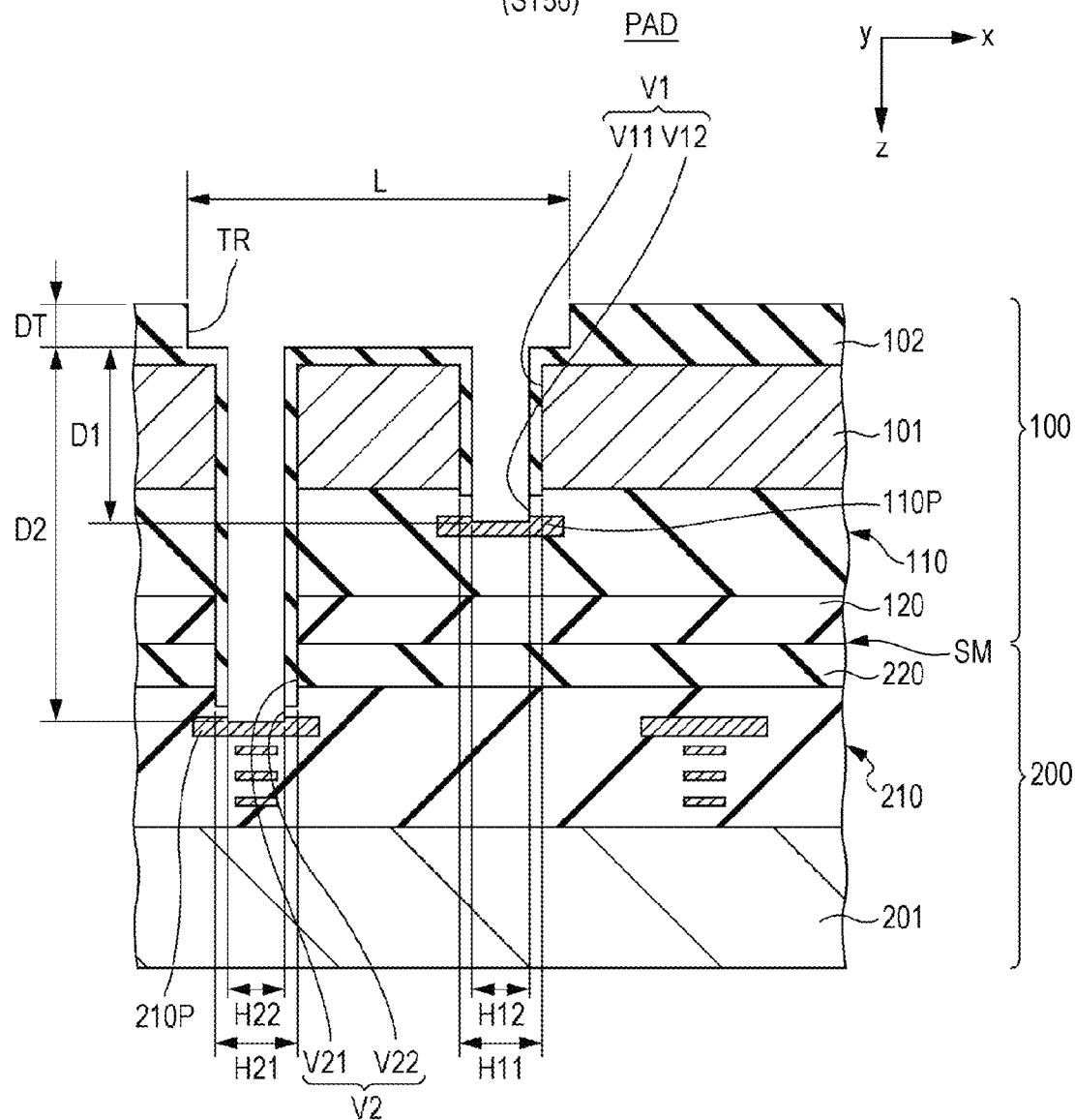

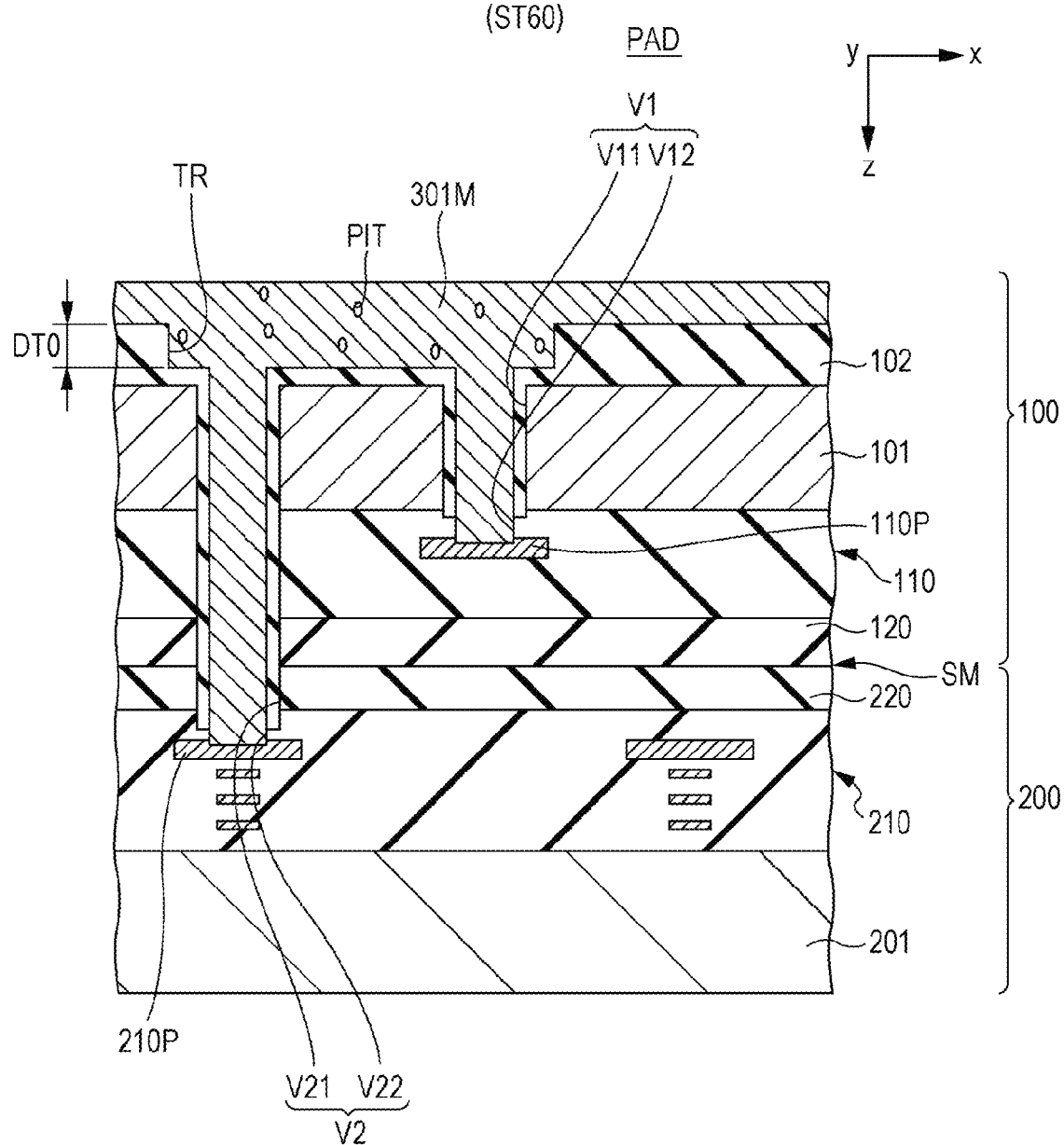

| WIRING WIDTH ≤1.6 | 1.6< WIRING WIDTH ≤4.6 | 4.6< WIRING WIDTH ≤6.0 | 6.0< WIRING WIDTH ≤10.0 | 10.0< WIRING WIDTH |
|---|---|---|---|---|
| 0.4 | 0.5 | 0.8 | 1.5 | 3.0 |

(Row label: WIRING SPACING) UNIT: μm 0.4 μm SPACE
1.6 μm WIDTH
DUTY: 64%

0.5 μm SPACE
4.6 μm WIDTH
DUTY: 81%

0.8 μm SPACE
6.0 μm WIDTH
DUTY: 78%

1.5 μm SPACE
10.0 μm WIDTH
DUTY: 76%

BLOCKING CAPABILITY: 9.0%

BLOCKING CAPABILITY: 8.9%

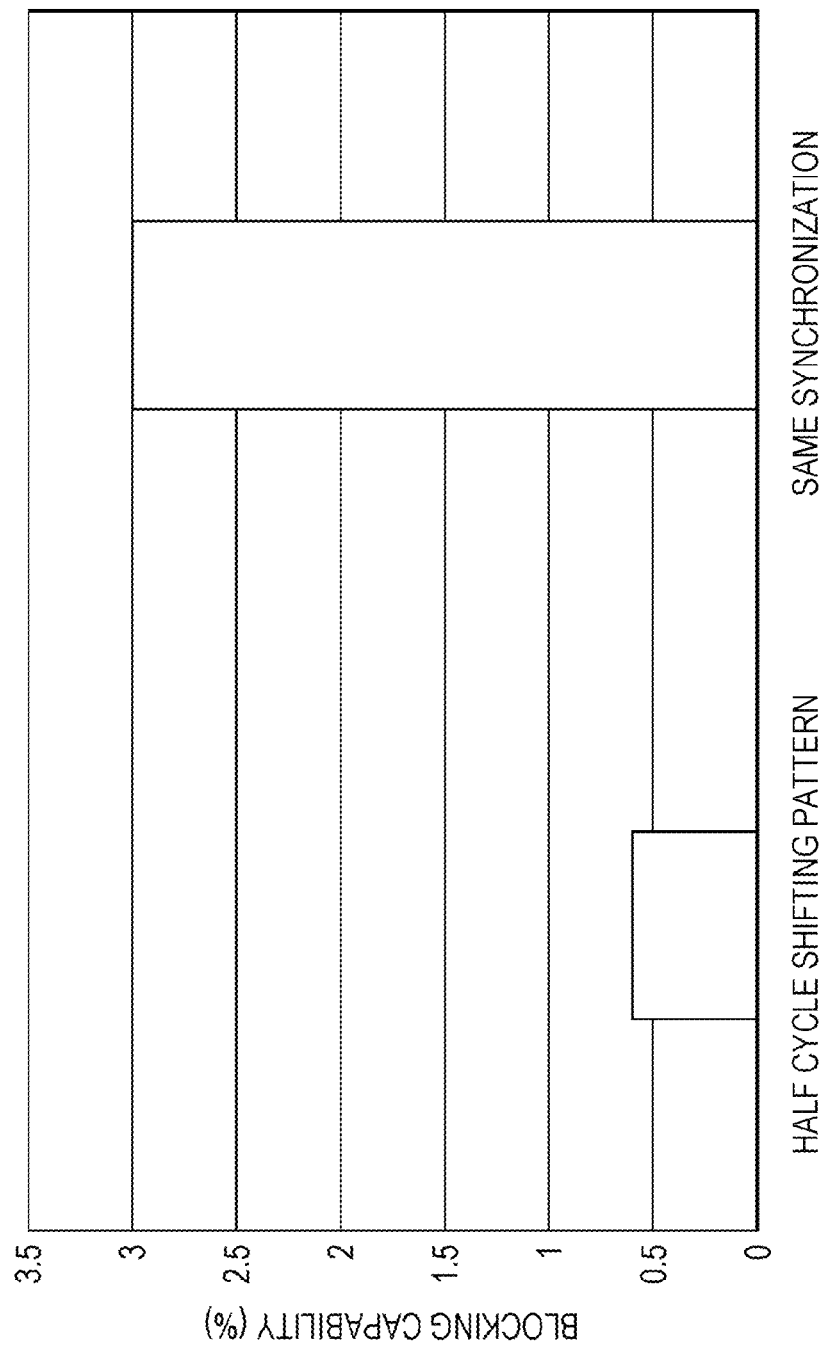

SOLID-STATE IMAGING DEVICE, MANUFACTURING METHOD OF SOLID-STATE IMAGING DEVICE, MANUFACTURING METHOD OF SEMICONDUCTOR DEVICE, SEMICONDUCTOR DEVICE, AND ELECTRONIC DEVICE

BACKGROUND

The present disclosure relates to a solid-state imaging device, manufacturing method of a solid-state imaging device, manufacturing method of a semiconductor device, a semiconductor device, and an electronic device.

An electronic device such as a digital video camera, digital still camera, and the like include a semiconductor device such as a solid-state imaging device. For example, a solid-state imaging device includes a CMOS (Complementary Metal Oxide Semiconductor)-type image sensor and CCD (Charge Coupled Device)-type image sensor.

A solid-state imaging device has multiple pixels arrayed on a face of a semiconductor substrate. A photoelectric converter is provided to each pixel. The photoelectric converter is a photodiode, for example, and generates signal load by receiving the incident light via an external optical system with a light-receiving face and performing photoelectric conversion.

With the solid-state imaging device, generally, the photoelectric converter receives incident light at a front face side on which a circuit or wiring has been provided to the semiconductor substrate. In such a case, the circuit and wiring blocks the incident light, and accordingly there are cases wherein improving sensitivity is difficult. Therefore, a "rear projection type" has been proposed, wherein the photoelectric converter receives the incident light at a rear side which is on the opposite side from the front face on which the circuit and wiring has been provided to the semiconductor substrate (e.g., reference Japanese Unexamined Patent Application Publication No. 2005-150463 and Japanese Unexamined Patent Application Publication No. 2008-182142).

Also, with a semiconductor device such as the solid-state imaging device described above, "three-dimensional packaging" has been proposed, wherein multiple substrates, on which devices with differing functions have been provided, are layered and electrically connected to one another. With "three-dimensional packaging", an optimal circuit corresponding to each function is formed on each substrate, whereby improving the device function can be readily realized. For example, a sensor substrate on which a sensor device is provided and a logic substrate on which a logic circuit for processing signals output from the sensor device thereof are layered to configure a solid-state imaging device. Now, a pad opening is provided by perforating the semiconductor substrate so that the front face of the pad wiring is exposed, and by filling conductive material in the pad opening thereof, the devices are electrically connected with one another. That is to say, the sensor substrate and logic substrate are electrically connected to each other via TSV (Through Silicon Via) (e.g., Japanese Unexamined Patent Application Publication No. 2010-245506).

Further, U.S. Pat. No. 4,349,232 discloses a solid-state imaging device wherein a signal processing chip is layered onto a sensor chip, and Japanese Unexamined Patent Application Publication No. 2008-182142 discloses a technique to electrically connect a sensor chip in a semi-manufactured state and a signal processing chip in a semi-manufactured state to have a completed product.

SUMMARY

However, with the semiconductor device such as the above-described solid-state imaging device, in the case that improving the device reliability or product yield sufficiently is difficult, or with a solid-state imaging device constructed by layering a signal processing chip onto a sensor chip, a configuration is used wherein a transistor belonging to a logic circuit is disposed in the vertical direction as to a pixel on the sensor chip. With such a configuration, adverse effects of light emitted by a hot carrier (a carrier having obtained energy by the expansion of an electric field within a transistor (electron or hole)), in a transistor belonging to the logic circuit is a concern. That is to say, upon light emitted by the hot carrier being detected by a pixel on the sensor chip, the light appears in the image as noise, and can cause the image quality to deteriorate.

Accordingly, the present technology provides a manufacturing method of a semiconductor device, a semiconductor device, and an electronic device wherein improvements can be made to the device reliability, manufacturing yield, and so forth.

According to the present technology described above, with a solid-state imaging device of a rear-projection type wherein wiring is provided in the periphery region of the outer side of the pixel region, by selectively chasing the insulation layer portion of the pixel region to become thinner, the distance between an on-chip lens and the light receiving face can be reduced. As a result, light receiving properties of the photoelectric converter can be improved.

BRIEF DESCRIPTION OF THE DRAWINGS

FIG. 22 is a diagram illustrating the principal portions regarding a manufacturing method of the solid-state imaging device according to the sixth embodiment;

FIG. 23 is a diagram illustrating the principal portions regarding a manufacturing method of the solid-state imaging device according to the sixth embodiment;

FIG. 24 is a diagram illustrating the principal portions regarding a manufacturing method of the solid-state imaging device according to the sixth embodiment;

FIG. 25 is a diagram illustrating the principal portions regarding a manufacturing method of the solid-state imaging device according to the sixth embodiment;

FIG. 26 is a diagram illustrating the principal portions regarding a manufacturing method of the solid-state imaging device according to the sixth embodiment;

FIG. 27 is a diagram illustrating the principal portions regarding a manufacturing method of the solid-state imaging device according to the sixth embodiment;

FIG. 28 is a diagram illustrating the principal portions regarding a manufacturing method of the solid-state imaging device according to the sixth embodiment;

FIG. 39 is a diagram illustrating an example of wiring design rules;

FIG. 45 is a diagram illustrating blocking capability when the blocking film is laid out in two patterns;

DETAILED DESCRIPTION OF EMBODIMENTS

Figure 1:
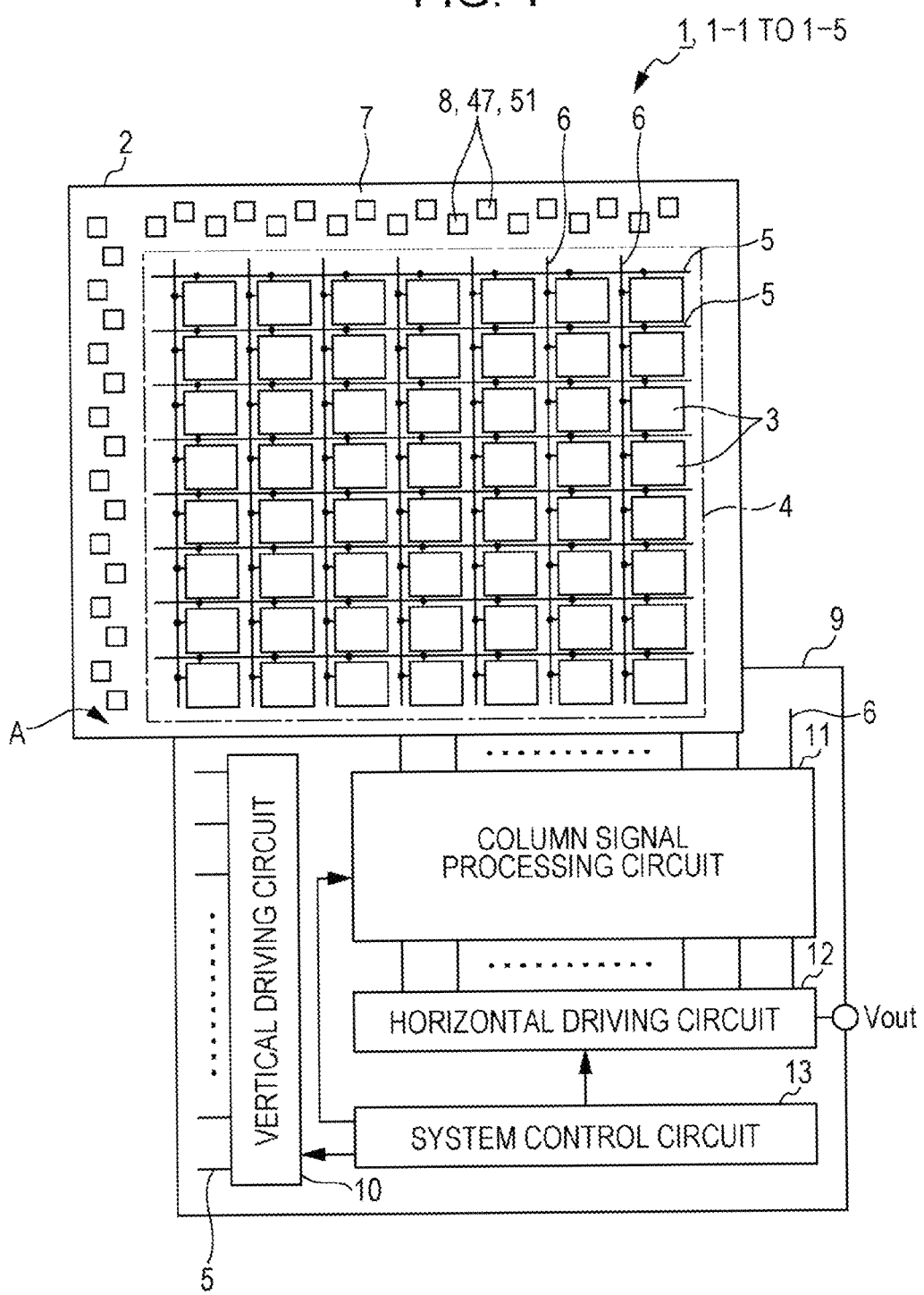
FIG. 1 is a schematic configuration diagram illustrating an example of a solid-state imaging device to which the present technology is to be applied.

Schematic Configuration Example of Solid-State Imaging Device According to an Embodiment FIG. 1 shows a schematic configuration of a three-dimensional construction solid-state imaging device, serving as an example of a rear-projection type of solid-state imaging device to which the present technology is applied. A solid-state imaging device 1 shown in this FIG. 1 has a sensor substrate 2 formed with photoelectric converters arrayed, and a circuit substrate 9 that is bonded onto the sensor substrate 2 in the state of being layered thereto.

The sensor substrate 2 has a pixel region 4 wherein one face is a light receiving face A and multiple pixels 3 including photoelectric converters are arrayed two-dimensionally as to the light receiving face A. On the pixel region 4, multiple pixel driving lines 5 are arrayed in the row direction and multiple vertical signal lines 6 are arrayed in the column direction, and one pixel 3 is disposed so as to be connected to one pixel driving line 5 and one vertical signal line 6. A photoelectric converter, a load accumulating unit, and a pixel circuit made up of multiple transistors (so-called MOS transistors) and capacitors and the like are provided to each pixel 3. Note that a portion of the pixel circuit is provided on the front face side on the opposite side from the light receiving face A. Also, multiple pixels may share a portion of the pixel circuit.

Also the sensor substrate 2 has a periphery region 7 on the outer side of the pixel region 4. A wiring 8 including an electrode pad is provided to the periphery region 7. The wiring 8 is connected to the pixel driving lines 5, vertical signal lines 6, and pixel circuit, and further to the driving circuit provided to the circuit substrate 9, as suitable.

The circuit substrate 9 has, on one face side facing the sensor substrate 2 side, driving circuits such as a vertical driving circuit 10 to drive the pixels 3 provided to the sensor substrate 2, a column signal processing circuit 11, vertical driving circuit 12, and system control circuit 13 and so forth. The driving circuits herein are connected to the wiring 8 on the sensor substrate 2 side. Note that the pixel circuit provided to the front face side of the sensor substrate 2 is a portion of the driving circuit.

Figure 2:
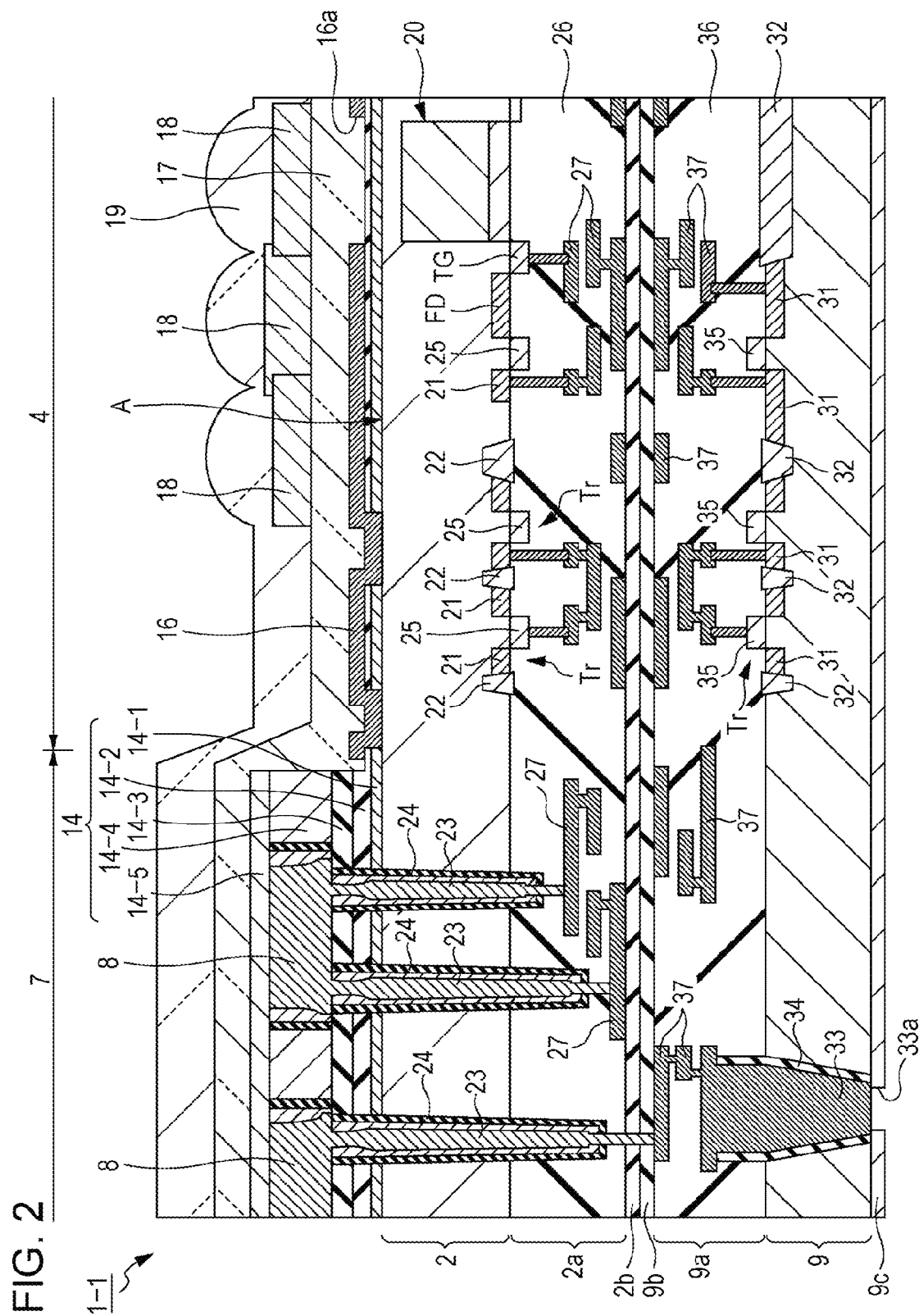
FIG. 2 is a principal portion cross-sectional diagram illustrating a configuration of the solid-state imaging device according to a first embodiment.

First Embodiment
Configuration of Solid-State Imaging Device
Example Providing Insulation Layer and Embedded Wiring in Stepped Construction FIG. 2 is a principal portion cross-sectional diagram showing a configuration of a solid-state imaging device 1-1 according to a first embodiment, and is a cross sectional diagram near the border between the pixel region 4 and periphery region 7 in FIG. 1. A configuration of the solid-state imaging device 1-1 according to the first embodiment will be described below, based on the principal portion cross-sectional diagram herein.

The solid-state imaging device 1-1 according to the first embodiment shown in FIG. 2 is a solid-state imaging device in a three-dimensional construction bonded together in the state wherein the sensor substrate 2 and circuit substrate 9 are layered, as described above. On the front face side of the sensor substrate 2, i.e. the face facing the circuit substrate 9 side, is provided a wiring layer 2a and a protective film 2b that covers the wiring layer 2a. On the other hand, on the surface side of the circuit substrate 9, i.e. the face facing the sensor substrate 2 side, is provided a wiring layer 9a and a protective film 9b that covers the wiring layer 9a. Also, on the back face side of the circuit substrate 9, a protective film 9c is provided. The sensor substrate 2 and circuit substrate 9 herein are bonded together between the protective film 2b and protective film 9b.

Also, on the face that is the opposite side from the circuit substrate 9 on the sensor substrate 2, i.e., the light receiving face A, an insulation layer 14 having a stepped construction, a wiring 8, and a blocking film 16 are provided, and further on the blocking film 16, a transparent protective film 17, color filter 18, and on-chip lens 19 are layered in this order. According to the present first embodiment, a particular feature is that the insulation layer 14 has a stepped construction, and the on-chip lens 19 is disposed on the lower portion of the stepped construction herein.

Next, configurations of the layers on the sensor substrate 2 side and the layers on the circuit substrate 9 side, and a configuration of the insulation layer 14 having a stepped construction, the wiring 8, blocking film 16, transparent protective film 17, color filter 18, and on-chip lens 19 will be described in sequence herein.

Sensor Substrate 2

The sensor substrate 2 is a semiconductor substrate made from single-crystal silicon that has been made into a thin film, for example. Multiple photoelectric converters 20 are arrayed along the light receiving face A in the pixel region 4 on the sensor substrate 2. The photoelectric converters 20 are configured in a layered construction between a n-type dispersion layer and p-type dispersion layer, for example. Note that a photoelectric converter 20 is provided for each pixel, and the diagram shows a cross-section of one pixel.

Also, on the front face size that is opposite from the light receiving face A on the sensor substrate 2, a source/drain 21 of a floating diffusion FD made from a n+ type impurity layer and a transistor Tr, and further another impurity layer omitted from the diagram herein and device separation 22 and so forth are provided.

Further, on the sensor substrate 2, a through via 23 that passes through the sensor substrate 2 is provided to the periphery region 7 on the outer side of the pixel region 4. The through via 23 is made with conductive material that fills in a connecting hole formed through the sensor substrate 2 via the separation insulating film 24.

Wiring Layer 2a (Sensor Substrate 2 Side)

The wiring layer 2a provided on the front face of the sensor substrate 2 has a gate electrode 25 of a transfer gate TG and transistor Tr via a gate insulating film omitted in the drawings herein, and further other electrodes omitted in the drawings herein, on the interface side with the sensor substrate 2. Also, the transfer gate TG and gate electrode 25 are covered with an inter-layer insulating film 26, and embedded wirings 27 using copper (Cu), for example, are provided as multi-layer wiring, in a groove pattern provided in the inter-layer insulating film 26. The embedded wirings 27 are mutually connected with a via, and are configured so that a portion thereof is connected to the source/drain 21, transfer gate TG, and gate electrode 25. Also, a through via 23 provided to the sensor substrate 2 is also connected to the embedded wiring 27, and a pixel circuit is configured with the transistor Tr and embedded wiring 27 and so forth.

An insulating protective film 2b is provided on top of the inter-layer insulating film 26 wherein the above-described embedded wiring 27 is formed, and on the protective film 2b surface, the sensor substrate 2 is bonded to the circuit substrate 9.

Circuit Substrate 9

The circuit substrate 9 is a semiconductor substrate made from single-crystal silicon that has been made into a thin film, for example. On the front face layer facing the sensor substrate 2 side of the circuit substrate 9, a source/drain 31 of a transistor Tr, and further an impurity layer omitted from the diagram herein and device separation 32 and so forth are provided.

Further, a through via 33 is provided through the circuit substrate 9. The through via is made with conductive material that fills in the connecting hole formed through the circuit substrate 9, via a separating insulating film 34.

Wiring Layer 9a (Circuit Substrate 9 Side)

The wiring layer 9a provided on the front face of the circuit substrate 9 has a gate electrode 35 provided via a gate insulating film omitted in the diagram herein and further another electrode omitted in the diagram herein, on the side interfacing with the circuit substrate 9. The gate electrode 35 and other electrode are covered with an inter-layer insulating film 36, and embedded wirings 37 using copper (Cu), for example, are provided as multi-layer wiring, in a groove pattern provided in the inter-layer insulating film 36. The embedded wirings 37 are mutually connected with a via, and are configured so that a portion thereof is connected to the source/drain 31 and gate electrode 35. Also, a through via 33 provided to the circuit substrate 9 is also connected to the embedded wiring 37, and a driving circuit is configured with the transistor Tr and embedded wiring 37 and so forth.

An insulating protective film 9b is provided on top of the inter-layer insulating film 36 wherein the above-described embedded wiring 37 is formed, and on the protective film 9b front face, the circuit substrate 9 is bonded to the sensor substrate 2. Also, on the back face side of the circuit substrate 9 which is opposite from the front face side on which the wiring layer 9a is provided, a protective film 9c which covers the circuit substrate 9 is provided, and a pad opening 33a which exposes the through via 33 is provided to the protective film 9c.

Insulation Layer 14

The insulation layer 14 is provided on top of the light receiving face A of the sensor substrate 2. A feature of the insulation layer 14 is in having a stepped construction wherein the film thickness of the pixel region 4 is thinner than the film thickness of the periphery region 7. This insulation layer 14 is configured as a layering film using different insulating materials, for example, and as an example, is made of five layers, in sequence from the light receiving face A side, of a reflection preventing film 14-1, interface level suppressing film 14-2, etching stopping film 14-3, groove forming film 14-4, and capping film 14-5.

The reflection preventing film 14-1 is configured using an insulating material having a higher refractive index than silicon oxide, such as hafnium oxide ($HfO_2$), tantalum oxide ($Ta_2O_5$), silicon nitride, and the like. The interface level suppressing film 14-2 is configured using silicon oxide ($SiO_2$), for example. The etching stopping film 14-3 uses a material whereby the etching selection ratio is kept low as compared to the material used for upper layer of the groove-forming film 14-4, and for example is configured using silicon nitride (SiN). The groove-forming film 14-4 is configured using silicon oxide ($SiO_2$), for example. The capping film 14-5 is configured using silicon nitride (SiN), for example.

This five-layer construction of an insulation layer 14, in the pixel region 4, is thinned by removing the upper layer portion of the capping film 14-5, groove-forming film 14-4, and etching stopping film 14-3 to have a two-layer construction of the reflection preventing film 14-1 and interface level suppressing film 14-2. On the other hand, in the thick film portion at the periphery region 7, a wiring groove that provides a wiring 8 within, to be described next, is formed on the groove-forming film 14-4 which is the second layer from the top.

Wiring 8

The wiring 8 is provided as an embedded wiring that is embedded in the insulation layer 14, as the periphery region 7 on the light receiving face A side. The wiring 8 is embedded in a wiring groove that is formed in the groove forming film 14-4 that is included in the insulation layer 14, and is connected to the through via 23 which is provided through the lower layers of the etching stopping film 14-3, interface level suppressing film 14-2, and reflection preventing film 14-1.

This wiring 8 and through via 23 are configured in an integrated manner, via a wiring groove formed on the groove forming film 14-4 and the separating insulating film 24 that continuously covers the inner wall of the connecting hold in the layer therebelow, so as to fill in copper (Cu) in the wiring groove and connecting hole. The separating insulting film is configured using a material a dispersion preventing function of the copper (Cu) such as a silicon nitride, for example. Note that the upper portion of the wiring 8 is in a state of being covered with a capping film 14-5 making up the uppermost layer of the insulation layer 14.

Blocking Film 16

The blocking film 16 is provided to the lower portion of the stepped portion of the insulation layer 14 of the pixel region 4 on the light receiving face A side, i.e., above of the interface level suppression film 14-2 that is included in the lower layer portion of the layered construction of the insulation layer 14. This blocking film 16 has multiple light receiving openings 16a that correspond to the photoelectric converters 20.

This light blocking film 16 is configured using a conductive material with excellent light blocking, such as aluminum (Al) or tungsten (W), and is provided in a state of being grounded as to the sensor substrate 2 at the openings provided to the insulation layer 14.

Transparent Protection Film 17

The transparent protection film 17 is provided in a state of covering the insulation layer 14 and the blocking film 16. Acrylic resin or the like, for example, is used for the transparent protection film 17.

Color Filter 18

The color filter 18 is provided so as to correspond to the photoelectric converters 20, and includes colors corresponding to the photoelectric converters 20. The array of the color filter 18 for each color is not restricted.

On-Chip Lens 19

The on-chip lens 19 is provided so as to correspond to the photoelectric converters 20, and is configured so that the incident light is collected in the photoelectric converters 20.

Manufacturing Method of Solid-State Imaging Device

Next, a manufacturing method of the solid-state imaging device 1-1 in the above-described configuration will be described based on the cross-sectional process diagrams in FIGS. 3 through 6.

FIG. 3A

Figure 3A:
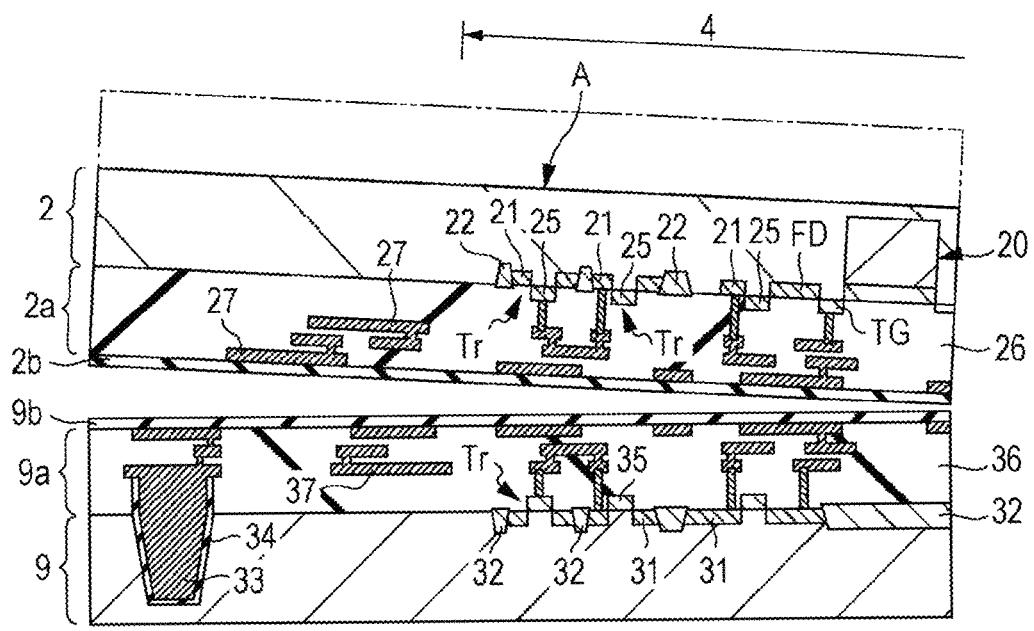
FIGS. 3A and 3B are cross-sectional process diagrams (part 1) illustrating manufacturing procedures of the solid-state imaging device according to the first embodiment.

First, as shown in FIG. 3A, multiple photoelectric converters 20 are arrayed in the pixel region 4 of the sensor substrate 2, and also an impurity layer such as a floating diffusion FD and device separation 22 are formed thereupon. Next, a transfer gate TG and gate electrode 25 are formed on the front face of the sensor substrate 2, and further, an embedded wiring 27 and an inter-layer insulating film 26 are formed to provide a wiring layer 2a, and the upper portion of the wiring layer 2a is covered with a protective film 2b. On the other hand, an impurity layer such as a source/drain 31 and device separation 32 are formed thereupon. Next, a gate electrode 35 is formed on the front face of the circuit substrate 9, and further, an embedded wiring 37 and an inter-layer insulating film 36 are formed to provide a wiring layer 9a, a via 33 is formed from the wiring layer 9a to the circuit substrate 9, and the upper portion of the wiring layer 9a is covered with a protective film 9b.

After the above, the sensor substrate 2 and circuit substrate 9 are bonded together between the protective film 2b and protective layer 9b. After the bonding together has ended, the light receiving face A side of the sensor substrate 2 is caused to be a thin film as suitable. The process up to this point does not have particular restrictions to the procedures, and bonding can be performed applying normal techniques.

FIG. 3B

Figure 3B:
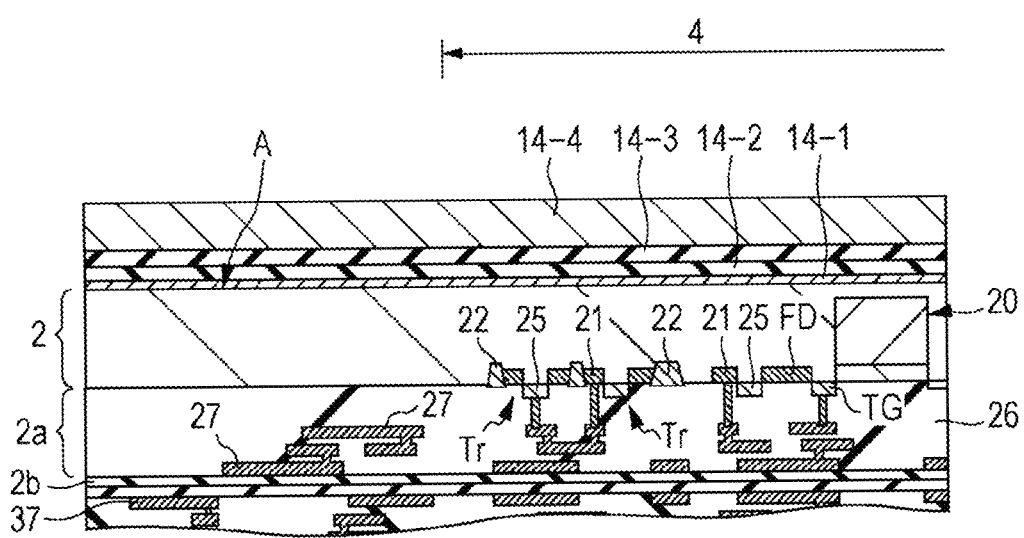

As shown in FIG. 3B, a reflection preventing film 14-1, interface level suppressing film 14-2, etching stopping film 14-3, and groove forming film 14-4 are formed in layers, in this order, on the light receiving face A of the sensor substrate 2. The reflection preventing film 14-1 is made of hafnium oxide (HfO$_2$), for example, and is formed in a film thickness of 10 nm to 300 nm (e.g. 60 nm) by Atomic Layer Deposition. The interface level suppressing film 14-2 is made of silicon oxide (SiO$_2$), for example, and is formed in a film thickness of 200 nm with a P-CVD (plasma-chemical vapor deposition) method. The etching stopping layer 14-3 is made of silicon nitride (SiN), for example, and is formed in a film thickness of 360 nm with a P-CVD method. The groove forming film 14-4 is made of silicon oxide (SiO$_2$), for example, and is formed in a film thickness of 200 nm with a P-CVD method.

The above four layers are formed as a film that makes up a portion of the insulation layer (14) having the above-described stepped construction.

FIG. 4A

Figure 4A:
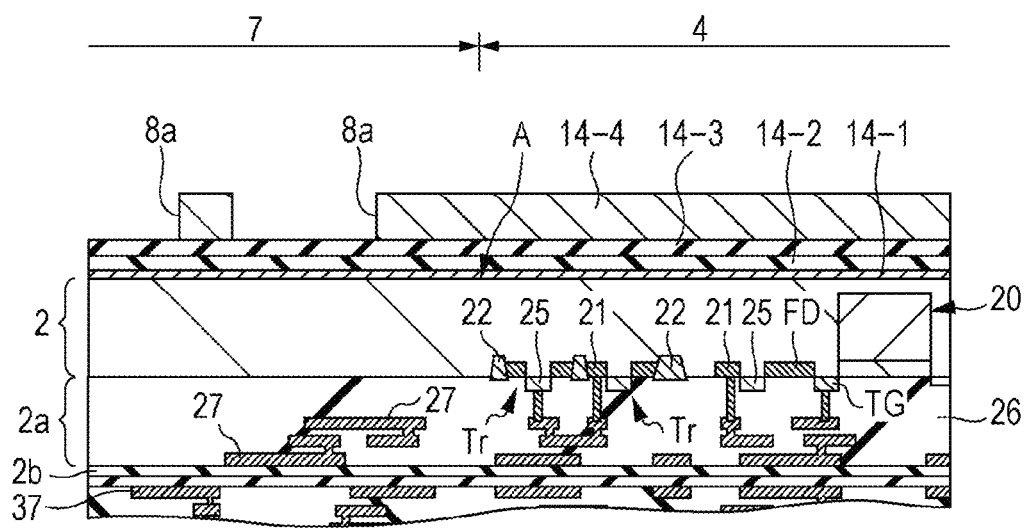
FIGS. 4A and 4B are cross-sectional process diagrams (part 2) illustrating manufacturing procedures of the solid-state imaging device according to the first embodiment.

Subsequently, as shown in FIG. 4A, a wiring groove 8$a$ is formed on the uppermost layer of the groove forming film 14-4 in the periphery region 7 of the sensor substrate 2. In this event, etching is performed on the groove forming film 14-4 that is made of silicon oxide (SiO$_2$), using the resist pattern, which is omitted in the diagram here, as a mask. In the etching herein, the etching is stopped with the etching stopping film 14-3 which is made of a lower layer of silicon nitride (SiN). Upon ending the etching, the resist pattern is removed.

FIG. 4B

Figure 4B:
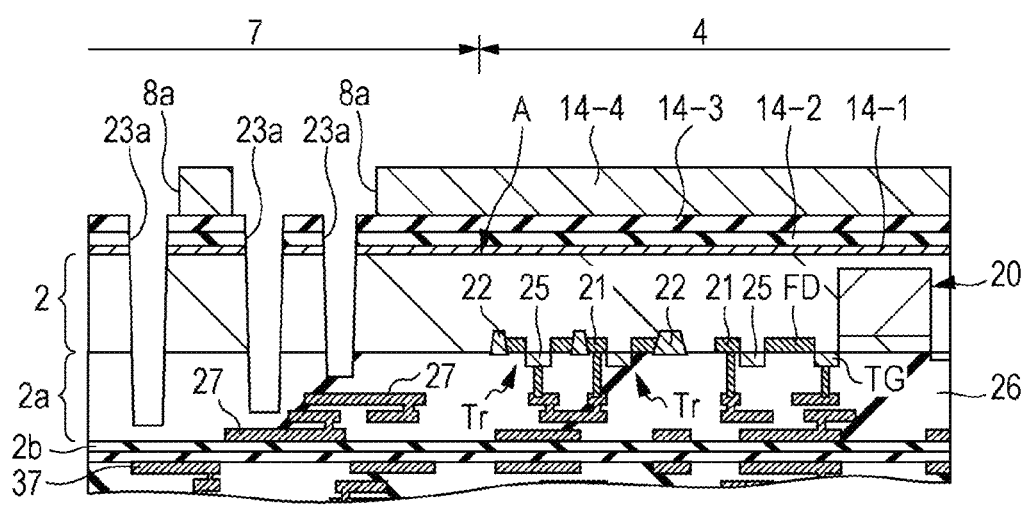

Next, as shown in FIG. 4B, connecting holes 23$a$ are formed in depths as appropriate, in the floor portion of the wiring groove 8$a$. The connecting holes 23$a$ only have to be formed at the depths reaching the top of the embedded wiring 27 of the wiring layer 2$a$ or the embedded wiring 37 of the wiring layer 9$a$, and do not have to expose the embedded wiring 27 and embedded wiring 37 to the floor portion. In this event, for each depth of the connecting holes 23$a$, multiple resist patterns, which are omitted in the diagram herein, are formed, and etching is performed multiple times as to the sensor substrate 2 and inter-layer insulating film 26, using the resist patterns herein as masks. Upon ending each etching, the resist patterns are removed.

FIG. 5A

Figure 5A:
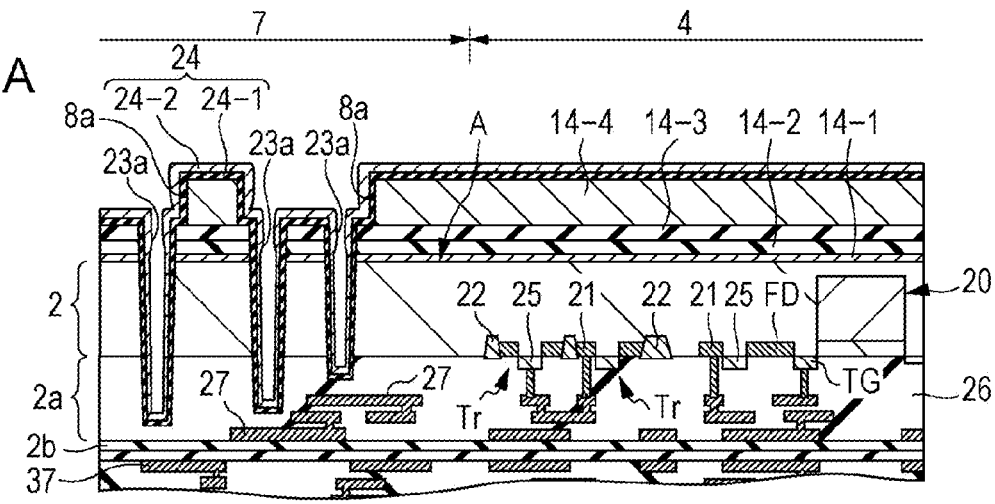
FIGS. 5A through 5C are cross-sectional process diagrams (part 3) illustrating manufacturing procedures of the solid-state imaging device according to the first embodiment.

Next, as shown in FIG. 5A, a separating insulating film 24 is formed on the groove forming film 14-4 in the state of covering the inner wall of the wiring groove 8$a$ or the connecting hole 23$a$. Now, let us say that a separating insulating film 24 in a two-layer construction will be formed, for example, wherein first, a silicon nitride film 24-1 of a film thickness of 70 nm will be formed with the p-CVD method, and next, a silicon oxide film 24-2 of a film thickness of 900 nm will be formed with the p-CVD method. Note that the separating insulating film 24 is not restricted as to the layered construction, and may have a single-layer construction of a silicon oxide film or silicon nitride film, for example.

FIG. 5B

Figure 5B:
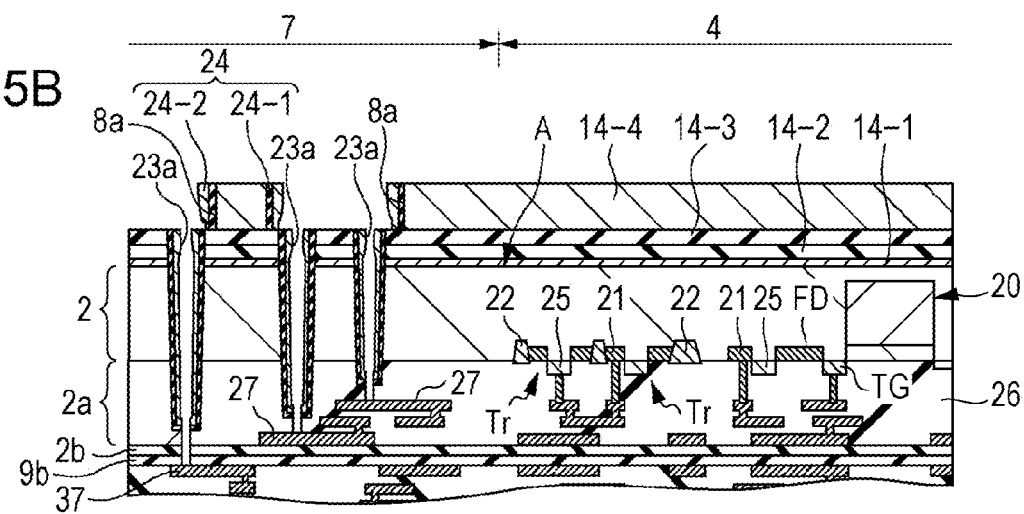

Subsequently, as shown in FIG. 5B, by etching to remove the separating insulating film 24 under etching conditions having high anisotropy, the floor portions of the groove forming film 14-4 and wiring grooves 8$a$ and the separating insulating film 24 of the floor portions of the connecting holes 23$a$ are removed. Next, the inter-layer insulating film 26 of the floor portions of the connecting holes 23$a$, the protective film 2$b$, and the protective film 9$b$ are removed by etching, and etching of the connecting holes 23$a$ is further advanced. Thus, the embedded wiring 27 or embedded wiring 37 is exposed to the floor portion of the connecting holes 23$a$.

Note that with such etching, in the case that the inter-layer insulting film 26 is made of a silicon oxide film, the front face layer of the groove forming film 14-4 that is made of silicon oxide which is a lower layer of the separating insulating film 24 is also reduced by etching. Also, in the case that the protective film 2$b$ and protective film 9$b$ are made of a silicon nitride film, the etching stopping film 14-3 made of silicon nitride on the floor portion of the wiring groove 8$a$ is also reduced by etching. Accordingly, with consideration for the amount of reduction herein, the film thicknesses at the time of forming the films of the etching stopping film 14-3 made of silicon nitride and the groove forming film 14-4 made of silicon oxide are set.

FIG. 5C

Figure 5C:
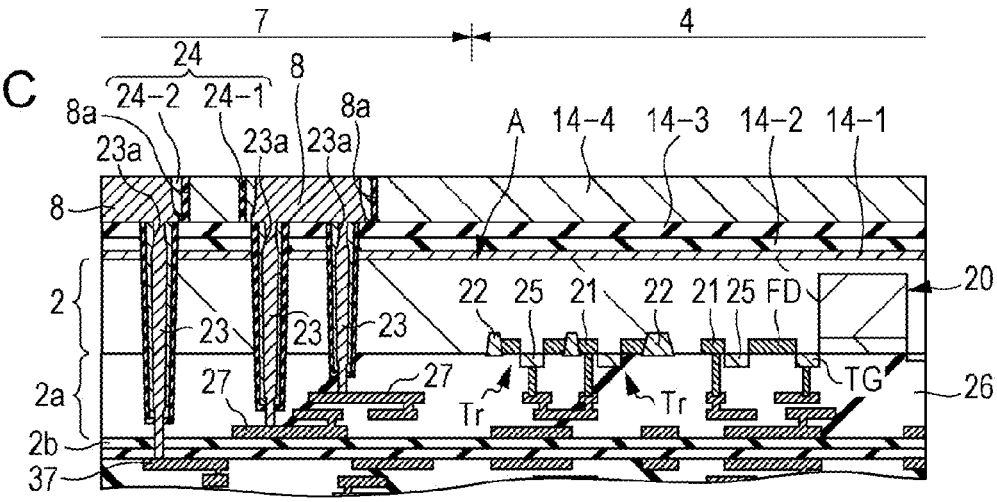

Next, as shown in FIG. 5C, by filling in the wiring groove 8$a$ and connecting holes 23$a$ with a conductive material so as to be integrated, the wiring 8 is formed as embedded wiring within the wiring groove 8$a$, and a through via 23 is formed within the connecting hole 23$a$ that passes through the sensor substrate 2. Now, first, a conductive material film (e.g., copper (Cu) film) is formed on the groove forming filming 14-4 while in the state of filling in the wiring groove 8$a$ and connecting holes 23$a$, and next polishes to remove the conductive material film on the groove forming film 14-4 with a chemical mechanical polishing (CMP) method. Thus, the conductive material film remains only within the wiring groove 8$a$ and connecting holes 23$a$, and a through via 23 is formed in the periphery region 7 on the light receiving face A side of the sensor substrate 2 which connects the wiring 8 hereto.

FIG. 6A

Figure 6A:
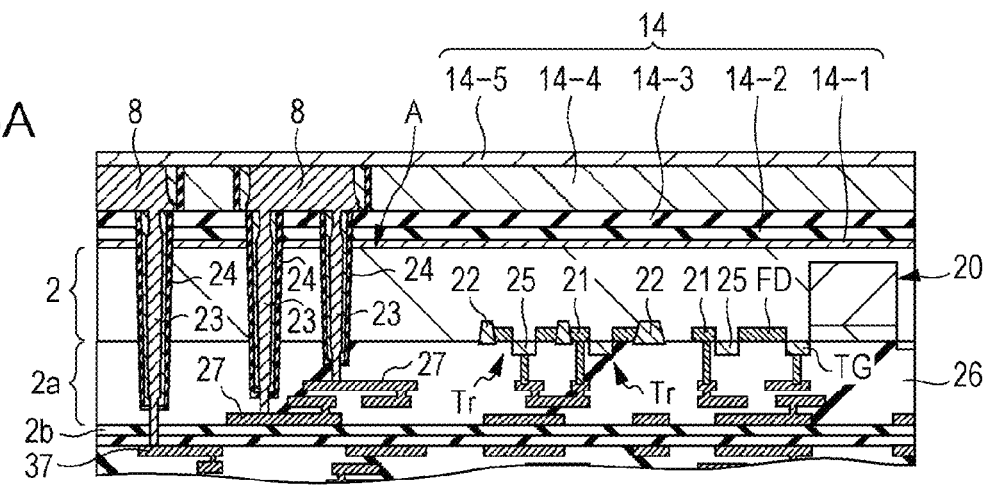
FIGS. 6A through 6C are cross-sectional process diagrams (part 4) illustrating manufacturing procedures of the solid-state imaging device according to the first embodiment.

Next, as shown in FIG. 6A, a capping film 14-5 having a dispersion preventing effect as to the copper (Cu) which the wiring 8 is made of is formed, in the state of covering the wiring 8 and groove forming film 14-4. Now, as a capping film 14-5, for example a silicon nitride film is formed at a film thickness of 70 nm. Thus, an insulation layer 14 in a five-layer construction is formed on the light receiving face A of the sensor substrate 2, in a layered manner in the order of a reflection preventing film 14-1, interface level suppressing film 14-2, etching stopping film 14-3, groove forming film 14-4, and capping film 14-5. Note that on top of the uppermost capping film 14-5 made of silicon nitride, another silicon oxide film may be formed as appropriate.

FIG. 6B

Figure 6B:
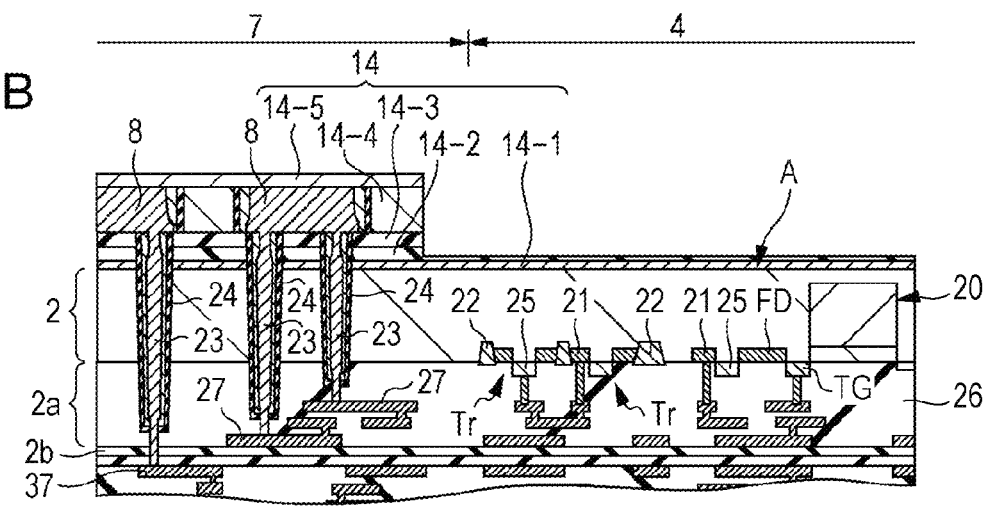

Subsequently, as shown in FIG. 6B, the portion corresponding to the pixel region 4 in the insulation layer 14 is selectively caused to be a thinner film as compared to the periphery region 7, and thus forms a stepped construction in the insulation layer 14. In this event, the capping film 14-5 made of silicon nitride (SiN) is etched, using the resist pattern which is omitted in the diagram as a mask, and thereafter conditions are changed to etch the groove forming film 14-4 made of silicon oxide (SiO$_2$). In this event, the etching is stopped with the etching stopping film 14-3 of a lower layer made of silicon nitride (SiN). Subsequently, the conditions are further changes to etch the etching stopping film 14-3.

Thus, the insulation layer 14 on the light receiving face A has a stepped construction wherein the film thickness of the pixel region 4 is thinner than the film thickness of the periphery region 7, and has a cavity construction wherein the film is thin on the pixel region 4. In such a state, only the reflection preventing film 14-1 and interface level suppressing film 14-2 remain in the pixel region 4. On the other hand, insulation layer 14 in a five-layer construction remains without change in the periphery region 7. Also, the step in the stepped construction of the insulation layer 14 is approximately 500 nm.

Note that the thin film portion in the insulation layer 14 may be set to have a wide range, in a range in which there is no influence on the wiring 8, thereby preventing influence on incident light to the photoelectric converters 20 due to the stepped form of the insulation layer 14 worsening the unevenness in the coating of the transparent flat film to be formed hereafter.

FIG. 6C

Figure 6C:
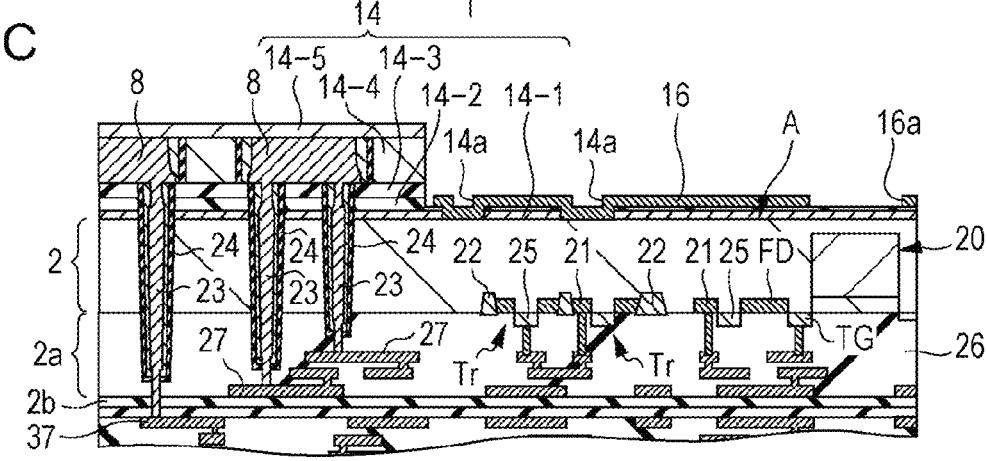

Next, as shown in FIG. 6C, on the lower portion of the stepped of the insulation layer 14, openings 14a that expose the sensor substrate 2 are formed. In this event, the interface level suppression film 14-2 and reflection preventing film 14-1 are etched, using a resist pattern which has been omitted in the diagram herein as a mask. Note that the openings 14a are formed in positions avoiding the upper side of the photoelectric converters 20.

Next, the blocking film 16 that has been grounded to the sensor substrate 2 via the openings 14a is caused to form a pattern on the lower portion of the step of the insulation layer 14. The blocking film 16 herein has a light receiving opening 16a that corresponds to the photoelectric converter 20. Now, first, a conductive material film having blocking capability such as aluminum (Al) or tungsten (W) is formed on top of the insulation layer 14 with a sputtering film forming method. Subsequently, by etching a pattern on the conductive material film using the resist pattern omitted from the diagram herein as a mask, the lower portion of the step is widely coated, and the blocking film 16, which has a light receiving opening 16a corresponding to each photoelectric converter, has been grounded to the sensor substrate 2.

This light blocking film 16 may be in a form of being removed on the upper portion of the step of the insulation layer 14, and widely coating the lower portion of the step. Thus, the stepped form in the insulation layer 14 is reduced over a wide range.

FIG. 2

Subsequent to the above, as shown in FIG. 2, a transparent protective film 17 made of a material having light permeability is formed in a state of covering the blocking film 16. The transparent protective film 17 is formed with a coating method such as a spin-coating method. Next, color filters 18 in colors corresponding to the photoelectric converters 20 are formed on the transparent protective film 17, and further, on-chip lenses 19 that correspond to the photoelectric converters 20 are formed thereupon. Also, the circuit substrate 9 is caused to be thinner, by polishing the exposed face of the circuit substrate 9, and the via 33 is exposed so as to become a through via 33. Subsequently, the protective film 9c is formed on top of the circuit substrate 9 in a state of covering the through via 33, and a pad opening 33a that exposes the through via 33 is formed, thereby completing the solid-state imaging device 1-1.

Advantages of First Embodiment

The solid-state imaging device 1-1 in the configuration described above is a rear-projection type of solid-state imaging device having provided a wiring 8 in the periphery region 7 on the outer side of the pixel region 4. In such a configuration, an insulation layer 14 in a stepped construction wherein the film thickness of the pixel region 4 is thinner than that of the periphery region 7 is provided on top of the light receiving face A, and an on-chip lens 19 is provided on top thereof. Thus, in the periphery region 7, the film thickness of the insulation layer 14 can be secured without influencing the configuration of the wiring 8, and on the other hand, in the pixel region 4, the insulation layer 14 can be made thinner and the distance between the on-chip lens 19 thereupon and the light receiving face A can be reduced.

Now, as in constructions in related art, if the configuration has the blocking film covered with an insulating film, and a wiring is provided on top of the insulating film, an insulating film is provided in a state of covering the wiring, and an on-chip lens is disposed on top thereof. Therefore, the on-chip lens has been disposed on top of the light receiving face, via at least two layers of insulating films, and accordingly the distance from the light receiving face to the on-chip lens has been great, causing deterioration in the light reception properties of the photoelectric converters. Additionally, the pattern form of the blocking film is transferred to the front face of the insulating film formed on top of the blocking film, and accordingly in the case of forming a wiring groove to form embedded wiring as to such an insulating film, accurate patterning becomes difficult. Thus, by forming a flat insulation layer on top of the blocking film, accuracy of the patterning for forming wiring grooves can be secured. However, the distance from the light receiving face to the on-chip lens becomes greater due to the flat insulating film, and accordingly light reception properties by the photoelectric converters further deteriorates.

Conversely, the manufacturing method according to the above-described first embodiment is a procedure whereby, after forming the insulation layer 14 and the wiring 8 embedded therein, the insulation layer 14 in the pixel region 4 is thinned and formed as a stepped construction, and thereafter the on-chip lens 19 is formed in the pixel region 4. Therefore, the insulation layer portion that is to be used for the formation of the wiring 8 does not remain in the pixel region 4 as a thick film, and the distance between the on-chip lens 19 and light-receiving face A can be made smaller.

Thus, according to the present first embodiment, in the rear-projection type of solid-state imaging device 1-1 that has a wiring 8 provided in the periphery region 7 on the outer side of the pixel region 4, the pattern accuracy of the wiring 8 can be secured, while reducing the distance between the on-chip lens 19 and light receiving face A, thereby improving the light reception properties of the photoelectric converters 20. Specifically, the distance between the light receiving face A and the lower face of the color filter 18 can be set to approximately 600 nm. Thus, optical properties, such as attenuation of incident light as to the photoelectric converters 20, and deterioration of color mixing from light leaking into adjacent pixels in the case of diagonal incident light, can be improved. Note that the present first embodiment can be applied to a configuration that does not provide a blocking film 16. In this case, the distance between the light receiving face A and color filter 18 can be neared to approximately 300 nm, and shading and color mixing when the incident light angle is increased can be greatly improved.

Also, in the manufacturing method according to the first embodiment, as described using FIG. 6B, in the case of forming a stepped construction in the insulation layer 14, the etching is stopped with the etching-stopping film 14-3, after which the conditions are changed so as to etch the etching stopping film 14-3. Thus, a reflection preventing film 14-1 and interface level suppression film 14-2 can remain on the light receiving face A in the pixel region 4. Consequently, stabilized light-receiving properties and dark current preventing effects can be obtained. Also, the light receiving face A can be favorably maintained without etching damage.

Second Embodiment

Configuration of Solid-State Imaging Device

Figure 7:
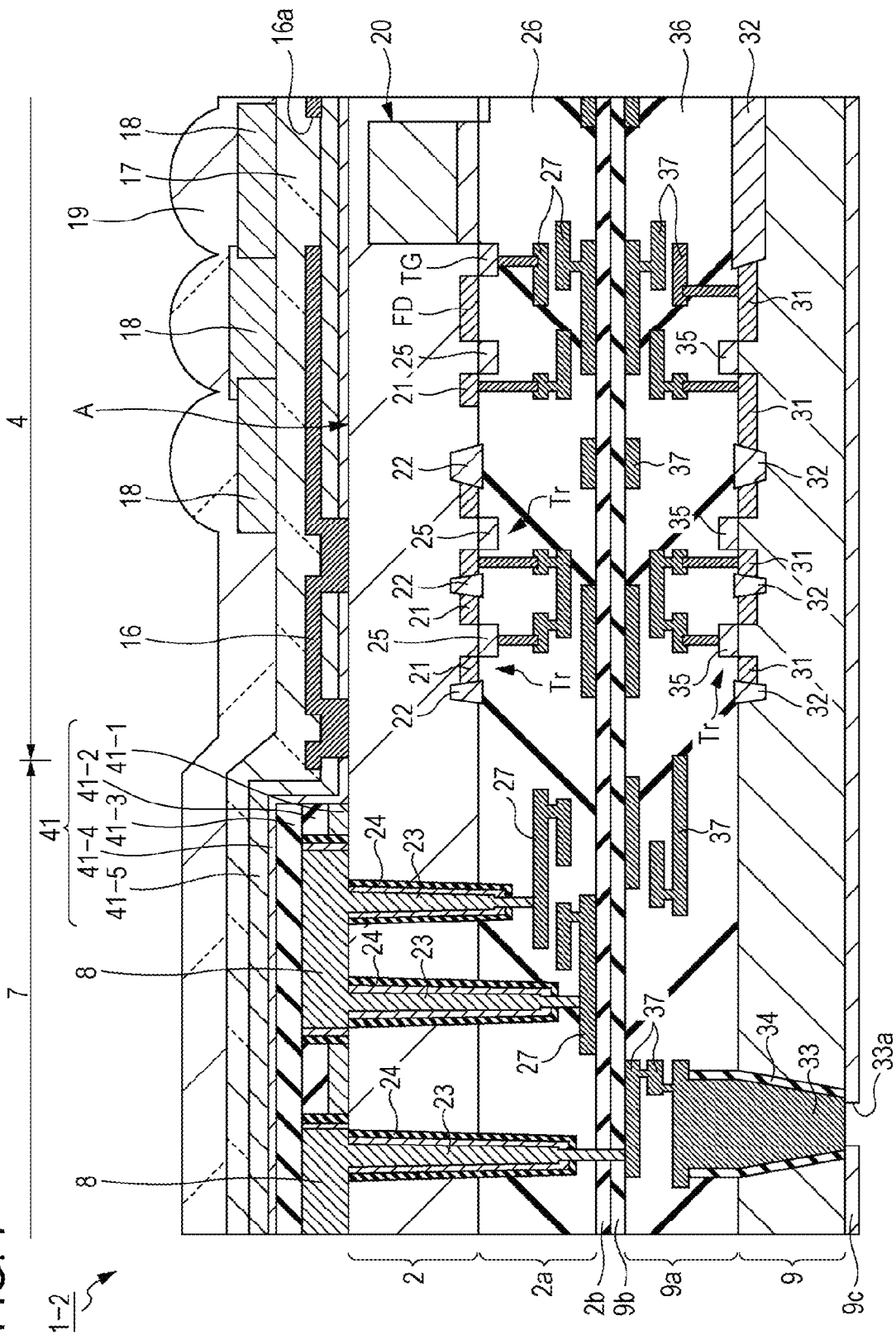
FIG. 7 is a principal portion cross-sectional diagram illustrating a configuration of the solid-state imaging device according to a second embodiment.

Example of Providing Insulation Layer with Stepped Construction, Covering Insulating Pattern with Insulating Film FIG. 7 is a principal portion cross-sectional diagram showing a configuration of a solid-state imaging device 1-2 according to a second embodiment, and is a cross-sectional diagram of the border vicinity between the pixel region 4 and periphery region 7 in FIG. 1. The configuration of the solid-state imaging device 1-2 according to the second embodiment will be described below, based on the principal portion cross-sectional diagram herein.

The solid-state imaging device 1-2 according to the second embodiment shown in FIG. 7 differs from the solid-state imaging device according to the first embodiment described using FIG. 2 in having a layer construction of the insulation layer 41 that has a stepped construction, and other configurations are similar to the first embodiment.

That is to say, the insulation layer 41 has a three-layer construction of an insulating pattern in the periphery region 7, wherein for example a silicon oxide film 41-1, silicon nitride film 41-2, and a capping film 41-3 made of silicon nitride are layered in this order from the light receiving face A side. Also, the insulation layer 41 has a reflection preventing film 41-4 and interface level suppressing film 41-5 in the pixel region 4 and periphery region 7, in the state of covering the insulating pattern of such a three-layer construction.

The insulation layer 41 with such a five-layer construction has a two-layer construction in the pixel region 4, of the reflection preventing film 41-4 and interface level suppressing film 41-5. Conversely in the periphery region 7, there is a five-layer construction of the silicon oxide film 41-1, silicon nitride film 41-2, a capping film 41-3, reflection preventing film 41-4, and interface level suppressing film 41-5.

In the thick film portion in the periphery region 7 of the insulation layer 41 having such a layered construction, the lower layers of the silicon oxide film 41-1 and silicon nitride film 41-2 become grooved films, and a wiring groove is formed therein to house the wiring 8. Also, the through via 23 provided through the sensor substrate 2 is configured so as to be connected to the wiring 8.

On the lower portion of the stepped on the insulation layer 41, a blocking film 16 is provided above the reflection preventing film 41-4 and interface level suppressing film 41-5, which cover the insulating pattern. The blocking film 6 herein is similar to that of the first embodiment, and is provided in a state of being grounded to the sensor substrate 2 in the opening provided in the insulation layer 41.

Manufacturing Method of Solid-State Imaging Device

Next, a manufacturing method of a solid-state imaging device 1-2 having the above-described configuration will be described based on the cross-sectional process diagrams in FIGS. 8 through 10.

FIG. 8A

Figure 8A:
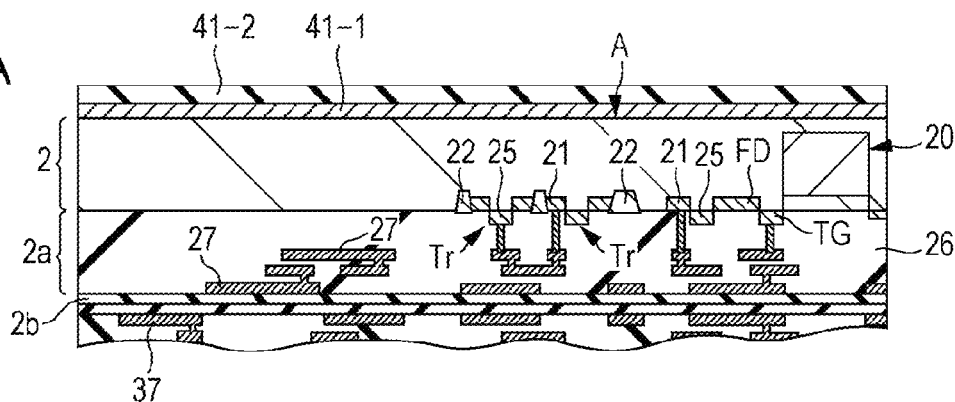
FIGS. 8A through 8C are cross-sectional process diagrams (part 1) illustrating manufacturing procedures of the solid-state imaging device according to the second embodiment.
Figure 9A:
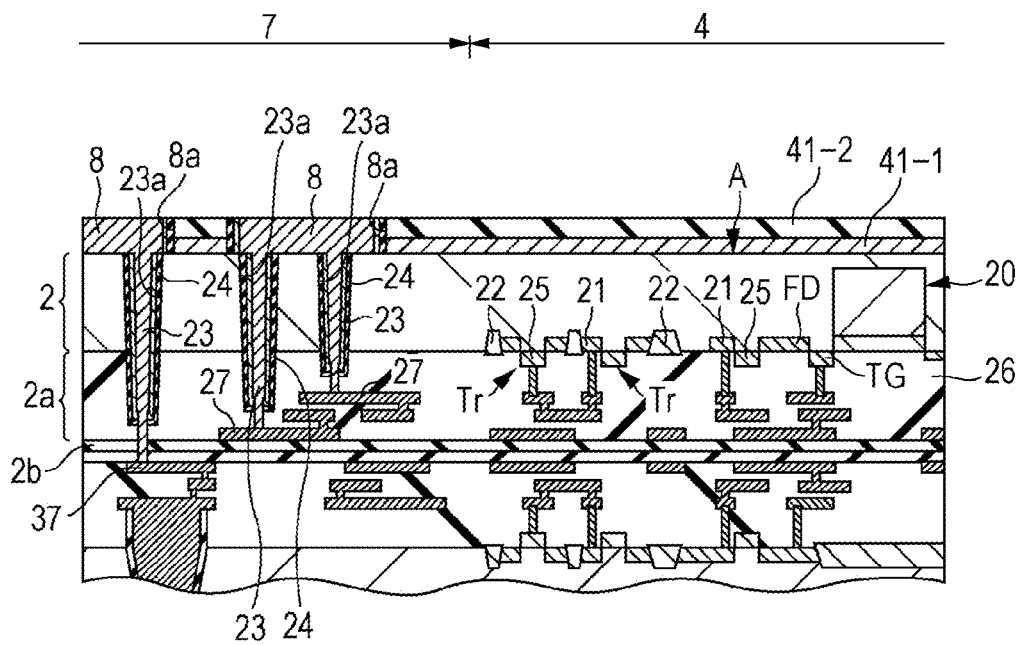
FIGS. 9A and 9B are cross-sectional process diagrams (part 2) illustrating manufacturing procedures of the solid-state imaging device according to the second embodiment.

First, as shown in FIG. 8A, the sensor substrate 2 and circuit substrate are bonded together, and the light receiving face A side of the sensor substrate 2 is caused to be thinner as appropriate; up to this point is similar to the descriptions using FIG. 3A in the first embodiment. Thereafter, the silicon oxide film 41-1 and silicon nitride film 41-2 are formed on top of the light receiving face A of the sensor substrate 2, in this order.

FIG. 8B

Figure 8B:
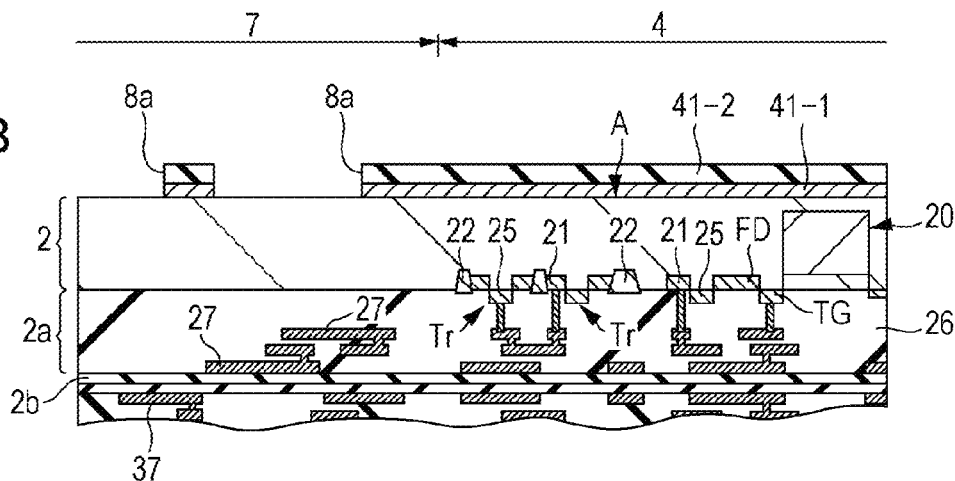

Next, as shown in FIG. 8B, a wiring groove 8a is formed in the silicon oxide film 41-1 and silicon nitride film 41-2 in the periphery region 7 of the sensor substrate 2. In this event, the silicon nitride film 41-2 is etched, using the resist pattern omitted from the diagram herein as a mask, and further etches the silicon oxide film 41-1. In the etching herein, the front face layer of the sensor substrate 2 of a further lower layer may be etched. After the etching has ended, the resist pattern is removed.

FIG. 8C

Figure 8C:
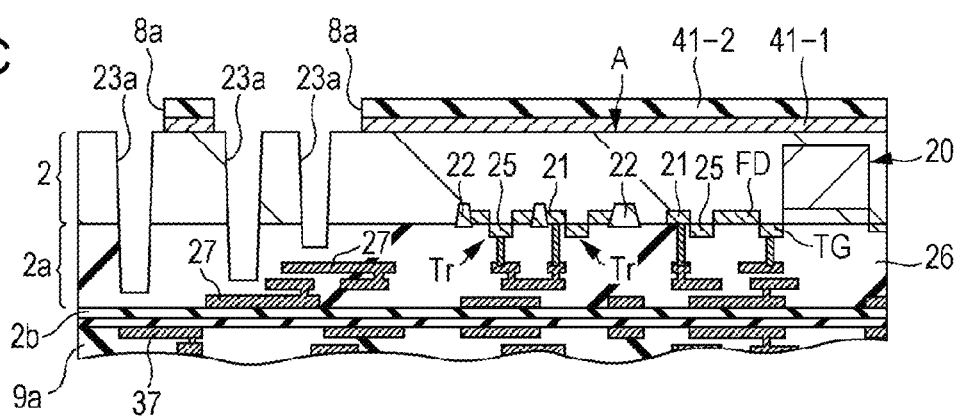

Next, as shown in FIG. 8C, connecting holes 23a in depths as applicable are formed on the floor portion of the wiring groove 8a. The connecting holes 23a herein are similar to those in the first embodiment, and are formed in various depths reaching the top of the embedded wiring 27 or the embedded wiring 37 provided on the front face side of the sensor substrate 2. Subsequently, procedures similar to the procedures described using FIGS. 5A through 5C in the first embodiment are performed.

FIG. 9A

As shown above with reference to FIG. 9A, a separating insulating film 24 in a layered construction is formed on the inner walls of the wiring grooves 8a and connecting holes 23a, and the inner portions herein are filled in with copper (Cu) so as to be integrated, and the wiring 8 and through via 23 that are connected to the embedded wiring 27 or embedded wiring 37 are formed.

FIG. 9B

Figure 9B:
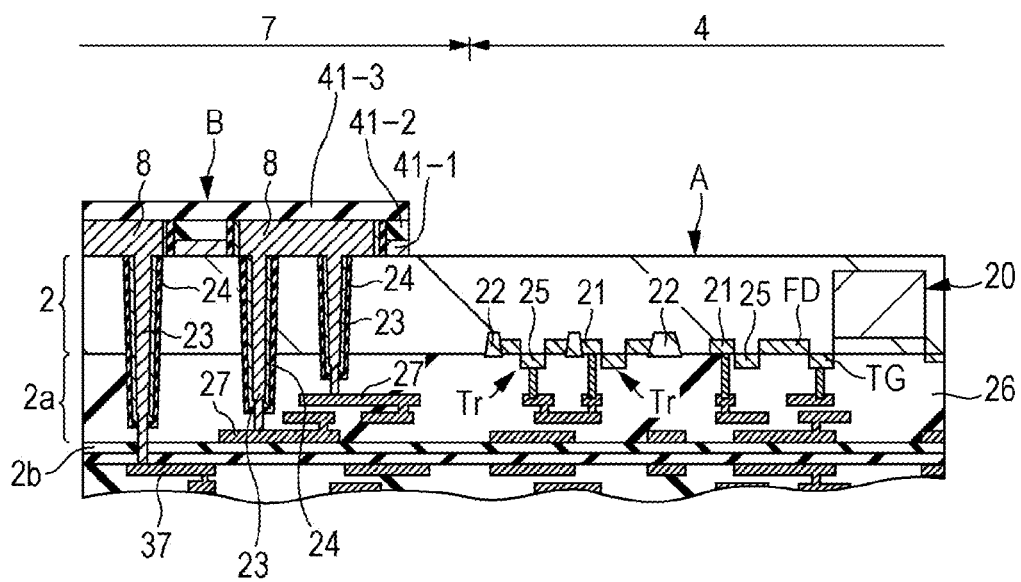

Subsequently, as shown in FIG. 9B, a capping film 14-3 that has a dispersion preventing effect as to the copper (Cu) making up the wiring 8 is formed in the state of covering the wiring 8 and silicon nitride film 41-2. As a capping film 41-3, for example the silicon nitride film is formed in a film thickness of 70 nm. Thus, the three layers of the silicon oxide film 41-1, silicon nitride film 41-2, and capping film 41-3 are layered onto the light receiving face A of the sensor substrate 2.

Next, portions of the three-layer layered film that correspond to the pixel region 4 are selectively removed by etching in the periphery region 7. Thus, an insulating pattern B is formed on the light receiving face A that corresponds to the periphery region 7, by patterning the three-layer layered film. In this event, using the resist pattern omitted from the diagram herein as a mask, the capping film 41-3 made of silicon nitride and the silicon nitride film 41-2 are etched, and further, the etching conditions are changed and the silicon oxide film 41-1 is etched. In etching the silicon oxide film 41-1, by performing wet etching, damage to the sensor substrate 2 is suppressed and the light receiving face A of the pixel region 4 is exposed.

FIG. 10A

Figure 10A:
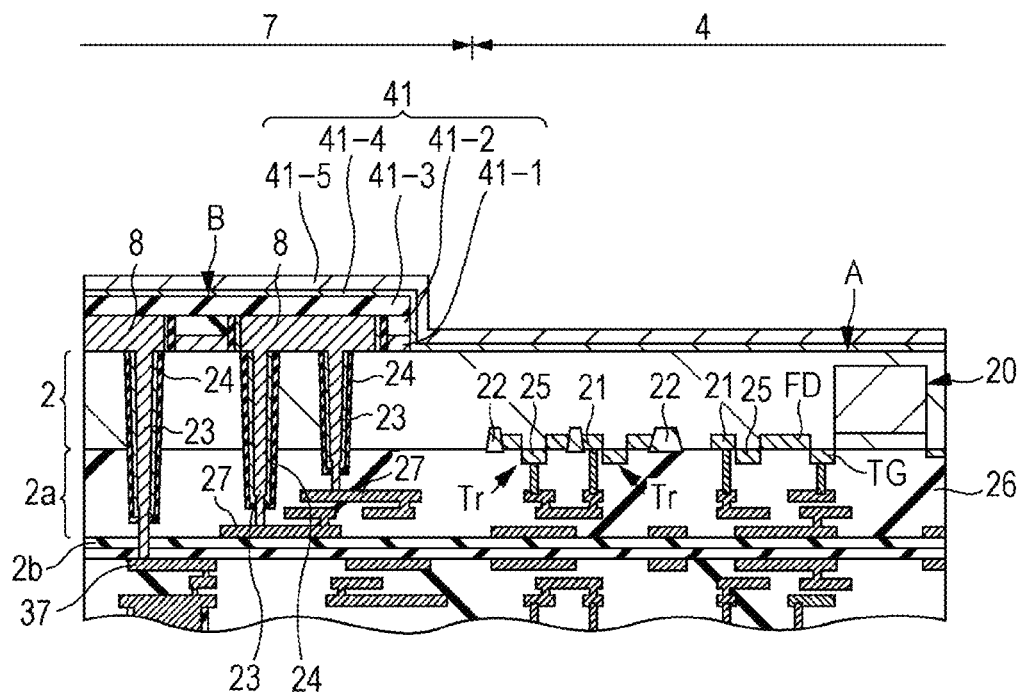
FIGS. 10A and 10B are cross-sectional process diagrams (part 3) illustrating manufacturing procedures of the solid-state imaging device according to the second embodiment.

Subsequently, as shown in FIG. 10A, for example a reflection preventing film 41-4 made of hafnium oxide ($HfO_2$) and an interface level suppression film 41-5 made of silicon oxide ($SiO_2$) are formed, in this order, on the light receiving face A of the sensor substrate 2, in the state of covering the insulation pattern B in the periphery region 7. Thus, an insulation layer 41, made of the insulation pattern B and the reflection preventing film 41-4 and interface level suppression film 41-5 covering this, is formed on the light receiving face A.

The insulation layer 41 has a stepped construction, wherein the film thickness of the pixel region 4 is thinner than the film thickness of the periphery region 7, and the pixel region 4 has a thinned cavity construction. In such a state, just the reflection preventing film 41-4 and interface level suppression film 41-5 are disposed in the pixel region 4. On the other hand, a five-layer construction insulation layer 41 portion, made of the insulating pattern B, the reflection preventing film 41-4, and the interface level suppression film 41-5, are disposed in the periphery region 7.

Note that the thin film portion in the insulation layer 41 may be set to have a wide range, in a range in which there is no influence on the wiring 8, thereby preventing influence on incident light to the photoelectric converters 20 due to the stepped form of the insulation layer 41 worsening the unevenness in the coating of the transparent flat film to be formed hereafter. This is similar to the first embodiment.

FIG. 10B

Figure 10B:
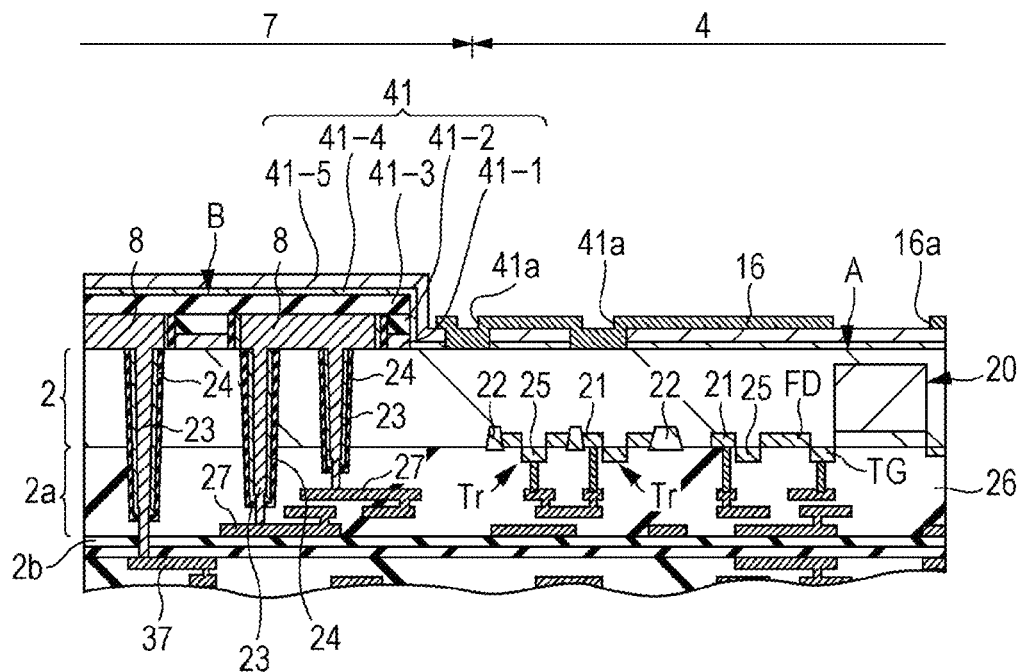

Next, as shown in FIG. 10B, openings 41a which expose the sensor substrate 2 are formed on the lower portion of the step in the insulation layer 41, and the blocking film 16 that has been grounded to the sensor substrate 2 is formed in a pattern on the insulation layer 41 via the openings 41a in the pixel region 4. A light receiving opening 16a corresponding to each photoelectric converter 20 is provided to the blocking film 16 herein. The above process is performed using procedures that are similar to the procedures described with reference to FIG. 6C in the first embodiment. Also, such a blocking film 16 may be removed on the upper portions of the step of the insulation layer 41, and may be in a form that widely covers the lower portions of the step, and thus, the stepped form in the insulation layer 41 can be reduced over a wide range. This is also similar to the first embodiment.

FIG. 7

Subsequent to the above, as shown in FIG. 7, a transparent protective film 17 made of a material having light permeability is formed in a state of covering the blocking film 16, with a coating method such as a spin-coating method. Next, color filters 18 in colors corresponding to the photoelectric converters 20 are formed on the transparent protective film 17, and further, on-chip lenses 19 that correspond to the photoelectric converters are formed thereupon. Also, the circuit substrate 9 is caused to be thinner, by polishing the exposed face of the circuit substrate 9, and the via 33 is exposed so as to become a through via 33. Subsequently, the protective film 9c is formed on top of the circuit substrate 9 in a state of covering the through via 33, and a pad opening 33a that exposes the through via 33 is formed, thereby completing the solid-state imaging device 1-2.

Advantages of Second Embodiment

The solid-state imaging device 1-2 in the configuration described above, similar to the solid-state imaging device according to the first embodiment, is a rear-projection type that provides wiring 8 to the periphery region 7, provides an insulation layer 41 having a thin film stepped construction in the pixel region 4 on the light receiving face A, and provides an on-chip lens 19 thereupon. Accordingly, similar to the first embodiment, the pattern accuracy of the wiring 8 can be secured, while reducing the distance between the on-chip lens 19 and light receiving face A, and improving the light reception properties by the photoelectric converters 20.

Third Embodiment

Configuration of Solid-State Imaging Device

Figure 11:
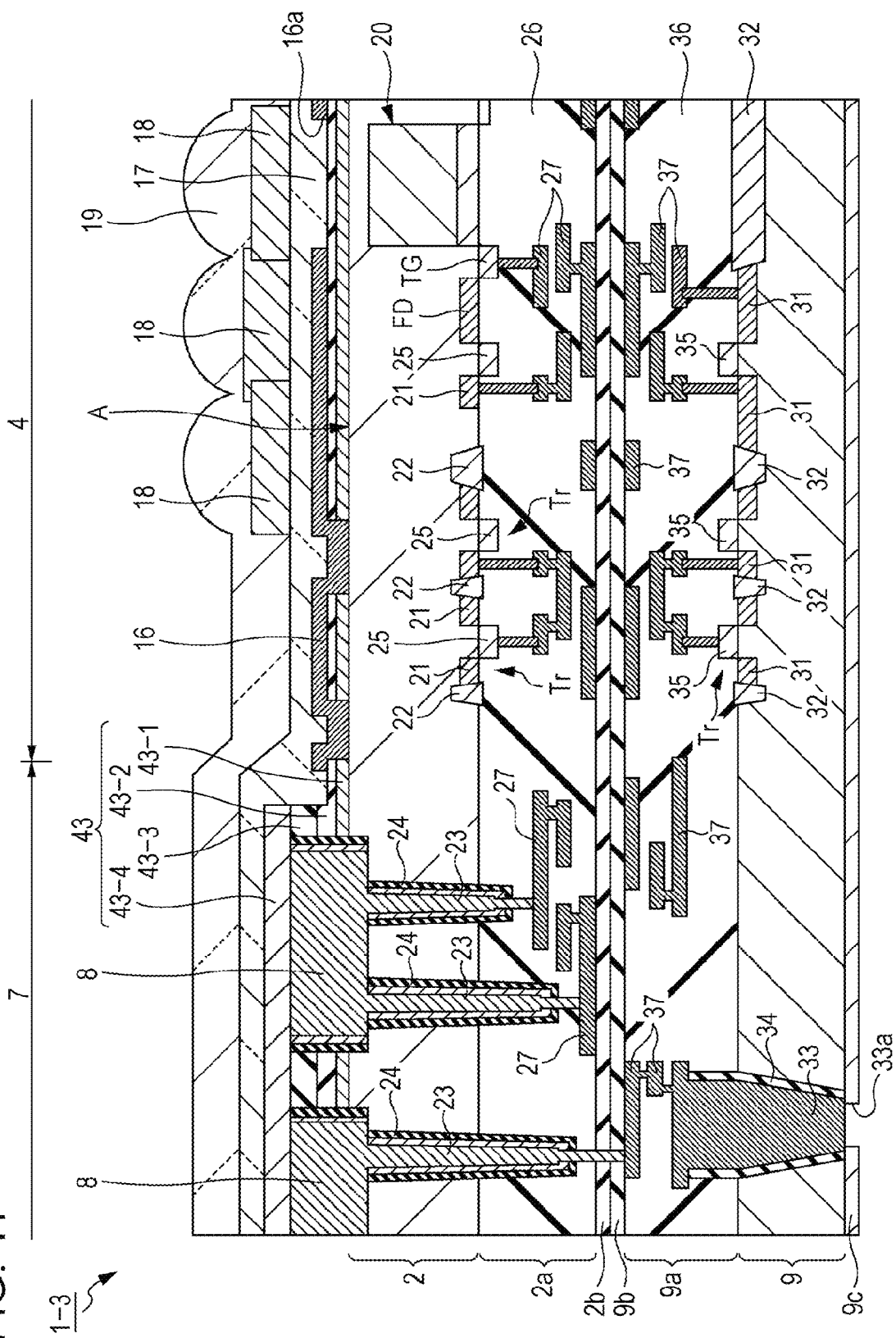
FIG. 11 is a principal portion cross-sectional diagram illustrating a configuration of the solid-state imaging device according to a third embodiment.

Example of Providing Embedded Wiring with Stepped Insulation Layer and Sensor Substrate Etched Back FIG. 11 is a principal portion cross-sectional diagram illustrating a configuration of a solid-state imaging device 1-3 according to a third embodiment, and is a cross-sectional diagram of the border vicinity between the pixel region 4 and periphery region 7 in FIG. 1. A configuration of the solid-state imaging device 1-3 according to the third embodiment will be described based on the principal portion cross-section herein will be described.

The portions that the solid-state imaging device 1-3 according to the third embodiment shown in FIG. 11 differs from the solid-state imaging device according to the first embodiment described with reference to FIG. 2 is in the layer construction of the insulation layer 43 which has a stepped construction, and in the embedded portion of the wiring 8, and the other configurations are similar to that of the first embodiment.

That is to say, the insulation layer 43 is a four-layer construction of a reflection preventing film 43-1, interface level suppressing film 43-2, etching stopping film 43-3, and capping film 43-4. This four-layer construction insulation layer 43 is formed in a thin two-layer construction of the reflection preventing film 43-1 and interface level suppressing film 43-2 in the pixel region 4, whereby the configuration is a stepped construction wherein the film thickness in the pixel region 4 is thinner than the film thickness of the periphery region 7.

In the thick film portion in the periphery region 7 of the insulation layer 43 that is in a layered construction as described above, wiring grooves to house the wiring 8 are formed on the etching stopping film 43-3, interface level suppression film 43-2, reflection preventing film 43-1, and the front face layer of the sensor substrate 2, which are layers lower than the capping film 43-4. That is to say, wiring grooves formed by etching are formed also on the front face layer of the sensor substrate 2, and the wiring 8 is embedded in the wiring grooves. Also, the through via 23 provided through the sensor substrate 2 are in the configuration connected to the wiring 8.

Manufacturing Method of Solid-State Imaging Device

Next, a manufacturing method of the solid-state imaging device 1-3 configured as described above will be described, with reference to the cross-sectional process diagrams in FIGS. 12 through 13.

FIG. 12A

Figure 12A:
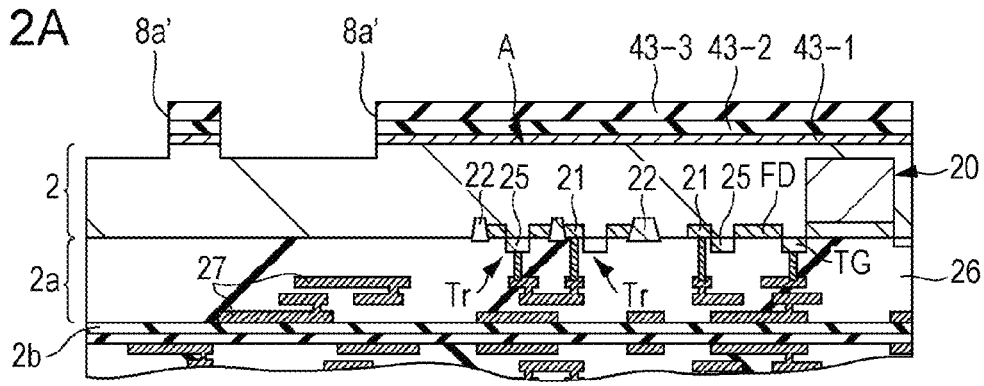
FIGS. 12A through 12C are cross-sectional process diagrams (part 1) illustrating manufacturing procedures of the solid-state imaging device according to the third embodiment.

First, as shown in FIG. 12A, the sensor substrate 2 and circuit substrate are bonded together, and the light receiving face A side of the sensor substrate 2 is thinned as appropriate. Up to this point is performed similar to the descriptions of the first embodiment with reference to FIG. 3A. Thereafter, on the light receiving face A of the sensor substrate 2, for example a reflection preventing film 43-1 made of hafnium oxide ($HfO_2$), interface level suppression film 43-2 made of silicon oxide ($SiO_2$), and etching stopping film 43-3 made of silicon nitride (SiN) will be layered in this order. The three layers herein are formed as a film which makes up a portion of the insulation layer (43) that has the above-described stepped construction.

Subsequently, in the periphery region 7 of the sensor substrate 2, wiring grooves 8a' are formed on the reflection preventing film 43-1, interface level suppressing film 43-2, etching stopping film 43-3, and front face layer of the sensor substrate 2. In this event, using the resist pattern omitted in the diagram herein as a mask, from the etching stopping film 43-3 to the front face layer of the sensor substrate 2 is etched. Upon etching being ended, the resist pattern is removed.

FIG. 12B

Figure 12B:
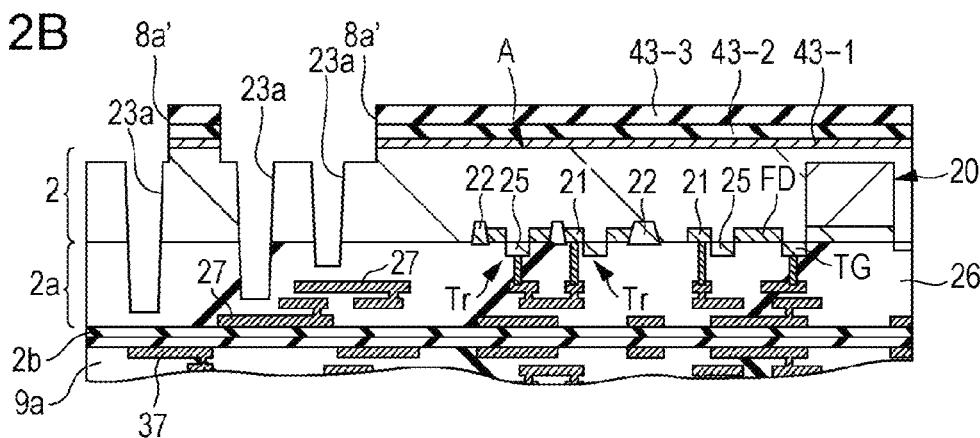

Next, as shown in FIG. 12B, connecting holes 23a in depths as appropriate are formed in the wiring grooves 8a'. The connecting holes 23a are similar to the first embodiment, and are formed in various depths that reach the upper portion of the embedded wiring 27 or embedded wiring 37 which are provided on the front face side of the sensor substrate 2. Thereafter, procedures similar to the procedures described in the first embodiment with reference to FIGS. 5A through 5C are performed.

FIG. 12C

Figure 12C:
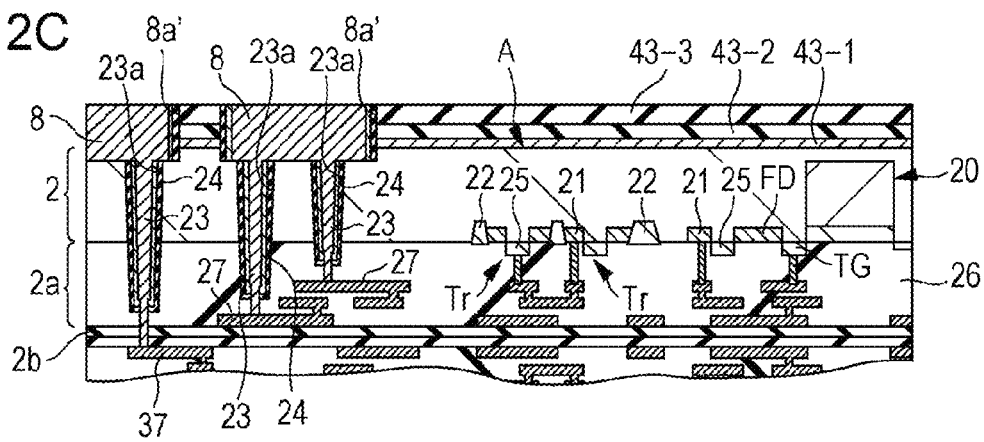

Thus, as shown in FIG. 12C, a separating insulating film 24 in a layered construction is formed on the inner walls of the wiring grooves 8a' and connecting holes 23a, the inner portions herein are filled in with copper (Cu) so as to be integrated, and the wiring 8 and through via 23 that are connecting to the embedded wiring 27 or embedded wiring 37 are formed.

FIG. 13A

Figure 13A:
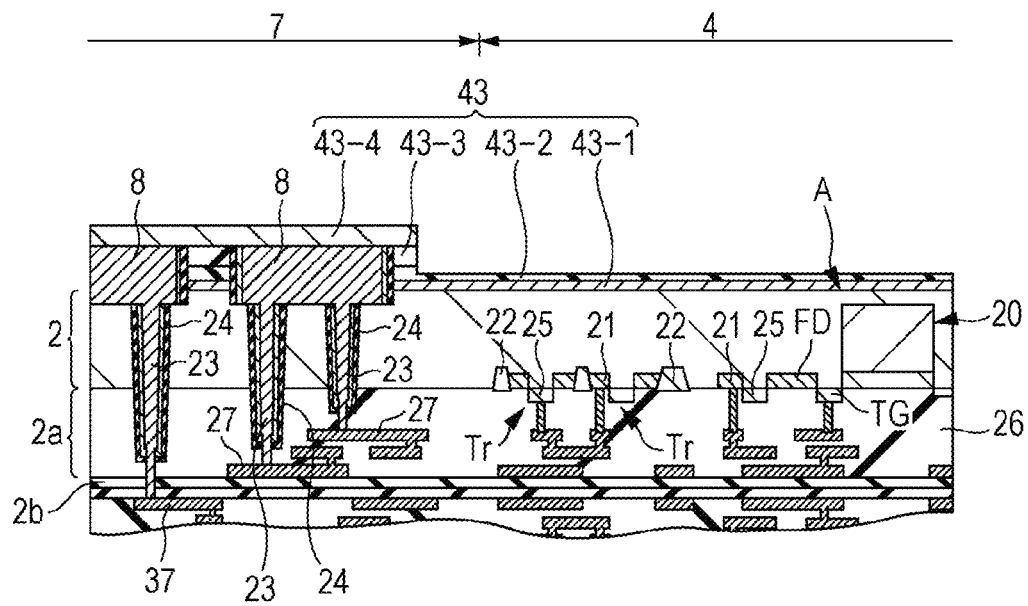
FIGS. 13A and 13B are cross-sectional process diagrams (part 2) illustrating manufacturing procedures of the solid-state imaging device according to the third embodiment.

Subsequently, as shown in FIG. 13A, a capping film 43-4 having a dispersion preventing effect as to the copper (Cu) making up the wiring 8 is formed in a state of covering the wiring 8 and etching stopping film 43-3. Now, as a capping film, a silicon nitride film is formed in a film thickness of 70 nm. Thus, a four-layer construction of insulation layer 43 is formed on the light receiving face A of the sensor substrate 2, layering in the order of the reflection preventing film 43-1, interface level suppressing film 43-2, etching stopping film 43-3, and capping film 43-4. Note that a silicon oxide film may further be formed as appropriate on top of the uppermost layer which is the capping film 43-4 made of silicon nitride.

Upon forming the layered construction insulation layer 43 and wiring 8 as described above, the portions of the insulation layer 43 corresponding to the pixel region 4 are selectively made thin, thereby forming the insulation layer 43 in a stepped construction. In this event, using the resist pattern, which is omitted in the diagram herein, as a mask, the capping film 43-4 and etching stopping film 43-3 made of silicon nitride (SiN) are etched.

Thus, the insulation layer 43, which has a stepped construction wherein the film thickness in the pixel region 4 is thinner than the film thickness in the periphery region 7, and which has a cavity construction that is thinned in the pixel region 4, is provided on the light receiving face A of the sensor substrate 2. In such a state, just the reflection preventing film 43-1 and interface level suppression film 43-2 remain in the pixel region 4. On the other hand, the four-layer construction insulation layer 43 remains without change in the periphery region 7.

Figure 13B:
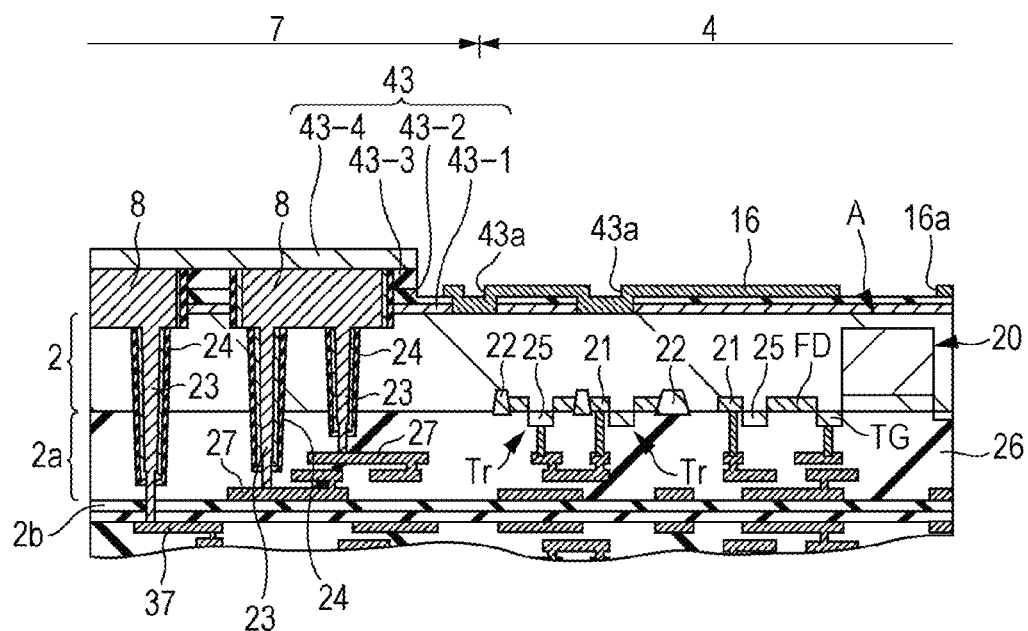

Note that the thin film portion in the insulation layer 43 may be set to have a wide range, in a range in which there is no influence on the wiring 8, thereby preventing influence on incident light to the photoelectric converters 20 due to the stepped form of the insulation layer 43 worsening the unevenness in the coating of the transparent flat film to be formed hereafter. This is similar to the first embodiment.
FIG. 13B Next, as shown in FIG. 13B, openings 43a which expose the sensor substrate 2 are formed on the lower portion of the step in the insulation layer 43, and the blocking film 16 that has been grounded to the sensor substrate 2 is formed in a pattern on the insulation layer 43 via the openings 43a in the pixel region 4. A light receiving opening 16a corresponding to each photoelectric converter 20 is provided to this blocking film 16. The above process is performed using procedures that are similar to the procedures described with reference to FIG. 6C in the first embodiment. Also, such a blocking film 16 may be removed on the upper portions of the step of the insulation layer 43, and may be in a form that widely covers the lower portions of the step, and thus, the stepped form in the insulation layer 43 can be reduced over a wide range. This is also similar to the first embodiment.
FIG. 11

Subsequent to the above, as shown in FIG. 11, a transparent protective film 17 made of a material having light permeability is formed in a state of covering the blocking film 16, with a coating method such as a spin-coating method. Next, color filters 18 in colors corresponding to the photoelectric converters 20 are formed on the transparent protective film 17, and further, on-chip lenses 19 that correspond to the photoelectric converters are formed thereupon. Also, the circuit substrate 9 is caused to be thinner, by polishing the exposed face of the circuit substrate 9, and the via 33 is exposed so as to become a through via 33. Subsequently, the protective film 9c is formed on top of the circuit substrate 9 in a state of covering the through via 33, and a pad opening 33a that exposes the through via 33 is formed, thereby completing the solid-state imaging device 1-3.
Advantages of Third Embodiment The solid-state imaging device 1-3 in the configuration described above, similar to the solid-state imaging device according to the first embodiment, is a rear-projection type that provides wiring 8 to the periphery region 7, provides an insulation layer 43 having a thin film stepped construction in the pixel region 4 on the light receiving face A, and provides an on-chip lens 19 thereupon. Accordingly, similar to the first embodiment, the pattern accuracy of the wiring 8 can be secured, while reducing the distance between the on-chip lens 19 and light receiving face A, and improving the light reception properties by the photoelectric converters 20. Also, similar to the first embodiment, the light receiving face A can be favorably maintained without etching damage.

Figure 14:
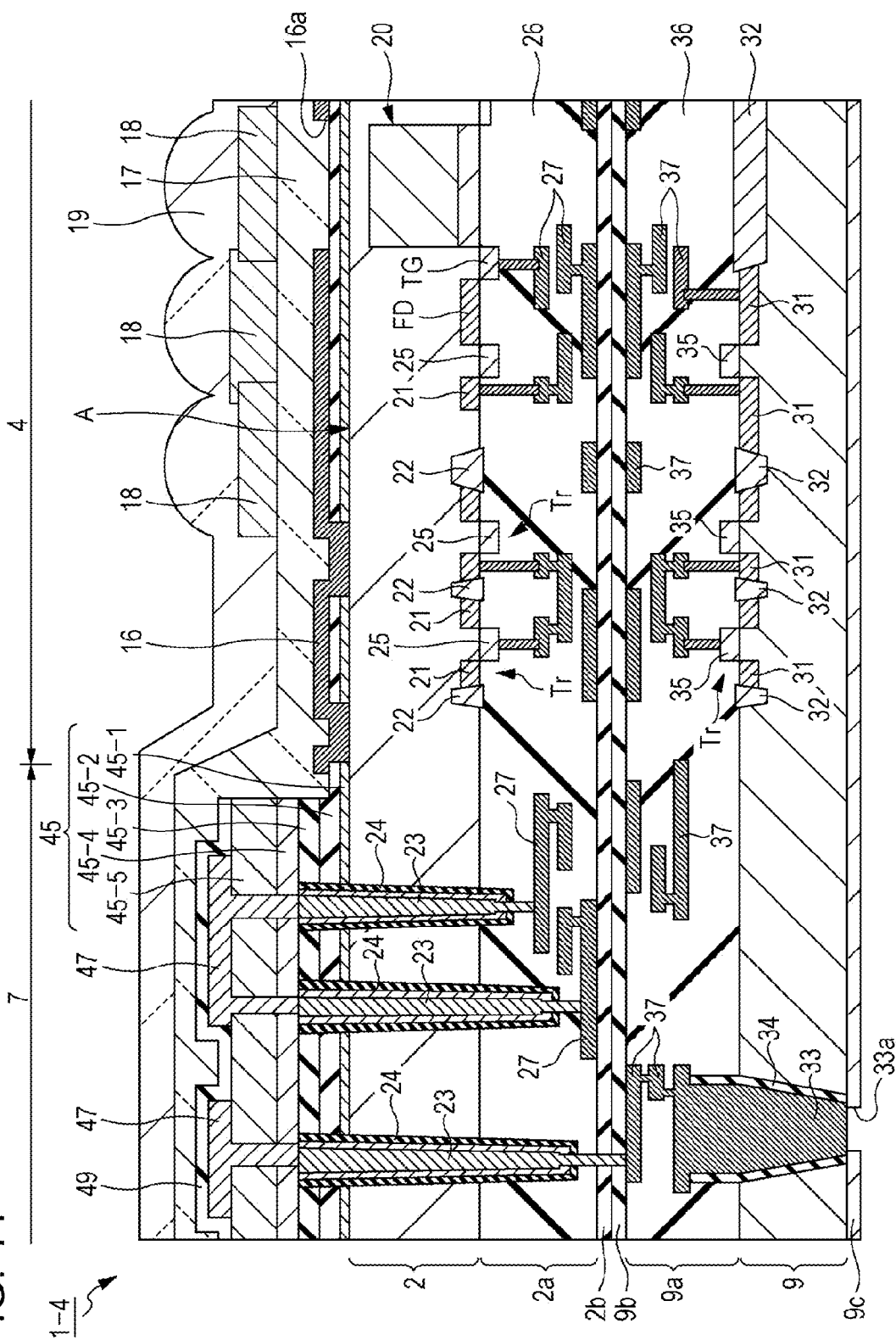
FIG. 14 is a principal portion cross-sectional diagram illustrating a configuration of the solid-state imaging device according to a fourth embodiment.

Note that according to the present third embodiment, a configuration is described which provides a wiring groove 8a', into which the wiring 8 is embedded, on the sensor substrate 2 and the lower portion of the insulation layer 43. However, the wiring grooves 8a' may be formed just in the sensor substrate 2, and the wiring 8 completely embedded as to the sensor substrate. In this case also, similar advantages can be obtained by having a stepped construction wherein the insulation layer 43 is secured at an appropriate film thickness to cover the wiring 8 in the periphery region 7, and a film thickness that is thinned to be thinner than this is used in the pixel region 4.
Fourth Embodiment
Configuration of Solid-State Imaging Device
Example of Providing Insulation Layer and Layered Wiring in a Stepped Construction FIG. 14 is a principal portion cross-sectional diagram showing the configuration of the solid-state imaging device 1-4 according to the fourth embodiment, and is a cross-sectional diagram near the border between the pixel region 4 and periphery region 7 in FIG. 1. A configuration of the solid-state imaging device 1-4 according to the fourth embodiment based on the principal portion cross-sectional diagram herein will be described.

The solid-state imaging device 1-4 according to the fourth embodiment shown in FIG. 14 differs from the solid-state imaging device according to the first embodiment described with reference to FIG. 2 in having a layer construction of an insulation layer 45 which has a stepped construction, and in a wiring 47, and the other configurations are similar to the first embodiment.

That is to say, the insulation layer 45 has a five-layer construction made of a reflection preventing film 45-1, interface level suppress film 45-2, etching stopping film 45-3, capping film 45-4, and an insulating film 45-5 made of silicon oxide. This five-layer construction insulation layer 45 is formed in a two-layer construction of the reflection preventing film 45-1 and interface level suppress film 45-2 in the pixel region 4, whereby the configuration is a stepped construction wherein the film thickness in the pixel region 4 is thinner than the film thickness in the periphery region 7.

At the thick film portion in the periphery region 7 of the insulation layer 45 made in a layered construction as described above, the through via 23 provided through the sensor substrate 2 is expended to the surface of the etching stopping film 45-3.

Also, the wiring 47 is formed in a pattern on the insulation layer 45 via the openings 43a in the periphery region 7. The wiring 47 is made of an etchable conductive material such as aluminum, for example, and connects the upper layer of the insulation layer 45 to the through via 23 via the connecting holes provided in the capping film 45-4 and inter-layer film 45-5. This wiring 47 is covered with an insulating protective film 49.

Manufacturing Method of Solid-State Imaging Device

Next, a manufacturing method according to the solid-state imaging device 1-4 in the configuration described above will be described based on the cross-sectional process diagrams in FIGS. 15 and 16.

FIG. 15A

Figure 15A:
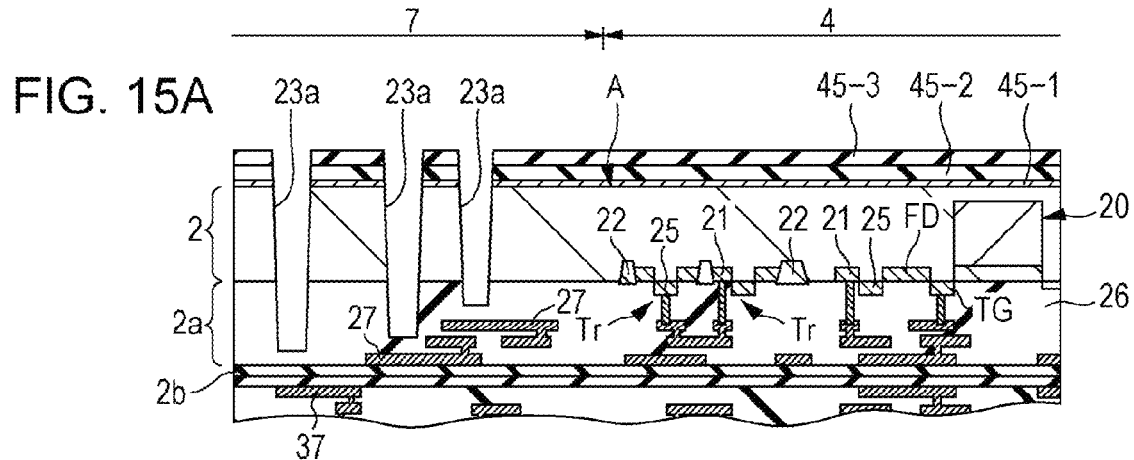
FIGS. 15A through 15C are cross-sectional process diagrams (part 1) illustrating manufacturing procedures of the solid-state imaging device according to the fourth embodiment.

First, as shown in FIG. 15A, the sensor substrate 2 and circuit substrate are bonded together, and the light receiving face A side of the sensor substrate 2 is thinned as appropriate. Up to this point is performed similar to the descriptions of the first embodiment with reference to FIG. 3A. Thereafter, on the light receiving face A of the sensor substrate 2, for example a reflection preventing film 45-1 made of hafnium oxide ($HfO_2$), interface level suppression film 45-2 made of silicon oxide ($SiO_2$), and etching stopping film 45-3 made of silicon nitride (SiN) will be layered in this order. The three layers herein are formed as a film which makes up a portion of the insulation layer (45) that has the above-described stepped construction.

Subsequently, in the periphery region 7 of the sensor substrate 2, connecting holes 23a in depths as appropriate are formed in the etching stopping film 45-3, interface level suppression film 45-2, reflection preventing film 45-1, sensor substrate 2, and inter-layer insulating film which makes up the wiring layer 2a. The connecting holes 23a are similar to the first embodiment, and are formed in various depths that reach the upper portions of the embedded wiring 27 or embedded wiring 37.

FIG. 15B

Figure 15B:
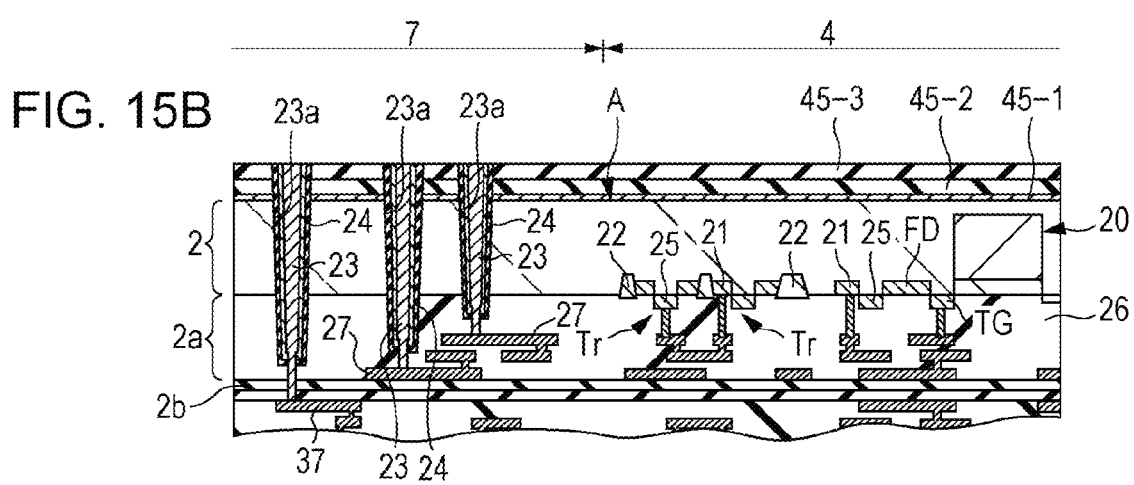
Figure 15C:
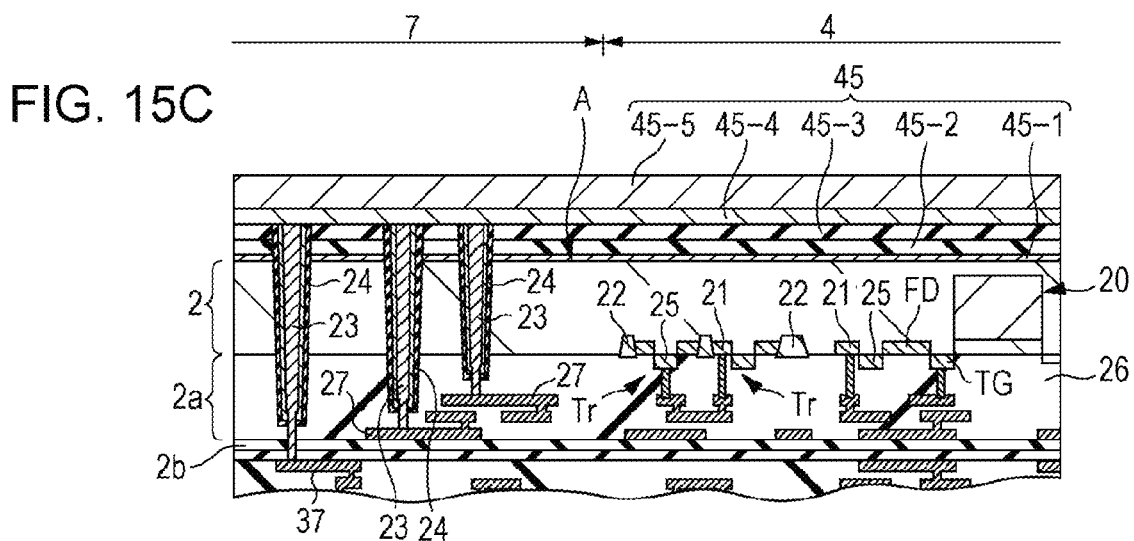

As shown in FIG. 15B, a separating insulating film 24 in a layered configuration is formed on the inner walls of the connecting holes 23a, and by filling the inner portions thereof with copper (Cu), the through vias 23 connected to the embedded wiring 27 and embedded wiring 37 are formed within the connecting holes 23a. The separating insulating film 24 and through via 23 can be formed with procedures similar to the procedures described with reference to FIGS. 5A through 5C according to the first embodiment. FIG. 15C Next, as shown in FIG. 15C, as a capping film 45-4 that has a dispersion preventing effect as to the copper (Cu) making up the through via 23, for example a silicon nitride film in a film thickness of 70 nm is formed in a state of covering the through via 23 and etching stopping film 45-3. Further, a silicon oxide film is formed thereupon as an inter-layer film 45-5. Thus, an insulation layer 45 in a five-layer construction is formed on the light receiving face A of the sensor substrate 2, in a layered manner in the order of a reflection preventing film 45-1, interface level suppressing film 45-2, etching stopping film 45-3, capping film 45-4, and inter-layer film 45-5.

FIG. 16A

Figure 16A:
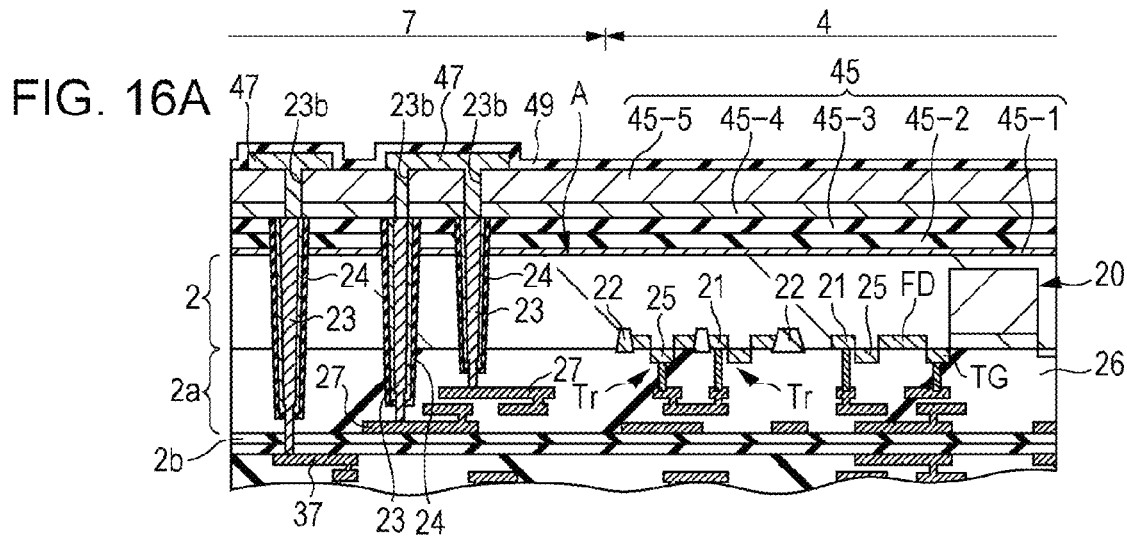
FIGS. 16A through 16C are cross-sectional process diagrams (part 2) illustrating manufacturing procedures of the solid-state imaging device according to the fourth embodiment.

Subsequently, as shown in FIG. 16A, in the periphery region 7, connecting holes 23b that reach the through vias 23 are formed in the inter-layer film 45-5 and capping film 45-4. Thereafter, wiring 47 that is connected to the through via 23 via the connecting holes 23b is formed on the inter-layer film 45-5. In this event, a film made of conductive material such as aluminum is formed on the inter-layer film 45-5 with a sputtering method, and next, the resist pattern formed thereupon is used as a mask to etch the conductive material film thereby forming the wiring 47 by patterning the conductive material film. After this, a protective film 49 that covers the wiring 47 is formed on the inter-layer film 45-5 as appropriate. Note that the protective film 49 also can be a film that makes up the insulation layer 45.

FIG. 16B

Figure 16B:
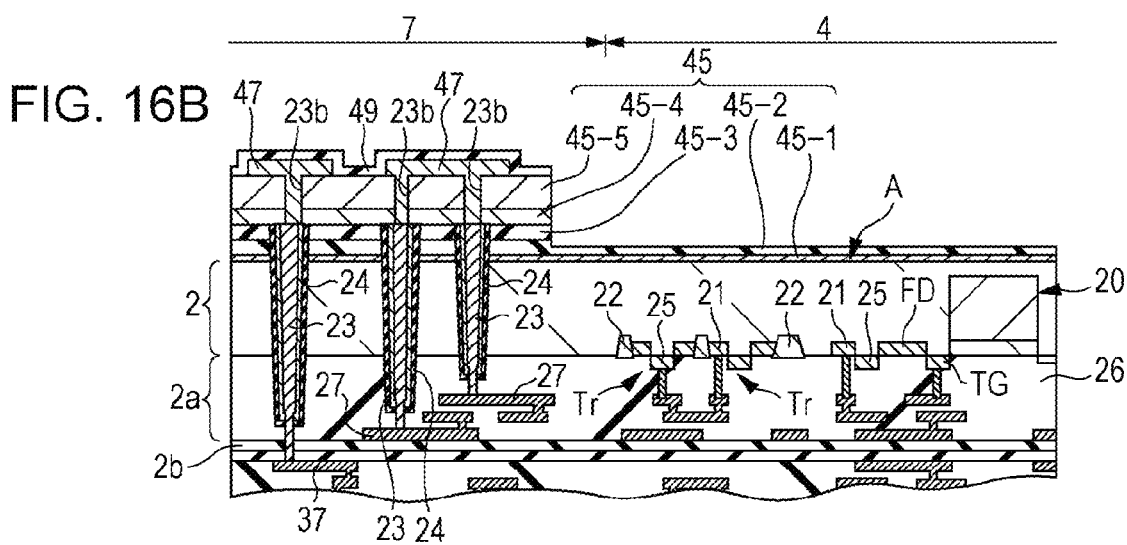

Next, as shown in FIG. 16B, the portions of the insulation layer 45 corresponding to the pixel region 4 are selectively made thin, thereby forming the insulation layer 45 in a stepped construction. In this event, using the resist pattern, which is omitted in the diagram herein, as a mask, the protective film 49, inter-layer film 45-5, capping film 45-4 and etching stopping film 45-3 are etched.

Thus, the insulation layer 45, which has a stepped construction wherein the film thickness in the pixel region 4 is thinner than the film thickness in the periphery region 7, and which has a cavity configuration that is thinned in the pixel region 4, is provided on the light receiving face A of the sensor substrate 2. In such a state, just the reflection preventing film 43-1 and interface level suppression film 43-2 remain in the pixel region 4. On the other hand, the five-layer construction insulation layer 45 and protective film 49 remain without change in the periphery region 7.

Note that the thin film portion in the insulation layer 45 may be set to have a wide range, in a range in which there is no influence on the wiring 47, thereby preventing influence on incident light to the photoelectric converters 20 due to the stepped form of the insulation layer 45 worsening the unevenness in the coating of the transparent flat film to be formed hereafter. This is similar to the first embodiment.

FIG. 16C

Figure 16C:
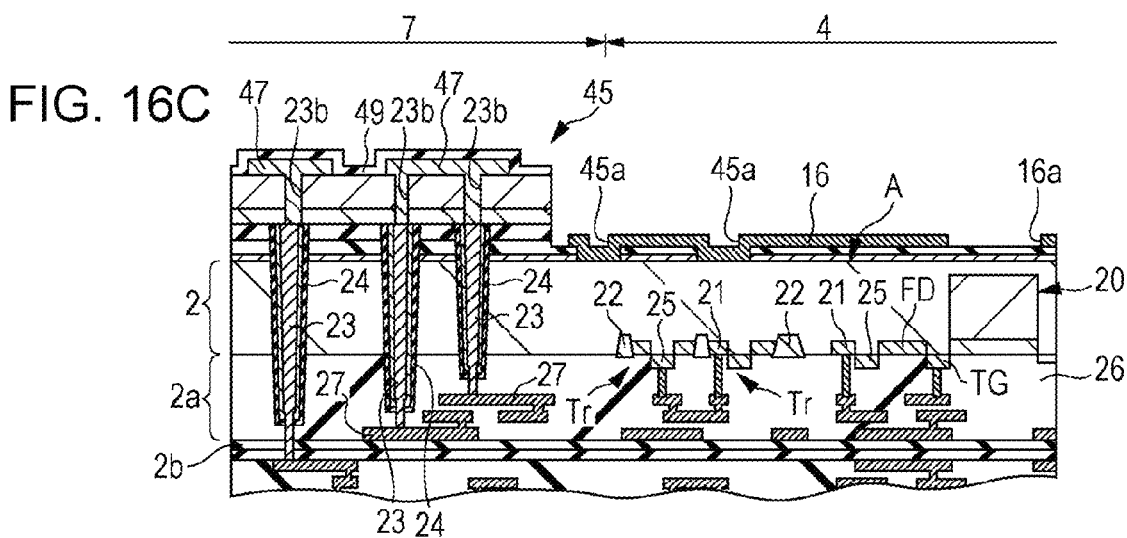

Next, as shown in FIG. 16C, openings 45a which expose the sensor substrate 2 are formed on the lower portion of the step in the insulation layer 45, and the blocking film 16 that has been grounded to the sensor substrate 2 is formed in a pattern on the insulation layer 45 via the openings 45a in the pixel region 4. A light receiving opening 16a corresponding to each photoelectric converter 20 is provided to the blocking film 16 herein. The above process is performed using procedures that are similar to the procedures described with reference to FIG. 6C in the first embodiment. Also, such a blocking film 16 may be removed on the upper portions of the step of the insulation layer 45, and may be in a form that widely covers the lower portions of the step, and thus, the stepped form in the insulation layer 45 can be reduced over a wide range. This is also similar to the first embodiment.

FIG. 14

Subsequent to the above, as shown in FIG. 14, a transparent protective film 17 made of a material having light permeability is formed in a state of covering the blocking film 16, with a coating method such as a spin-coating method. Next, color filters 18 in colors corresponding to the photoelectric converters 20 are formed on the transparent protective film 17 and further, on-chip lenses 19 that correspond to the photoelectric converters are formed thereupon. Also, the circuit substrate 9 is caused to be thinner, by polishing the exposed face of the circuit substrate 9, and the via 33 is exposed so as to become a through via 33. Subsequently, the protective film 9c is formed on top of the circuit substrate 9 in a state of covering the through via 33, and a pad opening 33a that exposes the through via 33 is formed. Further, a pad opening that exposes the wiring 47, which is omitted in the diagram herein, is formed on the wiring 47 made of aluminum or the like, and the solid-state imaging device 1-4 is completed.

Advantages of Fourth Embodiment

The solid-state imaging device 1-4 in the configuration described above, similar to the solid-state imaging device according to the first embodiment, is a rear-projection type that provides wiring 47 to the periphery region 7, provides an insulation layer 45 having a thin film stepped construction in the pixel region 4 on the light receiving face A, and provides an on-chip lens 19 thereupon. Accordingly, the insulation layer 45 of a film thickness appropriate to the configuration of the wiring 47 can remain in the periphery region 7, while reducing the distance between the on-chip lens 19 and light receiving face A, and improving the light reception properties by the photoelectric converters 20. Also similar to the first embodiment, the light receiving face A can be favorably maintained without etching damage.

Fifth Embodiment

Figure 17:
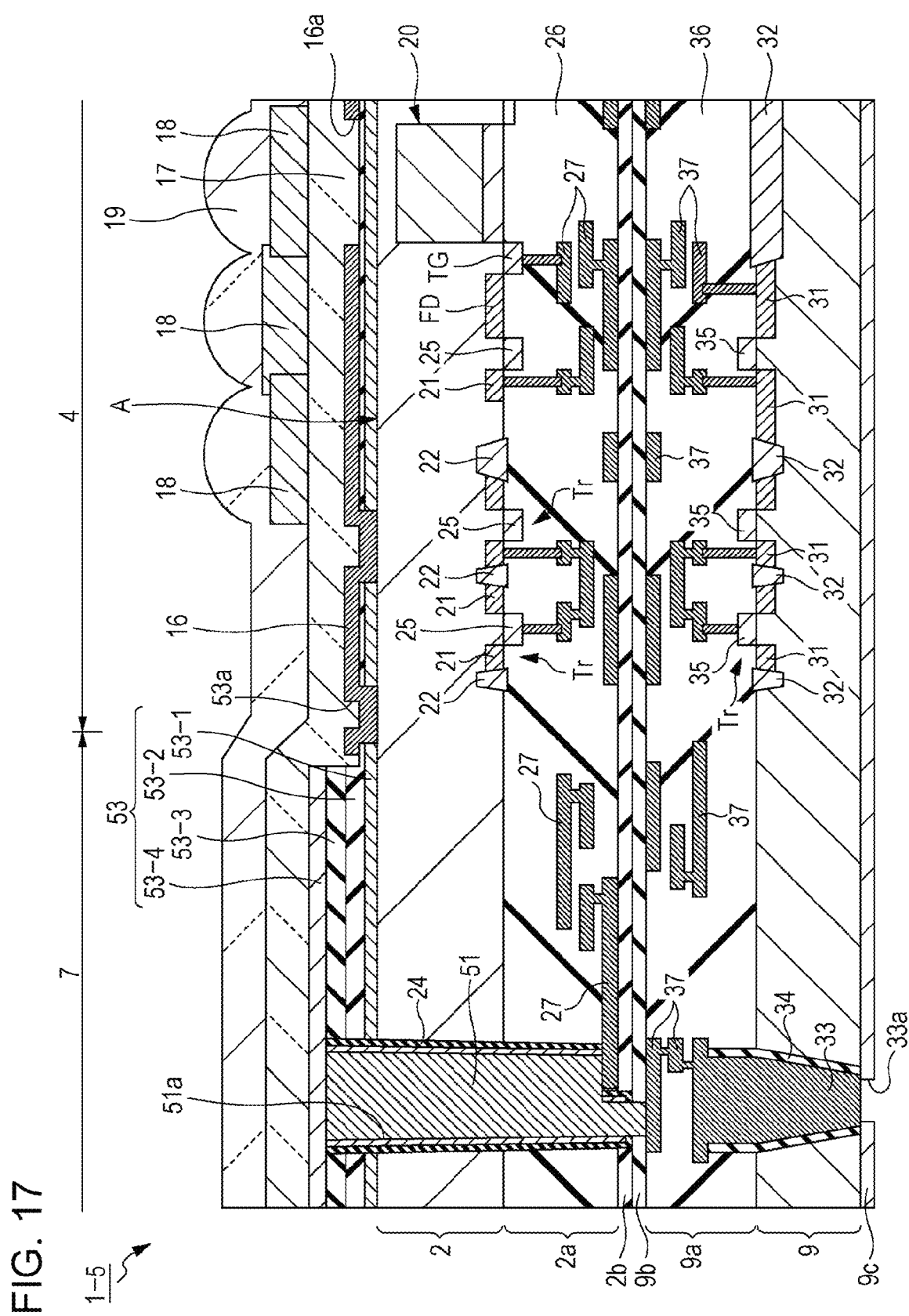
FIG. 17 is a principal portion cross-sectional diagram illustrating a configuration of the solid-state imaging device according to a fifth embodiment.

Example of Providing a Shared Connection to the Wiring Connections within the Sensor Substrate FIG. 17 is a principal portion cross-section diagram showing the configuration of a solid-state imaging device 1-5 according to a fifth embodiment, and is a cross-section diagram near the border of the pixel region 4 and periphery region 7 in FIG. 1. The configuration of the solid-state imaging device 1-5 according to the fifth embodiment will be described below, based on the principal portion cross-sectional diagram herein.

The solid-state imaging device 1-5 of a modification shown in FIG. 17 differs from the solid-state imaging device according to the first embodiment described with reference to FIG. 2 in the configuration of a through via 51 and a layer construction of the insulation layer 53, and other configurations thereof are similar to the first embodiment.

That is to say, the through via 51 is a so-called shared connection which connects the embedded wiring 27 provided to the wiring layer 2a and the embedded wiring 37 provided to the wiring layer 9a, for example, and is provided as wiring that connects the embedded wiring 27 and embedded wiring 37 herein. As such wiring, the through via 51 formed in an integrated manner is connected to the embedded wiring 27 and embedded wiring 37 on floor faces having different heights. Also, the through via 51 protrudes up through the light receiving face A of the sensor substrate 2, and the protruding portions are embedded in an insulation layer 53.

This through via 51 that also serves as wiring is made of an embedded conductive material via the separating insulating film 24, passing through the sensor substrate 2 from the insulating layer 53, further within the connecting holes 51a provided to the wiring layer 2a.

The insulation layer 53 having a stepped construction wherein the film thickness of the pixel region 4 is thinner than the film thickness of the periphery region 7, and the insulation layer being configured as a layering film using different insulating materials, for example, are similar to the first embodiment. This insulation layer 53 is a four-layer construction, for example, of a reflection preventing film 53-1, interface level suppressing film 53-2, etching stopping film 53-3, and capping film 53-4, in sequence from the light receiving face A side. For example, the reflection preventing film 53-1 is made of a hafnium oxide ($HfO_2$) film. The interface level suppressing film 53-2 is made of a silicon oxide film ($SiO_2$). The etching stopping film 53-3 is made of silicon nitride (SiN). Further, the capping film 53-4 is made of silicon nitride (SiN).

This four-layer insulation layer 53 is made thin in a two-layer construction of the reflection preventing film 53-1 and interface level suppressing film 53-2, in the pixel region 4. In the thick film portions of the insulation layer 53 in the periphery region 7, a through via 51 is extended from the etching stopping film 53-3 which is second from the top layer, to the connecting hole 51a provided on the lower layer, also as the above-described wiring.

Manufacturing of a solid-state imaging device 1-5 having such a configuration is performed, in forming the connecting holes 23a described with reference to FIG. 15A according to the fourth embodiment, by patterning so that one connecting hole 51a is disposed on the upper portion of both the embedded wiring 27 and the embedded wiring 37. Next, by performing procedures similar to the procedures described with reference to FIG. 15B, the through via 51 filled in with copper (Cu) via the separating insulating film 24 within the connecting hole 15a is formed as the wiring connected to the embedded wiring 27 and the embedded wiring 37. Next, by forming the capping film 53-4 and by selectively removing the capping film 53-4 and etching stopping film 53-3 in the pixel region 4, the insulation layer 53 has a stepped construction. After the above described process, procedures similar to those described according to other embodiments are performed, whereby the blocking film 16 having a light receiving opening 16a, a transparent protective film 17, color filter 18, and on-chip lens 19, are formed. Also, the circuit substrate 9 is thinned to expose the via 33 so as to make a through via 33, a protective film 9c is formed on the circuit substrate 9, and a pad opening 33a to expose the through via 33 are formed, whereby the solid-state imaging device 1-5 is completed.

Advantages of Fifth Embodiment

The solid-state imaging device 1-5 in the configuration described above, similar to the solid-state imaging device according to the first embodiment, is a rear-projection type that provides a through via 51 serving as wiring to the periphery region 7, provides an insulation layer 53 having a thin film stepped construction in the pixel region 4 on the light receiving face A, and provides an on-chip lens 19 thereupon. Accordingly, the insulation layer 53 of a film thickness appropriate to the configuration of the through via 51 serving as wiring can remain in the periphery region 7, while reducing the distance between the on-chip lens 19 and light receiving face A, and improving the light reception properties by the photoelectric converters 20. Also similar to the first embodiment, the light receiving face A can be favorably maintained without etching damage.

Note that according to the first through fifth embodiments, as an example of a rear-projection type solid-state imaging device, configurations that apply the present technology to a three-dimensional construction of a solid-state imaging device has been described. However, the present technology can be widely used in rear-projection type solid-state imaging devices, and is not limited to a three-dimensional construction. Also, the insulation layer having a stepped construction is not limited to the layered construction described according to the embodiments, and layered constructions that are applicable to the improvement in forming wiring and improving light reception properties.

Sixth Embodiment

Principal Portion Configuration of Solid-State Imaging Device 1

Figure 18:
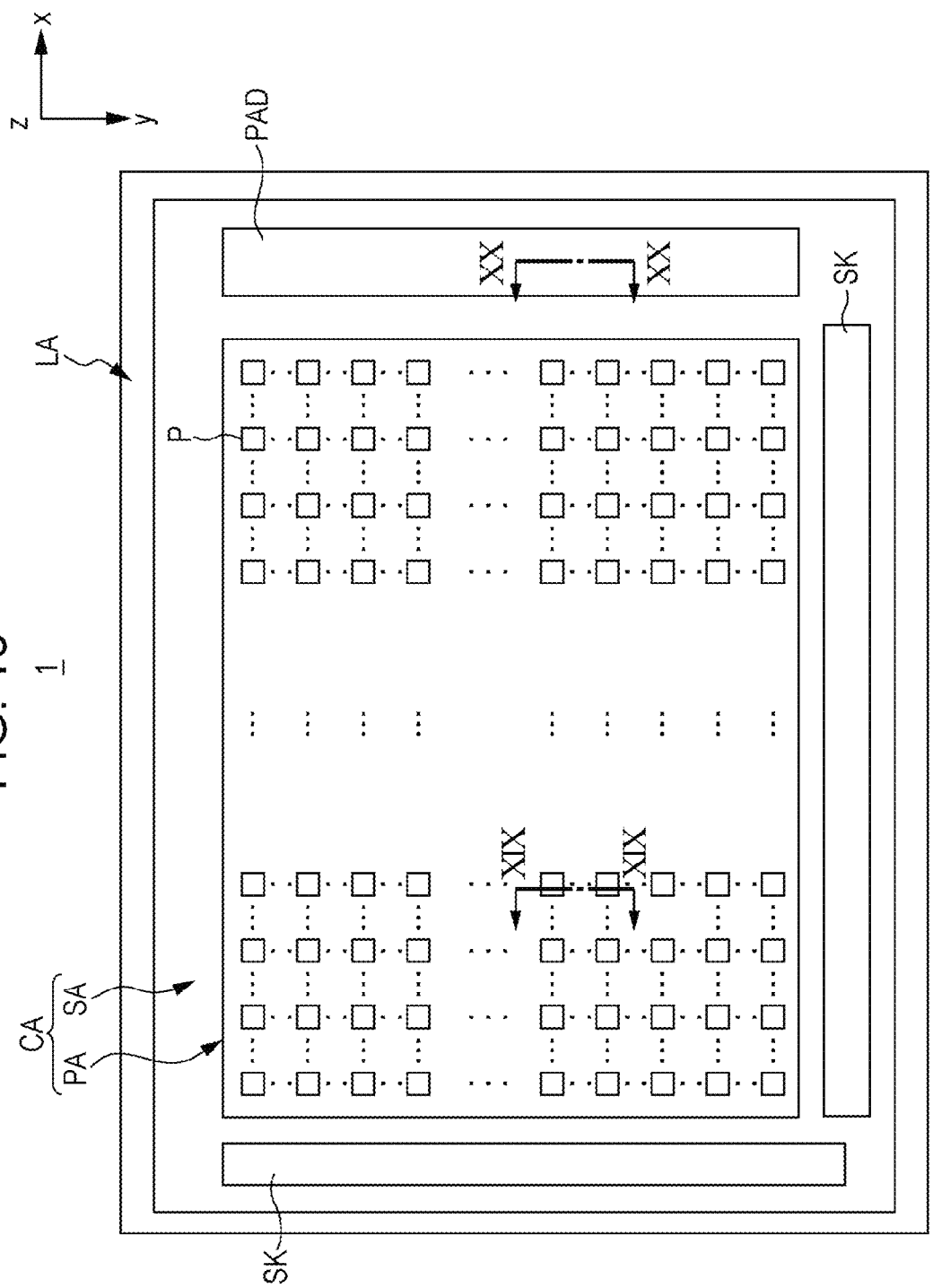
FIG. 18 is a diagram illustrating a configuration of the principal portions of a solid-state imaging device according to a sixth embodiment.
Figure 19:
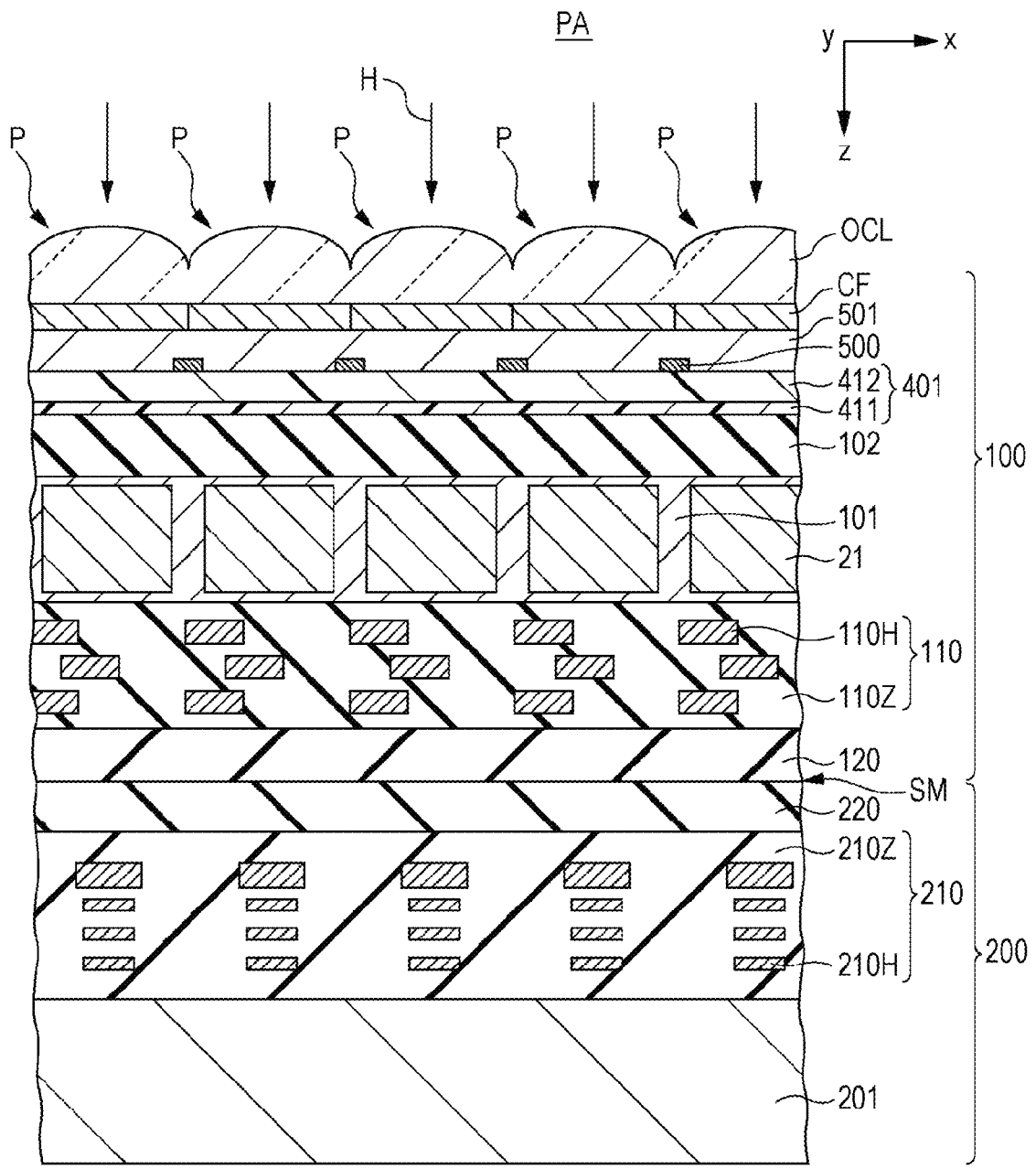
FIG. 19 is a diagram illustrating a configuration of the principal portions of the solid-state imaging device according to the sixth embodiment.
Figure 20:
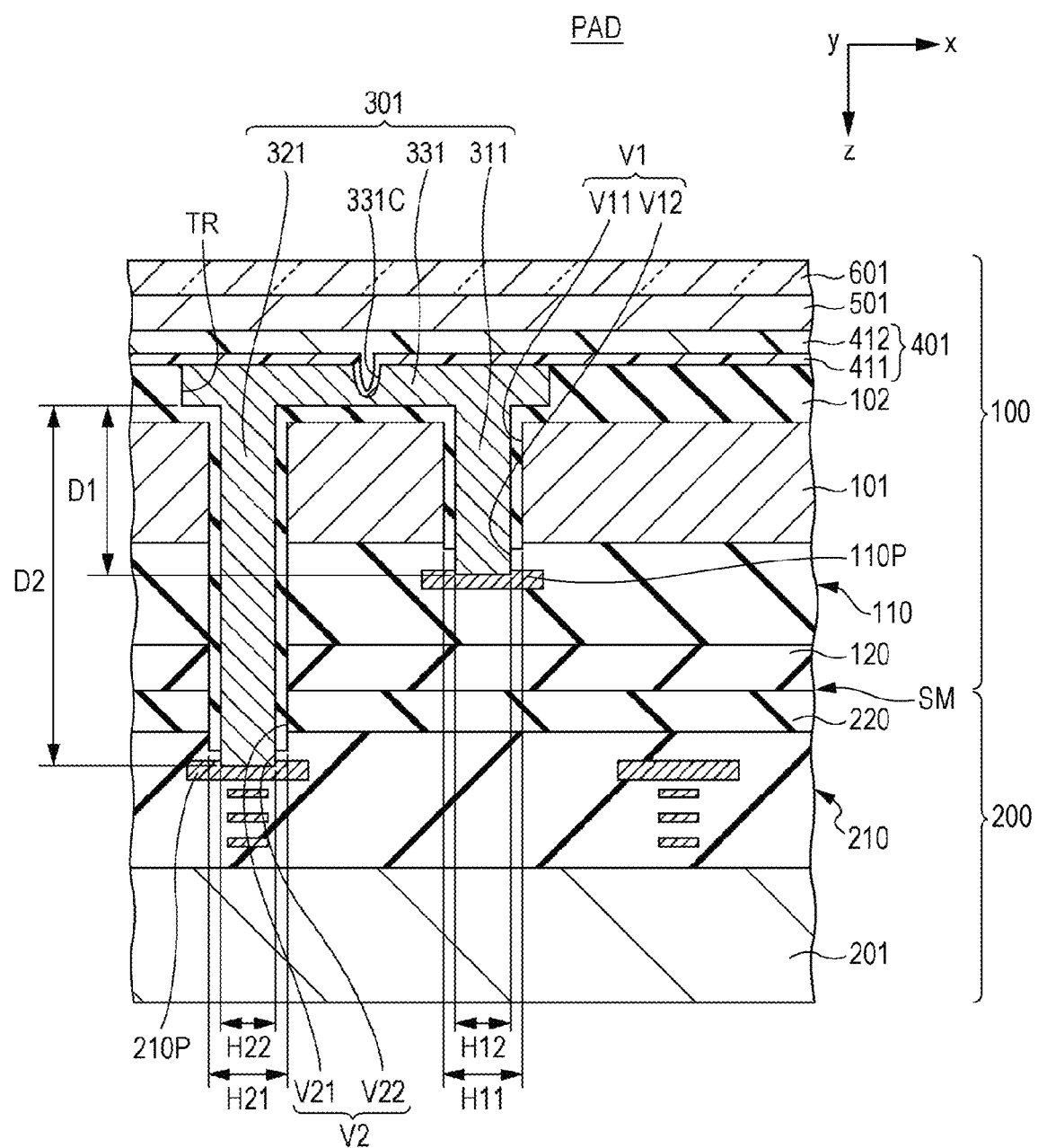
FIG. 20 is a diagram illustrating a configuration of the principal portions of the solid-state imaging device according to the sixth embodiment.
Figure 21:
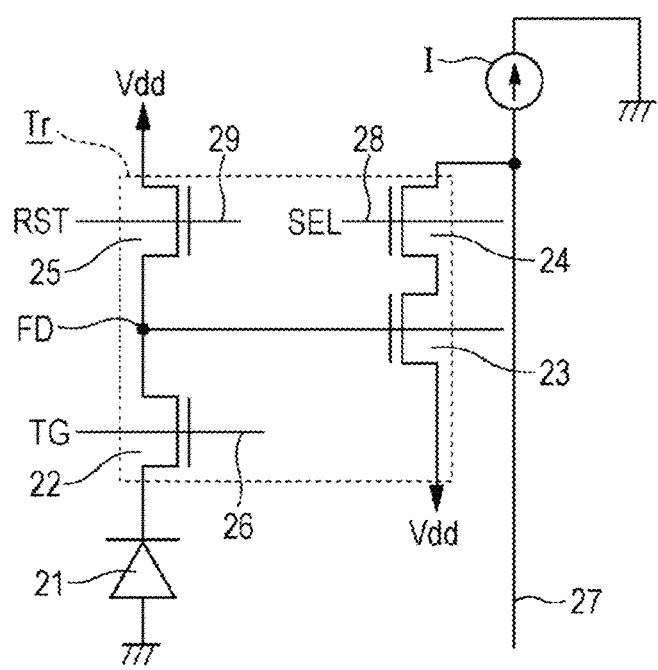
FIG. 21 is a diagram illustrating a configuration of the principal portions of the solid-state imaging device according to the sixth embodiment.

FIGS. 18-21 are diagrams illustrating principal portion configurations of a solid-state imaging device according to a sixth embodiment. FIG. 18 is an upper-face diagram and illustrates a face on the sensor substrate 100 side. Also, FIGS. 19 and 20 are cross-sectional diagrams. FIG. 19 illustrates a cross-section taken along line XIX-XIX in FIG. 18. Conversely, FIG. 20 illustrates a cross-section taken along line XX-XX in FIG. 18. FIG. 21 shows a circuit configuration of a pixel P.

Overview of Upper Face Configuration

As shown in FIG. 18, the solid-state imaging device 1 provides a chip region CA and scribe region LA on a face (xy face). As shown in FIG. 18, the chip region CA is in a rectangular shape that has been segmented in the horizontal direction x and the vertical direction y, and includes a pixel region PA. In addition, the chip region CA includes a periphery region SA. In the chip region CA, the pixel region PA has a rectangular shape, and multiple pixels P are arrayed in each of the horizontal direction x and vertical direction y and disposed thereon, as shown in FIG. 18. In the chip region CA, the periphery region SA is positioned in the periphery of the pixel region PA, as shown in FIG. 18. A pad unit PAD and a periphery circuit unit SK are provided to the periphery region SA, as shown in FIG. 18.

The scribe region LA is positioned so as to surround the periphery of the chip region CA, as shown in FIG. 18. Now, the scribe region LA includes portions extending in each of the horizontal direction x and the vertical direction y, and is provided so as to draw a rectangle around the chip region CA.

Multiple chip regions CA are arrayed and provided to a wafer (unshown) prior to dicing, and the scribe region LA is provided in grid form between the multiple chip regions CA thereof. In the scribe region LA, a blade is applied and dicing is performed, and the above-described chip region CA is divided into the solid-state imaging device 1.

Overview of Cross-Sectional Configuration

As shown in FIGS. 19 and 20, the solid-state imaging device 1 includes a sensor substrate 100 and logic substrate 200, which are bonded together facing each other. As shown in FIGS. 19 and 20, the sensor substrate 100 includes a semiconductor substrate 101. The semiconductor substrate 101 is made of single-crystal silicon, for example.

As shown in FIGS. 19 and 20, the sensor substrate 100 has a wiring layer 110 and insulating film 120 provided, in sequence thereof, to the front face (bottom face) of the semiconductor substrate 101 that faces the logic substrate 200. The wiring layer 110 and insulating film 120 each are provided across the entire front face (bottom face) of the semiconductor substrate 101.

As shown in FIG. 19, photodiodes 21 are provided within the inner portion of the semiconductor substrate 101 in the pixel region PA. As shown in FIGS. 19 and 20, an insulating film 102 is provided to the back face (upper face) of the semiconductor substrate 101 in the sensor substrate 100. The insulating film 102 is provided across the entire back face (upper face) of the semiconductor substrate 101.

Also, as shown in FIGS. 19 and 20, a passivation film 401, blocking film 500, flat film 501 are provided to the back face (upper face) of the semiconductor substrate 101, via the insulating film 102. Also, as shown in FIG. 19, in the pixel region PA, a color filter CF and on-chip lens OCL are provided on the flat film 501. Conversely, in the pad portion PAD, a shown in FIG. 20, a lens material film 601 is provided on the flat film 501.

While omitted from these drawings, in the sensor substrate 100, a semiconductor circuit device (unshown) is provided on the lower face side to which the wiring layer 100 is provided. Specifically, in the pixel region PA, the semiconductor circuit device (unshown) is provided so as to configure the pixel transistor Tr shown in FIG. 21. Also, in the periphery region SA, a semiconductor circuit device (unshown) is provided so as to configure a vertical driving circuit 3 and timing generator 8, for example.

As shown in FIGS. 19 and 20, the logic circuit 200 includes a semiconductor substrate 201. The semiconductor substrate 201 is made of single-crystal silicon, for example. The logic substrate 200 has the semiconductor substrate 201 facing the semiconductor substrate 101 of the sensor substrate 100. The semiconductor substrate 201 of the logic substrate 200 also functions as a supporting substrate, whereby the overall strength of the solid-state imaging device 1 is secured.

As shown in FIGS. 19 and 20, the logic substrate 200 has a wiring layer 210 and insulating film 220 provided, in sequence, on the front face (upper face) of the side of the semiconductor substrate 201 facing the sensor substrate. the wiring layer 210 and insulating film 220 are both provided across the entire front face (upper face) of the side of the semiconductor substrate 201.

While omitted from the drawings, a semiconductor circuit device (unshown) such as a MOS transistor is provided to the front face (upper face) side of the semiconductor substrate 201. The semiconductor circuit device (unshown) is provided, for example, so as to configure a column circuit 4, horizontal driving circuit 5, and external output circuit 7.

The solid-state imaging device 1, as shown in FIGS. 19 and 20, has the insulating film 120 of the sensor substrate 100 and the insulating film 220 of the logic substrate 200 joined together with a joining face SM, whereby the sensor substrate 100 and logic substrate 200 are both bonded together.

As shown in FIG. 19, the solid-state imaging device 1 is configured so that the photodiodes 21 receive the incident light H input from the back face (upper face) that is on the opposite side from the front face (lower face) side of the semiconductor substrate 101 of the sensor substrate 100 to which the wiring layer 110 is provided. That is to say, the solid-state imaging device 1 is a "back face projection type CMOS image sensor".

Detailed Configuration of Parts

Details of the parts making up the solid-state imaging device 1 will be described, in sequence.

(a) Photodiode 21

As shown in FIG. 19, photodiodes 21 are provided in the pixel region PA, corresponding to each of the multiple pixels P. The photodiodes 21 are provided to the semiconductor substrate 101, the thickness of which has been thinned to 1 to 30 μm for example, in the sensor substrate 100. The photodiodes 21 are formed so as to generate and accumulate signal load by receiving the incident light H that is incident as a subject image and performing photoelectric conversion.

Now, as shown in FIG. 19, parts such as a color filter CF, micro lens ML, and so forth are provided above the photodiodes 21 which is on the back face (upper face) of the semiconductor substrate 101. Therefore, the photodiodes 21 receive the incident light H that is incident via the parts herein, in sequence, with a light receiving face JS.

The photodiode 21 includes an n-type load accumulating region (unshown) which accumulates signal load (electrons), and the n-type load accumulating region (unshown) is provided to a p-type semiconductor region (unshown) on the semiconductor substrate 101. In the n-type load accumulating region, a p-type semiconductor region (unshown) having a high concentration of impurities is provided as a hole accumulation layer on the front face side of the semiconductor substrate 101. That is to say, the photodiodes 21 are formed in a HAD (Hole Accumulation Diode) construction.

As shown in FIG. 21, each photodiode 21 is grounded with an anode; the accumulated signal load is read out with a pixel transistor Tr, and output as an electrical signal to the vertical signal line 27.

(b) Pixel Transistor Tr

A pixel transistor Tr is provided corresponding to each of the multiple pixels P in the pixel region PA, as described above. As shown in FIG. 21, the pixel transistor Tr includes a transfer transistor 22, amplifying transistor 23, selecting transistor 24, and reset transistor 25, and for each pixel P, outputs signal load as an electrical signal from the photodiode 21.

As described above, in FIG. 19 the pixel transistor Tr is omitted from the diagram, but the pixel transistor Tr is provided on the front face (lower face) of the semiconductor substrate 101. Specifically, the transistors 22 through 25 that make up the pixel transistor Tr form an activation region (unshown) in a region separating pixels P from each other on the semiconductor substrate 101, and the gates are formed using polysilicon which includes n-type impurities.

In the pixel transistor Tr, as shown in FIG. 21, the transfer transistor 22 is configured so as to transfer the signal load generated by the photodiode 21 to the floating diffusion FD. Specifically, the transfer transistor 22 is provided between the cathode of the photodiode 21 and the floating diffusion FD. Also, the transfer transistor 22 has a transfer line 26 electrically connected to a gate. The transfer transistor 22 transfers the signal load accumulated in the photodiode 21 to the floating diffusion FD, based on the transfer signal TG transmitted from the transfer line 26 to the gate.

In the pixel transistor Tr, as shown in FIG. 21, the amplifying transistor 23 is configured so as to amplify the electrical signal converted from load to voltage in the floating diffusion FD and output this. Specifically, the amplifying transistor 23 has a gate that is electrically connected to the floating diffusion FD. Also, the amplifying transistor 23 has a drain that is electrically connected to a power source supply line Vdd, and a source that is electrically connected to the selecting transistor 24. Upon the selecting transistor 24 being selected to be in the on state, constant current is supplied from a constant current source I, and the amplifying transistor 23 operates as a source follower. Therefore, by a selection signal being supplied to the selecting transistor 24, the electrical signal converted from load to voltage at the floating diffusion FD is amplified in the amplifying transistor 23.

In the pixel transistor Tr, as shown in FIG. 21, the selecting transistor 24 is configured so as to output the electrical signal output from the amplifying transistor 23 to the vertical signal line 27, based on the selecting signal. Specifically, the selecting transistor 24 has a gate connected to an address line 28 to which the selection signal is supplied. Also, in the event that a selection signal is supplied, the selecting transistor 24 is turned on, and outputs the output signal amplified by the amplifying transistor 23 to the vertical signal line 27.

In the pixel transistor Tr, as shown in FIG. 21, the reset transistor 25 is configured so as to reset the gate potential of the amplifying transistor 23. Specifically, the reset transistor 25 has a gate that is electrically connected to the reset line 29 to which a reset signal is supplied. Also, the reset transistor 25 has a drain that is electrically connected to the power source supply line Vdd and a source that is electrically connected to the floating diffusion FD. The reset transistor 25 resets the gate potential of the amplifying transistor 23 to the power source voltage, based on the reset signal transmitted from the reset line 29, via the floating diffusion FD.

The gates of the transistors 22, 24, and 25 are connected in row increments made up of multiple pixels P that are arrayed in the horizontal direction x, and the multiple pixels arrayed in the row increments thereof are driven simultaneously. Specifically, the pixels are selected in sequence in the vertical direction in increments of a horizontal line (pixel row), by the selection signal supplied by the above-described vertical driving circuit (unshown). The transistors of the pixels P are controlled by the various types of timing signals output from a timing generator (unshown). Thus, the output signals in the pixels P are read out to a column circuit (unshown) for each column of pixels P through the vertical signal line 27. The signal held in the column circuit is then selected by the horizontal driving circuit (unshown), and output in sequence to the external output circuit (unshown).

(c) Wiring Layer 110 and Insulating Film 120 of Sensor Substrate 100

On the sensor substrate 100, as shown in FIGS. 19 and 20, the wiring layer 110 is provided on the front face (lower face) of the semiconductor substrate 101 which is on the opposite side from the back face (upper face) thereof on which parts such as the color filter CF, micro lens ML, and so forth have been provided. That is to say, on the sensor substrate 100, the wiring layer 110 is provided on the face of the side of the semiconductor substrate 101 facing the logic substrate (the lower face).

The wiring layer 110 includes a wiring 110H and insulating film 1102, as shown in FIG. 19, and the wiring 110H is provided within the insulating film 1102. The wiring layer 110 is a so-called multi-layer wiring layer, and is formed by an inter-layer insulating film making up the insulating film 1102, and a wiring 110H, alternately layered multiple times.

The insulating film 1102 is formed using insulating materials. Also, the wiring 110H is formed using a conductive metallic material. The wiring layer 110 is formed by multiple layers of the wiring 110H, so as to function as the transfer line 26, address line 28, vertical signal line 27, reset line 29, and so forth shown in FIG. 21. As shown in FIGS. 19 and 20, the insulating film 120 is provided on the front face (lower face) which is on the opposite side of the wiring layer 110 from the semiconductor substrate 101 side.

(d) Wiring Layer 210 and Insulating Film 220 of Logic Substrate 200

On the logic substrate 200, as shown in FIGS. 19 and 20, the wiring layer 210 is provided on the face of the side of the semiconductor substrate 201 facing the sensor substrate 100 (the upper face). The wiring layer 210 includes a wiring 210H and insulating film 210Z, as shown in FIG. 19, and the wiring 210H is provided within the insulating film 210Z. The wiring layer 210 is a so-called multi-layer wiring layer, and is formed by an inter-layer insulating film making up the insulating film 210Z, and a wiring 210H, alternately layered multiple times.

The insulating film 210Z is formed using insulating materials. Also, the wiring 210H is formed using a conductive metallic material. The wiring layer 210 is formed by multiple layers of the wiring 210H so as to function as the wiring that is electrically connected to the semiconductor circuit device (unshown) which is provided on the semiconductor substrate 201 of the logic substrate 200. As shown in FIGS. 19 and 20, the insulating film 220 is provided on the front face (upper face) which is on the opposite side of the wiring layer 210 from the semiconductor substrate 201 side.

(e) Pad Portion PAD

The pad portion PAD is provided to the periphery region SA, as shown in FIG. 18. As shown in FIG. 20, pad wirings 110P and 210P, and a connecting conductive layer 301 are provided to the pad portion PAD. The parts provided to the pad portion PAD will be described in sequence.

(e-1) Pad Wiring 110P and 210P

As shown in FIG. 20, a pad wiring 110P is provided to the sensor substrate 100 in the pad portion PAD. Also, a pad wiring 210P is provided to the logic substrate 200 in the pad portion PAD.

The pad wiring 110P provided to the sensor substrate 110 is formed within the wiring layer 110, as shown in FIG. 20, similar to the other wiring 110H. Also, the pad wiring 110P of the sensor substrate 100 is provided further above the pad wiring 210P provided to the logic substrate 200, on the layered body of sensor substrate 100 and logic substrate 200. The pad wiring 110P of the sensor substrate 100 is electrically connected to the other wiring 110H, and electrically connects between the semiconductor circuit device (unshown) provided to the sensor substrate 100 and a device (unshown) provided outside thereof.

The pad wiring 210P provided to the logic substrate 200 is provided within the insulating film 201Z, similar to the other wiring 210H making up the wiring layer 210. The pad wiring 210P of the logic substrate 200 is electrically connected to the other wiring 210H, and electrically connects between the semiconductor circuit device (unshown) provided to the logic substrate 200 and a device (unshown) provided outside thereof. Also, as shown in FIG. 20, the pad wiring 110P of the sensor substrate 100 and the pad wiring 210P of the logic substrate 200 are electrically connected with a connecting conductive layer 301.

(e-2) Connecting Conductive Layer 301

As shown in FIG. 20, a connecting conductive layer 301 is provided to the pad portion PAD. The connecting conductive layer 301 is provided on the upper face side of the layered body wherein the sensor substrate 100 and logic substrate 200 have been bonded together.

The connecting conductive layer 301 is formed with a conductive metallic material, and electrically connects the pad wiring 110P of the sensor substrate 100 and the pad wiring 210P of the logic substrate 200. The connecting conductive layer 301 is provided by sequentially layering a barrier metal layer such as tantalum (Ta) and a copper-plate layer formed by plating with copper (Cu), for example.

Now, the connecting conductive layer 301 includes a first plug 311, second plug 321, and connective wiring 331, as shown in FIG. 20. In the connecting conductive layer 301, as shown in FIG. 20, the first plug 311 is formed within a pad opening V1 which is provided above the pad wiring 110P of the sensor substrate 100. Also, as shown in FIG. 20, the second plug 321 is formed within a pad opening V2 which is provided above the pad wiring 210P of the logic substrate 200.

Specifically, each pad opening V1 and V2 are provided so as to pass through from the upper side of the respective pad wiring 110P and 210P to the upper face of the insulating film 102. The pad openings V1 and V2 are formed so as to pass through the semiconductor substrate 101 which is included in the sensor substrate 100. That is to say, each of the first plug 311 and second plug 321 are a TSV. Also, while omitted from the diagram, the pad openings V1 and V2 are formed so that the upper face becomes a circular shape, for example.

The pad openings V1 and V2 include upper-side opening portions V11 and V21 and lower-side opening portions V12 and V22. Each of the upper-side opening portions V11 and V21 and lower-side opening portions V12 and V22 are provided to the pad openings V1 and V2, respectively, so as to be layered in the depth direction z.

Of the multiple pad openings V1 and V2, the pad opening V1 provided above the pad wiring 110P on the sensor substrate 110 is provided so that the upper-side opening portion V11 passes through from the upper portion of the wiring layer 110 on the sensor substrate 100 to the upper face of the insulating film 102.

The lower-side opening portion V12 is provided so that the upper face of the pad wiring 110P is exposed in the pad opening V1. The side face of the upper-side opening portion V11 of the pad opening V1 herein is covered with an insulating film 102, and the first plug 311 is provided so as to embed within the upper-side opening portion V11 and lower-side opening portion V12, via the insulating film 102 thereof.

Of the multiple pad openings V1 and V2, the pad opening V2 provided above the pad wiring 210P on the logic substrate 200 is provided so that the upper-side opening portion V21 passes through from the upper portion of the wiring layer 210 on the logic substrate 200 to the upper side of the insulating film 102. The upper-side opening portion V21 is formed in the same flat shape, except in the point of being provided so as to be deeper than the upper-side opening portion V11 of the other pad opening V1. That is to say, the width H21 of the upper-side opening portion V21 is formed to be the same as the width H11 of the upper-side opening portion V11.

The lower-side opening portion V22 is provided so that the upper face of the pad wiring 210P is exposed in the pad opening V2. The lower-side opening portion V22 is formed in the same flat shape, except in the point of being provided so as to be deeper than the lower-side opening portion V22 of the other pad opening V2. That is to say, the width H22 of the lower-side opening portion V22 is formed to be the same as the width H12 of the upper-side opening portion V12.

The side face of the upper-side opening portion V21 of the pad opening V2 herein is covered with an insulating film 102, and the second plug 321 is provided so as to embed within the upper-side opening portion V21 and lower-side opening portion V22, via the insulating film 102 thereof.

In the connecting conductive layer 301, as shown in FIG. 20, the connective wiring 331 is provided to the upper face side on the opposite side from the lower face that faces the logic substrate 200 of the sensor substrate 100. As shown in FIG. 20, a trench TR is provided to the insulating film 102 that covers the upper face of the semiconductor substrate 101 that is included in the sensor substrate 100. The trench TR is provided above the multiple pad openings V1 and V2, and the connective wiring 331 is formed so as to embed within the trench TR herein.

Now, the connective wiring 331 is provided to the upper portion of the first plug 311 and second plug 321 so as to link between the first plug 311 and second plug 321. The connective wiring 331 is formed so as to be integrated with the first plug 311 and second plug 321, and electrically connects the pad wirings 110P and 210P, via the first plug 311 and second plug 321. That is to say, the connective wiring 331 is a rewiring layer (RDL (Re-Distribution Layer)). Details will be described later, but as shown in FIG. 20, there are cases wherein the connective wiring 331 has a concave portion 331C in the upper face thereof.

(f) Passivation Film 401

As shown in FIGS. 19 and 20, a passivation film 401 is provided on the back face (upper face) side of the semiconductor substrate 101 which is opposite from the front face (lower face) on which the wiring layer 110 is provided, via an insulating film 102. Now, the passivation film 401 is provided on the upper face side of the layered body wherein the sensor substrate 100 and logic substrate 200 have been bonded together, so as to cover the connecting conductive layer 301.

The passivation film 401 includes a first passivation film 411 and second passivation film 412. The first passivation film 411 and second passivation film 412 each are sequentially layered on the back face (upper face) of the semiconductor substrate 101.

As shown in FIG. 20, with in the pad portion PAD, the first passivation film is provided so as to cover the inner face of the concave portion 331C that is formed on the upper face of the connective wiring 331. The first passivation film 411 is a SiN film, for example, and protects metal making up the connective wiring 331 from dispersing outside. The second passivation film 412 is provided in the upper face of the connective wiring 331 so as to be embedded within the concave portion 331C.

(g) Blocking Film 500, Flat Film 501

A blocking film 500 is provided to the upper face of the passivation film 401, as shown in FIG. 19. Now, the blocking film 500 is provided on the back face (upper face) of the semiconductor substrate 101 so as to be located between the pixels P. That is to say, the blocking film 500 has an opening provided in the light receiving face JS of the photodiode 21, and is formed such that the flat face shape is in a grid form. As shown in FIGS. 19 and 20, the flat film 501 is provided so as to cover the upper face of the passivation film 401 on which the blocking film 500 is formed.

Color Filter CF

A color filter CF is provided to the back face (upper face) side of the semiconductor substrate 101 in the pixel region PA, as shown in FIG. 19. Now, the insulating film 102, passivation film 401, and flat film 501 are provided to the back face (upper face) side of the semiconductor substrate 101, as shown in FIG. 19, and the color filter CF is formed on the upper side of the flat film 501 thereof.

The color filter CF is formed so that the incident light H input from the back face (upper face) side of the semiconductor substrate 101 via the on-chip lens OCL is colored in being transmitted. For example, the color filter CF is formed so that light of a predetermined wavelength region, out of the visible light incident as incident light H, is selectively transmitted.

The color filter CF includes a red filter layer (unshown), green filter layer (unshown), and blue filter layer (unshown), for example, and each of the three primary color filter layers thereof are disposed to as to correspond to the pixels P in a Bayer array.

(i) On-Chip Lens OCL, Lens Material Film 601

An on-chip lens OCL is provided in the pixel region PA so as to correspond to each of the multiple pixels P, as shown in FIG. 19. The on-chip lens OCL is provided on the upper face of the color filter CF on the back face (upper face) side of the semiconductor substrate 101.

The on-chip lens OCL is a convex lens that protrudes upward in a convex manner from the back face (upper face) side of the semiconductor substrate 101, and collects the incident light H input from the back face (upper face) side of the semiconductor substrate 101, to the photodiode 21.

While details will be described later, the on-chip lens OCL if formed by processing a lens material layer 601 (see FIG. 20) which is formed on the upper face of the flat film 501 via the color filter CF. The lens material layer 601 is provided so as to cover the upper face of the flat film 501 in the periphery region SA which includes a pad portion 601, without being processed by the on-chip lens OCL, as shown in FIG. 20.

Manufacturing Method

The principal portions regarding a manufacturing method to manufacture the above-described solid-state imaging device 1 will be described. FIGS. 22 through 31 and diagrams illustrate principal portions regarding a manufacturing method of the solid-state imaging device according to a sixth embodiment. FIG. 22 is a manufacturing flow diagram. FIGS. 23 through 31 are diagrams illustrating a cross-section of the pad portion PAD, similar to FIG. 20. A cross-section similar to FIG. 19 is omitted in the diagrams, but the portions are formed, similar to FIGS. 23 through 31. According to the present embodiment, the steps shown in FIG. 22 are performed, as shown in FIGS. 23 through 31. Subsequently, the solid-state imaging device 1 is manufactured by dicing, using a blade (unshown) in a scribe region LA.

Manufacturing processes in the event of manufacturing the solid-state imaging device 1 will be described in sequence.

Formation of Sensor Substrate 100

First, the sensor substrate 100 is formed (ST10), as shown in FIG. 22. Now, as shown in FIG. 23, the sensor substrate 100 is formed by providing parts such as the wiring layer 110, insulating film 120, and the like on the front face (upper face) of the semiconductor substrate 101. In the present step, the parts such as the insulating film 102 or the like are not formed on the back face (upper face in FIG. 23, lower face in FIGS. 19 and 20) side of the semiconductor substrate 101 that is included in the sensor substrate 100.

In the present step, prior to the process shown in FIG. 23, a photodiode 21 is provided to the pixel region PA of the semiconductor substrate 101 (see FIG. 19). Also, a semiconductor circuit device (unshown) such as a pixel transistor Tr (see FIG. 21) or the like is provided to the front face (upper face in FIG. 23) side of the semiconductor substrate 101.

The wiring layer 110 is then provided so as to cover the entire front face (upper face) of the semiconductor substrate 101, as shown in FIG. 23. That is to say, a wiring layer 110 is formed on the face of the semiconductor substrate 101 that faces the logic substrate 200.

Specifically, the wiring layer 110 is provided by alternately forming an inter-layer insulating film which makes up the insulating film 1102 and a wiring 110H which includes the pad wiring 110P (see FIG. 19). For example, the wiring 110H (see FIG. 19) such as the pad wiring 110P is formed using metallic material such as aluminum. Also, the insulating film 1102 (see FIG. 19) is formed using a silicon oxide material. That is to say, the pad wiring 110P is provided within the wiring layer 110.

Also, an insulating film 120 is provided so as to cover the entire front face (upper face in FIG. 23, lower face in FIGS. 19 and 20) of the semiconductor substrate 101. For example, a silicon oxide film is provided as the insulating film 120. Alternatively, a silicon nitride film may be provided as the insulating film 120.

Formation of Logic Substrate 200

Next, the logic substrate 200 is formed (ST20), as shown in FIG. 22. Now, as shown in FIG. 24, the logic substrate 200 is provided by sequentially forming the wiring layer 210 and insulating film 220 on the front face (upper face) of the semiconductor substrate 201. In the present step, prior to the process shown in FIG. 24, a semiconductor circuit device (unshown) is provided to the front face side of the semiconductor substrate 201.

The wiring layer 110 is then provided so as to cover the entire front face (upper face) of the semiconductor substrate 201, as shown in FIG. 24. That is to say, a wiring layer 210 is formed on the face of the semiconductor substrate 201 that faces the sensor substrate 100.

Specifically, the wiring layer 210 is provided by alternately layering an inter-layer insulating film which makes up the insulating film 210Z and a wiring 210H which includes the pad wiring 210P (see FIG. 19), multiple times. For example, the wiring 210H (see FIG. 19) such as the pad wiring 110P is formed using metallic material such as aluminum. That is to say, the pad wiring 210P is provided within the wiring layer 210. Also, the insulating film 210Z (see FIG. 19) is formed using a silicon oxide material.

Also, an insulating film 220 is provided so as to cover the entire front face (upper face) of the wiring layer 210 thereof. For example, a silicon oxide film is provided as the insulating film 220. Alternatively, a silicon nitride film may be provided as the insulating film 220.

Bonding Together of Sensor Substrate 100 and Logic Substrate 200

Next, as shown in FIG. 22, the sensor substrate 100 and logic substrate 200 are bonded together (ST30). Now, as shown in FIG. 25, the wiring layer 110 of the sensor substrate 100 and the wiring layer 210 of the logic substrate 200 face each other. By joining together the wiring layer 110 of the sensor substrate 100 and the wiring layer 210 of the logic substrate 200, the two are bonded together. For example, the bonding herein is performed with plasma joining.

Thinning of Sensor Substrate 100

Next, as shown in FIG. 22, the sensor substrate 100 is thinned (ST40). Now, as shown in FIG. 26, for example by performing thinning processing of the face (upper face) of the semiconductor substrate 101, which is included in the sensor substrate 100, that is on the opposite side as to the face (lower face) that faces the logic substrate 200, the sensor substrate 100 is thinned. For example, CMP (Chemical Mechanical Polishing) processing is performed as a thinning processing.
Formation of Trench TR, Pad Openings V1 and V2

Next, as shown in FIG. 22, the trench TR and pad openings V1 and V2 are formed (ST 50). Now, as shown in FIG. 27, a trench TR is provided to the insulating film 102 that covers the upper face of the semiconductor substrate 101 which is included in the sensor substrate 100.

As shown in FIG. 27, the pad opening V1 is provided above the pad wiring 110P of the sensor substrate 100. Also, the pad opening V2 is provided above the pad wiring 210P of the logic substrate 200. The pad openings V1 and V2 are provided so as to pass through from the upper face of the pad wirings 110P and 210P to the upper face of the insulating film 102. That is to say, the pad openings V1 and V2 are formed so as to pass through the semiconductor substrate 101 which is included in the sensor substrate 100.

According to the present embodiment, for the respective pad openings V1 and V2, the upper side opening portions V11 and V21 and the lower-side opening portions V12 and V22 are provided so as to be layered in the depth direction z. Also, the insulating film 102 is provided so as to cover the inner face of the upper-side opening portions V11 and V21.

Specifically, according to the present process, first, as shown in FIG. 27, as a layer that makes up the insulating film 102, a silicon oxide film, for example, is provided to the back face (upper face) of the semiconductor substrate 101 which is included in the sensor substrate 100. Also, by processing the silicon oxide film thereof, the trench TR is provided.

Also, by processing the floor face of the trench TR, the upper-side opening portions V11 and V21, which are included in the pad openings V1 and V2, are provided. Now, the upper-side opening portion V11 that is included in the pad opening V1 is formed by removing portions that are positioned above the position wherein the upper face of the pad wiring 110P of the sensor substrate 100 is not exposed. That is to say, the upper-side opening portion V11 is provided by opening up until just prior to the pad wiring 110P provided on the sensor substrate 100. Conversely, the upper-side opening portion V21 that is included in the pad opening V2 is formed by removing portions that are positioned above the position wherein the upper face of the pad wiring 210P of the logic substrate 200 is not exposed. That is to say, the upper-side opening portion V21 is provided by opening up until just prior to the pad wiring 210P provided on the logic substrate 200.

Also, as a layer that makes up the insulating film 102, a silicon oxide film is provided so as to cover the inner faces of the upper-side opening portions V11 and V21. Also, the lower-side opening portions V12 and V22 are provided by processing the floor portions of the upper-side opening portions V11 and V21.

Now, the lower-side opening portion V12 is provided so that the upper face of the pad wiring 110P of the sensor substrate 100 is exposed. That is to say, the lower-side opening portion V12 is formed so that the upper face of the pad wiring 110P is exposed in the wiring layer 110 of the sensor substrate 100, and the upper portion thereof passes through. Also, the lower-side opening portion V22 is provided so that the upper face of the pad wiring 210P of the logic substrate 200 is exposed. That is to say, in the layered body of the sensor substrate 100 and logic substrate 200, the lower-side opening portion V22 is formed so that the upper side of the pad wiring 210 of the logic substrate 200 is exposed and the upper portion thereof passes through. For example, an etch-back processing is performed so as to simultaneously remove the portions provided above the pad wirings 110P and 210P, thereby forming each of the lower-side opening portions V12 and V22.

For example, the portions are formed so as to follow the conditions described below.

(For the trench *TR*)·depth *DT* . . . 100 nm~1 µm·length *L* . . . 10 µm or more·width *W* . . . 2 µm or more (For the pad opening portion *V*1)·depth *D*1 . . . 3~7 µm (Distance from the floor face of the trench *TR* to the upper face of the pad wiring 110*P*)·width *H*11 of upper opening portion *V*11 . . . 1.5~5.5 µm·width *H*12 of lower opening portion *V*12 . . . 1~5 µm (For the pad opening portion *V*2)·depth *D*2 . . . 5~15 µm (Distance from the floor face of the trench *TR* to the upper face of the pad wiring 210*P*)·width *H*11 of upper opening portion *V*21 . . . 1.5~5.5 µm·width *H*12 of lower opening portion *V*22 . . . 1~5 µm Note that in the above description, the pad openings V1 and V2 are formed after the trench TR is formed, but conversely, the trench TR may be formed after the formation of the pad openings V1 and V2 have been performed first.
Connection Between Sensor Substrate 100 and Logic Substrate 200

Next, as shown in FIG. 22, the sensor substrate 100 and logic substrate 200 are connected (ST 60). In the event of connecting the sensor substrate 100 and logic substrate 200, the processes shown in FIGS. 28 through 31 are performed in sequence. Thus, a connecting conductive layer 301 is provided to the pad portion PAD, and the pad wiring 110P of the sensor substrate 100 and the pad wiring 210P of the logic substrate 200 are electrically connected.

In the present step, a metal layer 301M is formed, as shown in FIG. 28. Now, the metal layer 301M is formed by embedding a metallic material into the trench TR and the pad openings V1 and V2 via a barrier metal layer (unshown), and covering the upper face of the insulation layer 102.

While omitted from the diagram, the barrier metal layer (unshown) is provided so as to cover the side faces of the upper-side opening portions V11 and V21 via the insulating film 102, and to cover the side faces and floor faces of the lower-side opening portions V12 and V22. Also, a barrier metal layer (unshown) is provided so as to cover the side face and floor face of the trench TR. For example, the barrier metal layer (unshown) is formed under the following conditions.
Conditions for Forming Barrier Metal Layer
    Material: Ta, or layered body of Ta and TaN
    Thickness: Approximately 10 to 200 nm
    Film Forming Method: Sputtering Also, the metal layer 301M is provided so as to be embedded within the upper-side opening portions V11 and V21 and the lower-side opening portions V12 and V22, via the barrier metal layer (unshown). Also, the metal layer 301M is provided so as to cover the side face and floor face of the trench TR, via the barrier metal layer (unshown). For example, the metal layer 301M is formed under the following conditions.
Conditions for Forming Metal Layer 301M
    Material: Cu
    Thickness DT0 from trench TR floor face: 1 to 5 µm
    Film Forming Method: Electroplating The electroplating herein is performed with a two-step deposition method, for example. Specifically, in the first step, current is set to 0.1 to 5 A (amperes), and a Cu film is formed at a thickness of approximately 50 to 200 nm. Next, in the second step, current is set to 1 to 8 A, for example, and a Cu film is formed at a thickness of approximately 800 nm to 5 μm. At this time, the number of wafer rotations and additives are adjusted as appropriate.

That is to say, the metal layer 301M is formed with copper plating so as to cover the portions forming the first plug 311, second plug 321, and connective wiring 331 (see FIG. 20).

At this time, as shown in FIG. 28, the metal layer 301M is formed so as to include a pit PIT which is a minute space. For example, multiple spaces having the size of 1 to 20 nm are formed as pits PIT.

The pit PIT is formed within the metal layer 301M when oxygen ($O_2$) bubbles occur on the anode side of a plated device, and attach to and are fixed to the plated surface. Particularly, in the case that the anode is positioned lower than the wafer forming the metal layer 301M, bubbles that occur with the anode electrode move upward, and accordingly there are cases wherein a large number of pits PIT may be encapsulated. Additionally, from bubbles occurring when the plating liquid is stirred in a plating tank, or when a wafer is placed in the plating liquid, there are cases that the pit PIT forms on the inner portion of the metal layer 301M.

Subsequently, by performing heat processing, crystal growth on the Cu that makes up the metal layer 301M is enabled, and reliability of the wiring is improved. For example, heat processing is performed on the metal layer 301M under the following conditions.

Heat Processing Conditions
    heat processing temperature: 100° C. to 400° C.
    heat processing time: 30 seconds to 3 minutes (in the case of a hot plate) or 15 minutes to 2 hours (in the case of annealing furnace)

Figure 29:
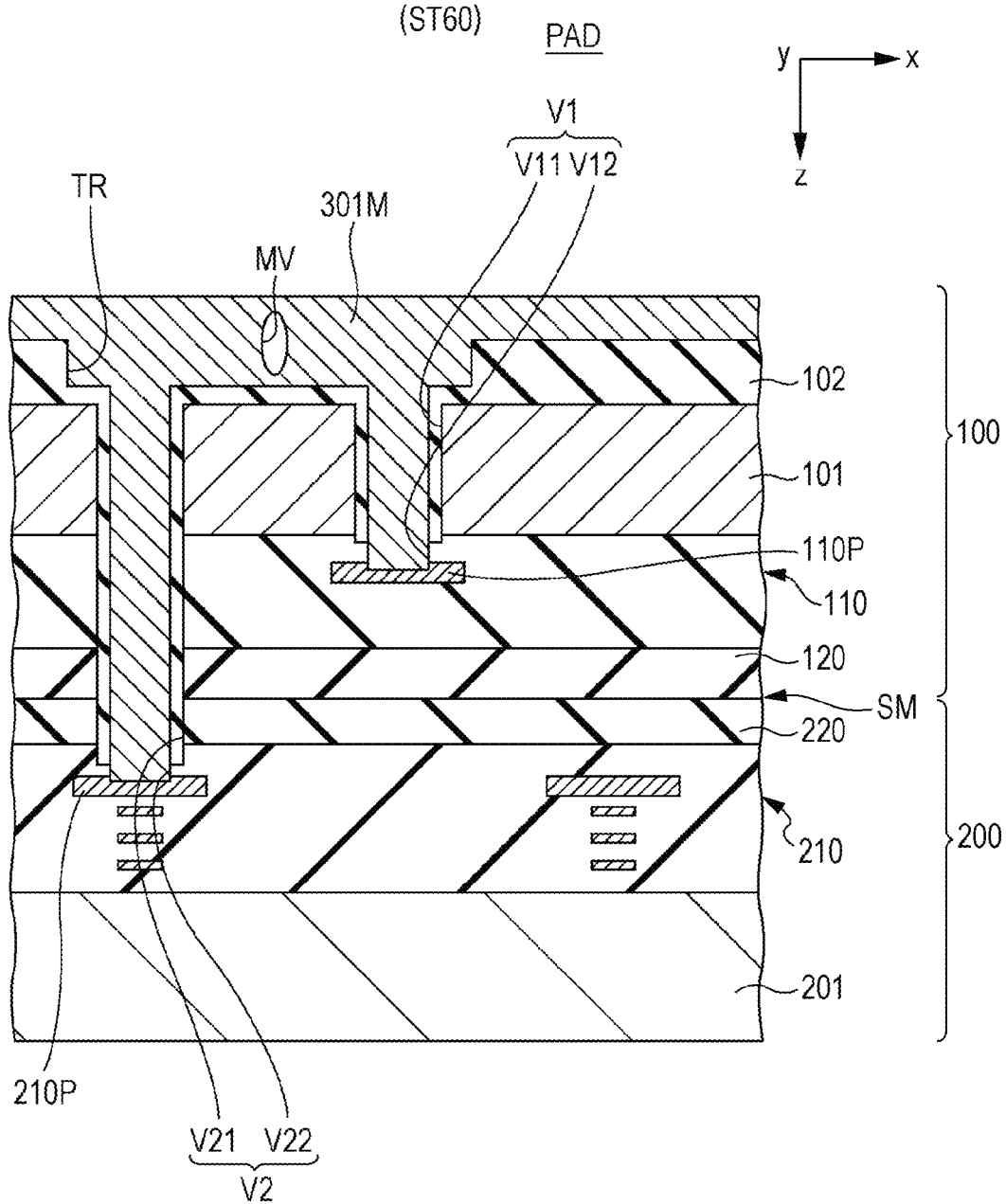
FIG. 29 is a diagram illustrating the principal portions regarding a manufacturing method of the solid-state imaging device according to the sixth embodiment.

From the heat processing herein, as shown in FIG. 29, pits PIT (see FIG. 28) are collected on the metal layer 301M, and a void MV which is a space greater than the pits PIT is formed. For example, a space that is 140 to 500 nm vertically and 100 to 250 nm horizontally is formed as a void MV.

Figure 30:
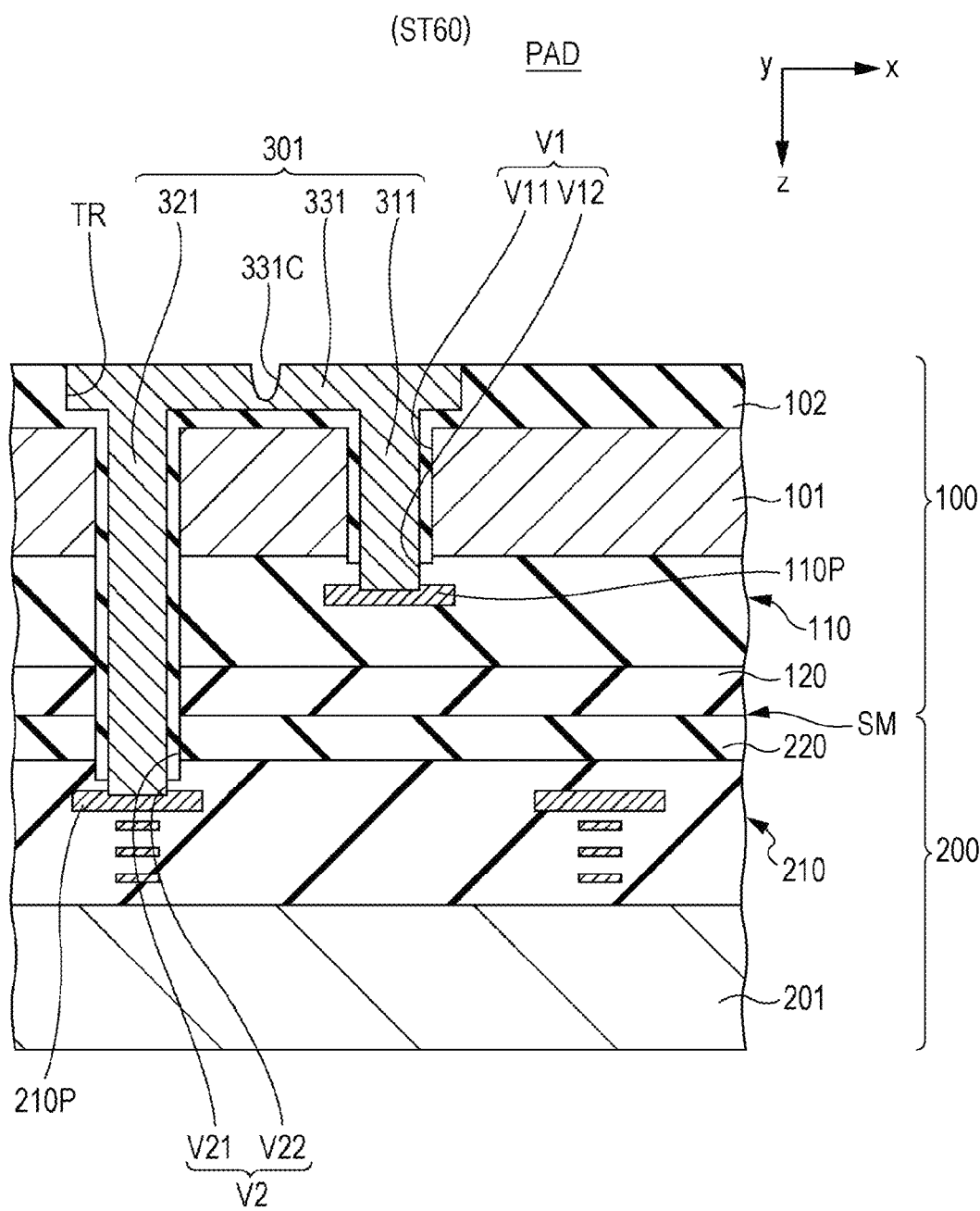
FIG. 30 is a diagram illustrating the principal portions regarding a manufacturing method of the solid-state imaging device according to the sixth embodiment.

As shown in FIG. 30, by removing the upper face of the metal layer 301M, the connecting conductive layer 301 is formed. Now, thinning processing of the metal layer 301M, such as CMP processing, is performed, and the upper face of the insulating film 102 is processed so as to be exposed, whereby the connecting conductive layer 301 is formed.

Thus, as shown in FIG. 30, the connecting conductive layer 301 is formed so as to include the first plug 311, second plug 321, and connective wiring 331. In the connecting conductive layer 301, the inner portion of the void MV is exposed on the upper face of the connective wiring 331, and a concave portion 331C is formed on the upper face thereof. For example, a concave portion 331C that is 70 to 200 nm vertically and 100 to 250 nm horizontally is provided to the upper face of the connective wiring 331.

Formation of Passivation Film 401

Figure 31:
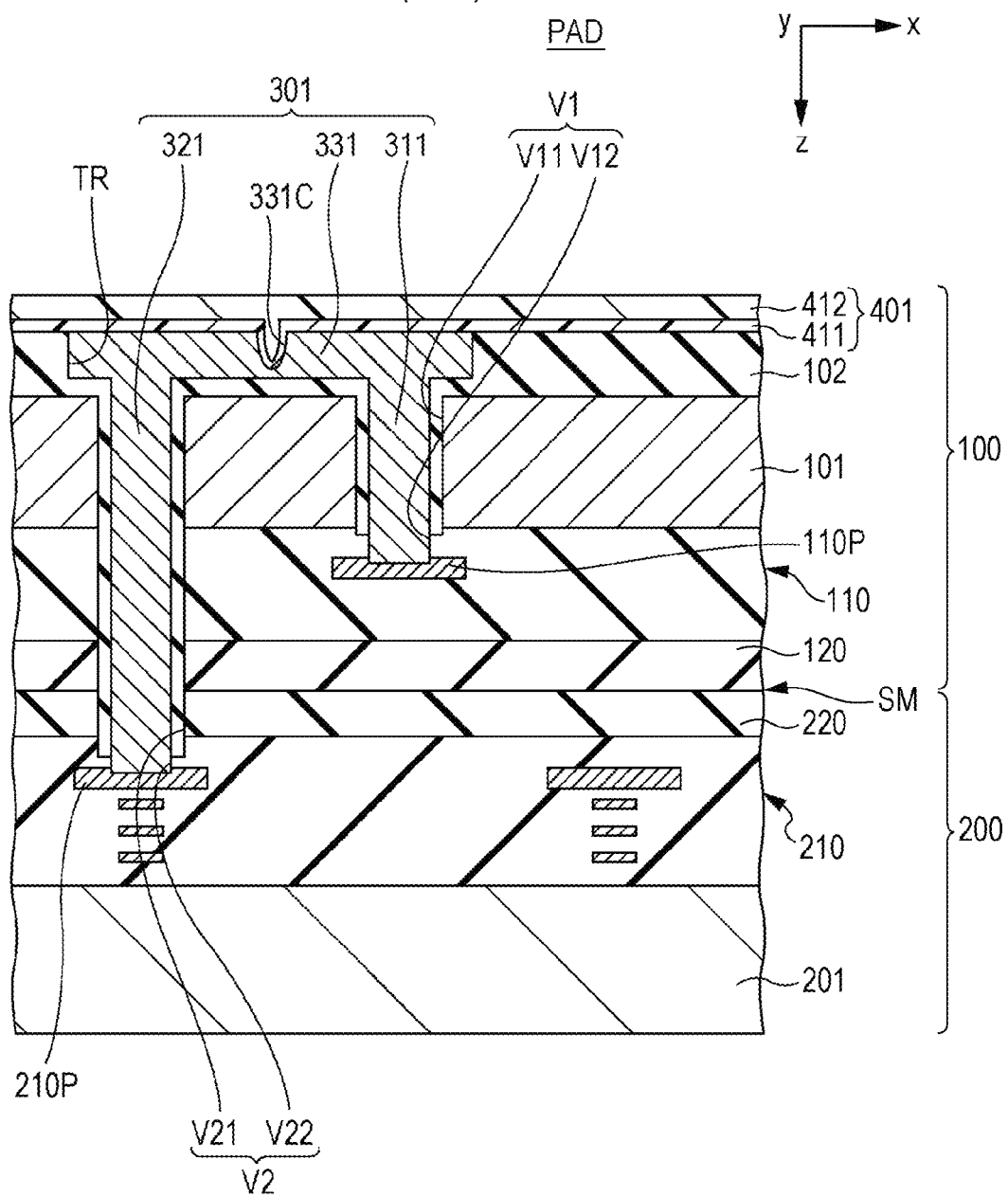
FIG. 31 is a diagram illustrating the principal portions regarding a manufacturing method of the solid-state imaging device according to the sixth embodiment.

Next, as shown in FIG. 22, a passivation film 401 is formed (ST 70). Now, as shown in FIG. 31, the passivation film 401 is formed on the upper face of the insulating film 102 so as to cover the upper face of the connective wiring 331. In the present step, first, a first passivation film 411 that is included in the passivation film 401 is formed.

The first passivation film 411 is formed so as to cover the inner face of the concave portion 331C provided on the upper face of the connective wiring 331 and the upper face of the insulating film 102. For example, the first passivation film 411 is formed under the following conditions.

Formation Conditions of First Passivation Film 411
    Material: SiN
    Film Thickness: 50 to 100 nm
    Film Forming Method: Parallel plate type plasma CVD (Chemical Vapor Deposition) method
    Condition Details
        Gas flow rate: $SiH_4:NH_3:N_2=1:1:20$
        High frequency power: 300 to 1,000 W
        Pressure: 0.5 to 7.0 Torr
        Temperature: 250 to 400° C.
        Time: 30 seconds to 1 minute
        Film Thickness: 50 to 100 nm Next, the second passivation film 412 is formed. The second passivation film 412 is provided to as to be embedded in the inner portion of the concave portion 331C on the upper face of the connective wiring 331. For example, a second passivation film 412 made of $SiO_2$ is formed under the following conditions.

Formation Conditions of First Passivation Film 411
    Film Forming Method: High density plasma (HDP) CVD method
    Film Thickness: 100 to 150 nm
    Condition Details
        Gas flow rate: $SiH_4:O_2=1:1.5$
        Source bias: 5,000 to 8,000 W
        Substrate Bias: 5,000 to 8,000 W
        Pressure: 7 to 11 Torr
        Temperature: 300 to 350° C.
        Time: 1 minute Note that the "high density plasma CVD method" is a method to form a film by depositing films by chemical vapor deposition using the gas made into high density plasma, and indicates converting gas into high density plasma that is of a plasma density of 1017 m-3 or greater.

Formation of Flat Film 501 and the Like

Next, as shown in FIG. 22, the flat film 501, color filter CF, and on-chip lens OCL are formed in sequence (ST 80). Now, as shown in FIG. 19, a blocking film 500 is provided to the upper face of the passivation film 401. For example, the blocking film 500 is formed with a blocking material under the following film-forming conditions. Subsequently, the blocking material film is formed by patterning under the following etching processing conditions.

Film Forming Conditions
    Materials: metallic material such as W (tungsten), Cu (copper), Al (aluminum) (may be layered with Ti)
    Film Thickness: approximately 50 to 500 nm
    Film forming Method: Sputtering or the like Etching Processing Conditions
    Etching Gas: SF6:C12=1:2
    Pressure: 5 to 20 m Torr
    Source Bias: 100 to 1,000 W
    Substrate Bias: 10 to 200 W
    Temperature: room temperature
    Time: 30 to 120 seconds Note that for the etching gas, besides the above described, an etching gas such as nitrates, acetic acids, hydrochloric acids, sulfuric acids, or the like. Also, besides a dry etching processing, a wet etching processing may be performed.

As shown in FIGS. 19 and 20, the flat film 501 is formed on the upper face of the passivation film 401. As shown in FIG. 19, a color filter CF is formed on the upper face of the flat film 501 in the pixel region PA. The color filter CF is formed by forming a coated film by coating with a coating liquid that includes a color pigment and photo resist resin, with a coating method such as spin coating. Subsequently, the coated film thereof is formed by patterning with a lithograph technique.

Thus, each of three primary color filter layers are sequentially formed, thereby providing a color filter CF.

As shown in FIG. 19, the on-chip lens OCL is formed on the upper face of the color filter in the pixel region PA. The on-chip lens OCL is formed by processing a lens material layer 601 that is formed on the upper face of the flag film 501 via a color filter CF (see FIG. 20).

For example, the lens material layer 601 is provided by forming an organic resin material film on the upper face of the flat film 501. Upon providing the photoresist film (unshown) on the lens material layer 601, the photoresist film (unshown) is patterned in a lens shape. The lens material layer 601 is this subjected to etch-back processing, using the lens shape resist pattern (unshown) as a mask. Thus, the on-chip lens OCL is formed. Note that besides that described above, an on-chip OCL may be formed by subjecting the lens material layer 104 to reflow processing after the patterning process.

As shown in FIG. 20, the lens material layer 601 is provided so as to cover the upper face of the flat film 501 in the periphery region SA which includes the pad portion 601, without being processed into an on-chip lens OCL. Thus, following each step, the solid-state imaging device is completed.

Conclusion

As described above, according to the present embodiment, the sensor substrate 100 on which a pad wiring 110P is provided is formed. Next, a logic substrate 200 on which a pad wiring 210P is provided is formed. Next, the sensor substrate 100 is caused to face the upper face of the logic substrate 200, so as to be layered, and bonded together. Next, on the layered bode of the sensor substrate 100 and logic substrate 200, a pad opening V1 is formed on the upper face of the pad wiring 110P, while a pad opening V2 is formed on the upper face of the pad wiring 210P. Next, a metallic material is embedded in the inner portion of the pad opening V1 and pad opening V2, and the first plug 311 and second plug 321 are provided, while a connective wiring 331 that connects the first plug 311 and second plug 321 is provided, thereby forming a connecting conductive layer 301. Next, a passivation film 401 is formed on the connecting conductive layer 301 so as to cover the upper face of the connective wiring 331.

In the case herein, there are cases wherein a concave portion 331C is provided on the upper face of the connective wiring 331 provided to the pad portion PAD (see FIG. 30). Therefore, there are cases wherein a reactant such as a processed gas or chemical solution, used in the processes performed after the connective wiring 331 has been formed, and the connecting conductive layer 301 react, and a portion of the concave portion 331C is eliminated, or cases wherein generation of abnormal crystals occurs. Consequently, there are cases wherein product yield and device reliability deteriorate.

In order to prevent the occurrence of such defects, a passivation film 401 covers the upper face of the connecting conductive layer 301. However, unlike the case of the present embodiment, for example in the case that the second passivation film 412 of a $SiO_2$ film is formed under the conditions of a comparison example described below, there are cases wherein sufficiently preventing the above-described defects is difficult.

Formation Conditions of Second Passivation Film 412
(Comparison Example)
    Film Forming Method: parallel plate type plasma CVD method
    Detailed Conditions
    Film Thickness: 100 to 150 nm
    Detailed Conditions
        Gas flow rate: $SiH_4:N_2O=1:20$
        High frequency power: 100 to 700 W
        Pressure: 0.5 to 5 Torr
        Temperature 300 to 400° C.
        Time: 1 minute In the case of the parallel plate type plasma CVD method, stepped coverage is poor, and the coverage rate is insufficient, which is ascribed to difficulties in appropriately filling in the inner portion of the concave portion 331C having a high aspect ratio. Therefore, there are cases wherein a space (slit) is provided to a portion corresponding to the concave portion 331C in the second passivation film 412.

Also, in the case of the above-described comparison example, when performing "cleaning processing" under the following conditions, the second passivation film 412 is removed in the space (slit) portion thereof, in which case the width of the space thereof is widened. Specifically, in the cleaning processing, it has been confirmed that one side is widened by approximately 1 to 10 nm. For example, the cleaning processing is performed after the second passivation film 412 is formed and prior to the formation of the blocking film 500, and the width of the spacing thereof is widened. Additionally, there are cases wherein the cleaning processing performed after the formation of the second passivation film 412 and before another rewiring is formed on the second passivation film 412, and the width of the spacing thereof is widened.

Cleaning Processing Conditions
    Cleaning Solution: water:HF=100:1
    Processing Temperature: 10 to 30° C.
    Cleaning Time: 30 seconds to 2 minutes Accordingly, in the case that a pinhole exists in a portion provided a concave portion 331C in the first passivation film 411 made of SiN, a connecting conductive layer 301 positioned directly underneath thereof is exposed.

Additionally, for example, when performing "dry etching processing" under the following conditions, there are cases wherein the $SiO_2$ film is removed with the space (slide provided to the passivation film 401, and the width of the space thereof widens. For example, there are cases wherein the "dry etching processing" is performed after the formation of the second passivation film 412 and before another rewiring is formed on the second passivation film 412, and the width of the spacing thereof is widened.

Dry Etching Processing Conditions
    Etching Gas: hydrogen fluoride (HF) type of gas
    Temperature: room temperature
    Pressure: 10 to 70 m Torr
    Source Power: 700 to 2,000 W
    Gas Flow Rate: CF4/CHF3/Ar=3/1/10
    Substrate Bias: 300 to 1,000 W,
    Time: approximately 30 seconds to 2 minutes Therefore, for example, when the blocking material film is patterned with the "dry etching processing" in the above-described blocking film 500 forming process (ST 80), there are cases wherein this reacts with the Cu in the concave portion 331 C portion of the connecting conductive layer 301. Accordingly, there are cases wherein a portion of the concave portion 331C of the connecting conductive layer 301 is removed and lost, and cases wherein the generation of abnormal crystals occur.

Figure 32:
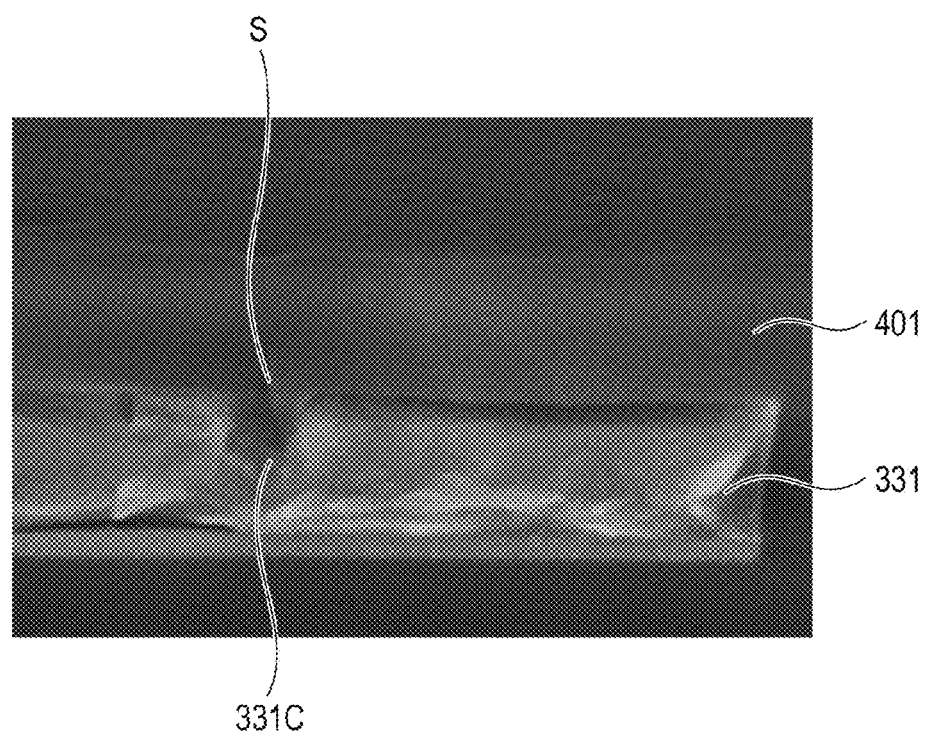
FIG. 32 is a diagram illustrating a comparative example situation according to the sixth embodiment.
Figure 33A:
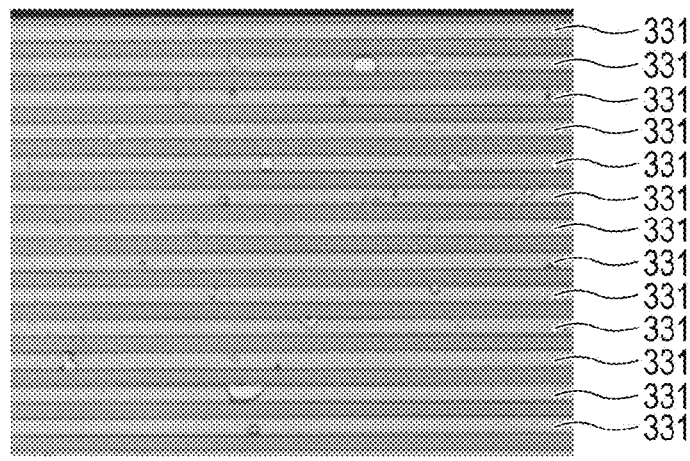
FIGS. 33A through 33C are diagrams illustrating a comparative example situation according to the sixth embodiment.
Figure 33B:
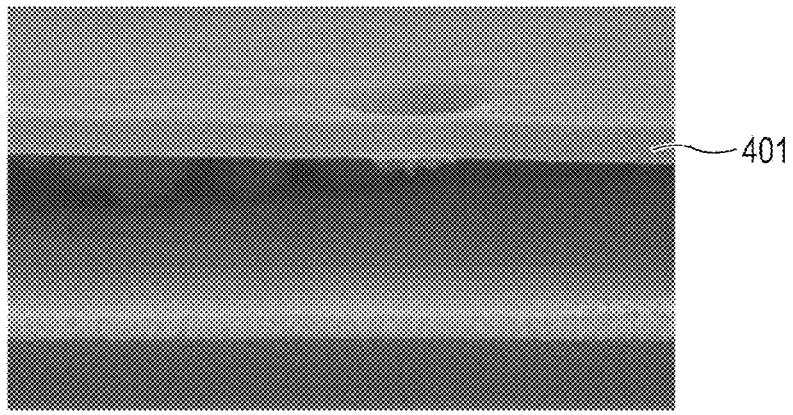
Figure 33C:
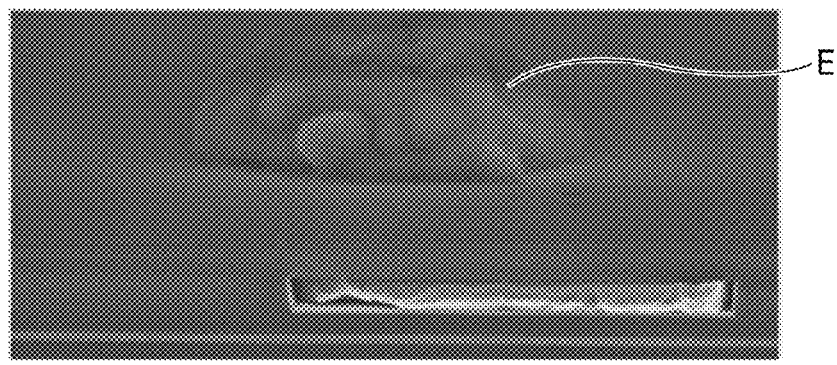

FIGS. 32 and 33 are diagrams illustrating a state of a comparison example according to the sixth embodiment. Now, FIG. 32 shows an electronic microscope photograph of a cross-section. FIGS. 33A through 33C show a situation in which a portion of the concave portion 331C of the connective wiring 331 has been lost, and a generated item has occurred from abnormal reaction with the connective wiring 331. FIG. 33A is an optical microscope photograph indicating the upper face of a comparison example. In FIG. 33A, multiple connective wirings 331 which extend in the horizontal direction are disposed in the vertical direction. FIG. 33B is an optical microscope photograph indicating a cross-section of a portion wherein a portion of the concave portion 331C of the connective wiring 331 has been lost. FIG. 33C is an optical microscope photograph indicating a generated item that occurred from an abnormal reaction with the connective wiring 331.

As shown in FIG. 32, in the case of the comparison example, when the upper face of the connective wiring 331 on which the concave portion 331C is provided is covered with the passivation film 401, there are cases wherein a space S (slit) is formed in a portion corresponding to the concave portion 331C in the passivation film 401. Thus, there are cases wherein sufficiently filling in the concave portion 331C with the passivation film 401 is difficult.

As shown with circles in FIG. 33A, upon performing the processes, there are cases wherein the portion of the concave portion 331C of the connective wiring 331 is lost. Specifically, as shown in FIG. 33B, there are cases wherein below the passivation film 401 becomes hollow. Also, as shown in FIG. 33C, there are cases wherein a generated time E is formed on the connective wiring 331 by an abnormal reaction with the connective wiring 331.

Thus, in the comparison example, loss of the portion on which the concave portion 331C is provided and generation of abnormal crystals can occur, and accordingly product yield and device reliability can deteriorate. Particularly, as described above, in the case of providing a connecting conductive layer 301 by forming the metal layer 301M so as to fill in the inner portion of the pad openings V1 and V2 that pass through the semiconductor substrate 101, there are cases wherein occurrences of defects herein are elicited.

In the case of forming the first plus 311 and second plug 321 which are TSVs, by filling Cu into the deep pad openings V1 and V2, plating conditions by Cu or the like by electrolysis is limited. Therefore, a greater number of bubbles of the $O_2$ generated from the anode side of the plating device attaché to the portion of the metal layer 301M that is closest to the connective wiring 331 (RDL) portion, and the metal layer 301M is formed so as to include the pits. Additionally, the metal layer 301M which is a plating layer is formed so as to include pits, from bubbles occurring when the plating liquid is stirred in a plating tank, or when a wafer is placed in the plating liquid. By performing heat processing subsequently, a minute pit can grow into an enormous void. The portion of the connective wiring 331 (RDL) has a large area, whereupon many pits can collect and a large void is readily formed. Accordingly, with Cu polishing, a large flaw to the concave portion 331C on the upper face of the connective wiring 331 (RDL) that links multiple TSVs can readily occur.

Also, in the case of the comparison example, in order to fill in the inner portion of the concave portion 331C, the passivation film 401 has to be made thicker (e.g., a thickness of 300 to 500 nm). Therefore, the distance between the on-chip lens OCL and photodiode 21 becomes longer, and properties such as pixel sensitivity can deteriorate. Accordingly, there are cases wherein image quality of an imaged image deteriorates. Also, even in the case of forming a thicker film, depending on the evenness or layout of the film forming process, filling in may not be performed sufficiently, and accordingly a space S can occur as shown in FIG. 32.

Figure 34:
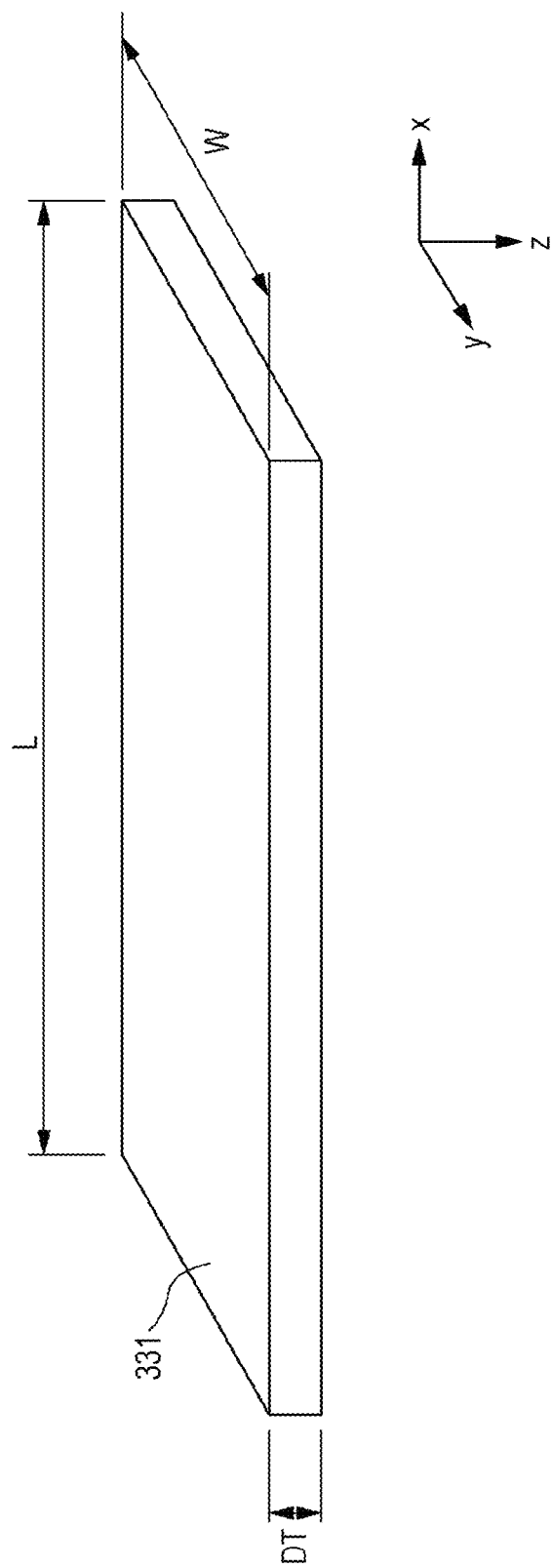
FIG. 34 is a perspective diagram illustrating connective wiring of connected conductive layers according to the sixth embodiment.

FIG. 34 is a perspective view showing the connective wiring 331 of the connecting conductive layer 301. As shown in FIG. 34, in the case that the thickness DT of the connective wiring 331 and the width W or length L have the relation shown in Expressions (1) or (2) below, the above-described defects can occur.

$$W \geq 10 \times DT \quad (1)$$

$$L \geq 10 \times DT \quad (2)$$

That is to say, in the case that the width W or length L of the connective wiring 331 is 10 times or greater than the thickness DT, the above-described defects can occur. We can see from actual results that, in the case that the width W or length L of the connective wiring 331 is 10 times or greater than the thickness DT, the pits existing on a large area can be concentrated in specific areas, and become an enormous void, and accordingly the above-described defects can occur. Note that in the forming process of the connective wiring 331, the maximum thickness is DT0, as shown in FIG. 28, but the maximum thickness DT0 and the occurrence of a concave portion 331C do not have to be considered in particular.

In the case of the present embodiment as opposed to the above-described comparison example, the second passivation film 412 is formed by forming a $SiO_2$ film with a "HDP CVD method", as described above, whereby the passivation film 401 is provided. In the case of the HDP CVD method, a plasma active ion is used, and film forming is progressed while shaving the film that has overhung and deposited on the upper portion of the groove, whereby coverage is sufficient high. Accordingly, even if the film thickness is not thick, appropriately filling in the inner portion of the concave portion 331C can be readily performed.

Figure 35:
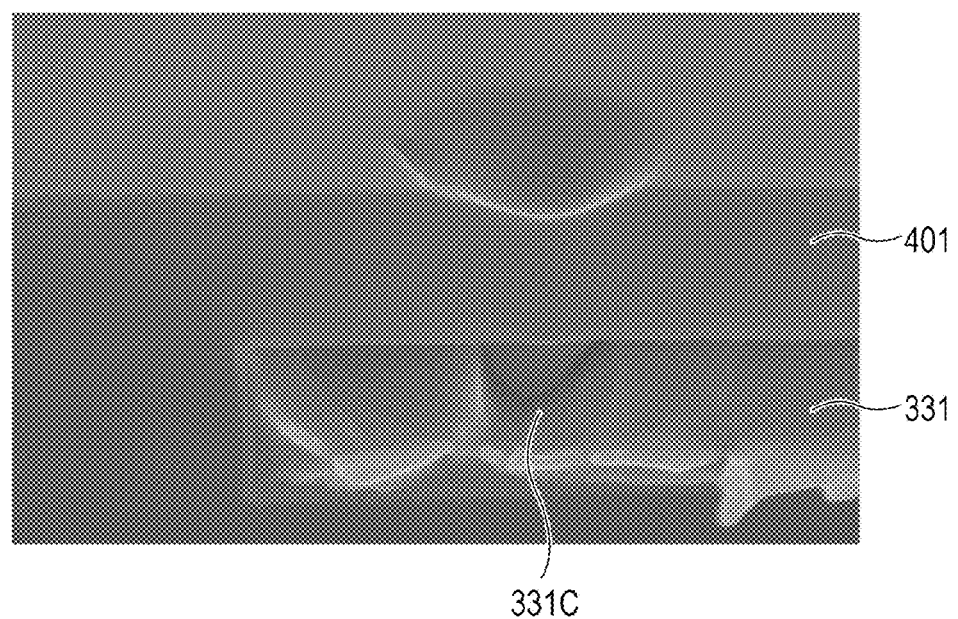
FIG. 35 is a diagram illustrating a portion wherein a concave portion of connective wiring has been provided, according to the sixth embodiment.

FIG. 35 is a diagram illustrating a portion of the connective wiring 331 whereupon a concave portion 331C has been provided, according to the sixth embodiment. As shown in FIG. 35, according to the case of the present embodiment, when the upper face of the connective wiring 331 on which the concave portion 331C is provided is covered with a passivation film 401, a space S is not formed in the portion of the passivation film 410 corresponding to the concave portion 331C. Thus, according to the present embodiment, the inner portion of the concave portion 331C can be sufficiently filled in with the passivation film 401.

Therefore, according to the present embodiment, unlike the case of the comparison example described above, loss of the concave portion 331C on the connective wiring 331 and generation of abnormal crystals can be prevented with a thin film passivation film 401. That is to say, according to the present embodiment, in the case of patterning the blocking material film with "dry etching processing" in the forming process (ST 80) of the blocking film 500 and so forth, the passivation film 401 can effectively protect the connective wiring 331. Therefore, according to the present embodiment, product yield and device reliability can be improved. Also, image quality of an imaged image can be improved.

Modifications

A case of forming the passivation film 401 by forming a $SiO_2$ film with an HDP CVD method is described above, but this should not be limited. Besides a $SiO_2$ film, a SiOC film or SiOF film may be formed. Also, a passivation film 401 may be formed with another CVD method having high capability for filling in.

Modification 1-1

For example, as in the conditions below, the second passivation film 412 may be formed by forming an $SiO_2$ film with an "O3 TEOS (Tetra ethyl ortho silicate) CVD method.

Besides the $SiO_2$ film, the second passivation film 412 may be formed with a SiOC film or SiOF film.

Formation Condition of Second Passivation Film 412
    Film Forming Method: O3 TEOS CVD method
    Film Thickness: 100 to 150 nm
    Detail Conditions
        Gas Flow Rate: TEOS/OE/He=1:30:10
        High Frequency Power: none
        Pressure: 30 to 100 Torr
        Temperature: 300 to 400° C.
        Time: DR=10 to 50 nm/min The above-described "O3 TEOS CVD method" is a method to form a film with a CVD method, using O3 and TEOS.

This film forming method has sufficiently high coverage for the reason that fluidity is high because of high-density ozone, whereby even if the film thickness is not thick, the inner portion of the concave portion 331C can be readily filled in.

Modification 1-2

For example, the second passivation film 412 of an $SiO_2$ film may be formed with an "ALD (Atomic Layer Deposition)", as described in the conditions below. Besides a $SiO_2$ film, the second passivation film 412 may be formed with a SiOC film or SiOF film.

Forming Conditions of Second Passivation Film 412
    Film Forming Method: ALD method
    Film Thickness: 30 to 50 nm The above-described "ALD method" is a film forming method that deposits an atomic layer.

The film forming method herein can have an even film thickness control at an atomic level, and coverage is sufficiently high, whereby even if the film thickness is not thick, the inner portion of the concave portion 331C can be appropriately filled in readily.

Seventh Embodiment

Manufacturing Method, etc.

According to the present embodiment, the forming conditions of the second passivation film 412 differ from that of the sixth embodiment. Other than this point, and points relating thereto, the present embodiment is similar to the sixth embodiment. Therefore, duplicate portions will be omitted from description.

According to the present embodiment, the second passivation film 412 is formed under the following conditions. That is to say, for example, the second passivation film 412 is formed by forming an organic SOG (Spin on glass) film with a "coating method" such as spin coating.

Forming Conditions of Second Passivation Film 412
    Film Forming Method: Spin Coating
    Film Thickness: 50 to 100 nm
    Detail Conditions
        Material: HSQ (Hydrogen Silsesquioxane)
        Coating Rotation: 1500 to 2500 rpm
        Baking Conditions: 80 to 150° C., 60 to 180 seconds
        Heat Processing Conditions for Bridging: 300 to 400° C., 1 to 10 minutes Specifically, upon spin-coating with the coating fluid that includes HSQ at the above-described coating rotation, baking processing is performed under the baking conditions described above. Thereafter, heat processing is performed under the heat processing conditions described above for bridging. Thus, an inorganic SOG film having a refractive index of approximately 1 to 1.4 is formed.

The above-described "coating method" is a film forming method to form a coated film by coating a face with a coating fluid that includes a coating film material. The film forming method herein has sufficient coverage, since the coating fluid flows into the narrow spaces between the wiring whereby a coating film is formed. Accordingly, filling in the inner portion of the concave portion 331C appropriately can be more readily performed than in the case of a parallel plate type CVD method.

Also, the film forming method herein can be made this, since the flatness thereof is high. Accordingly, coverage is higher than with a deposition method such as the HDP CVD method described according to the sixth embodiment, and therefore is more favorable.

Conclusion

As described above, according to the present embodiment, a passivation film 401 is formed by forming an insulating film with a "coating method". Therefore, as described above, the inner portion of the concave portion 331C can be appropriately filled in. Accordingly, according to the present embodiment, product yield and device reliability can be improved. Also, the image quality of imaging images can be improved.

Note that according to the above-described embodiment, description is given in the case of providing a second passivation film 412 by forming an inorganic SOG film with an inorganic material such as HSQ, but is not limited to this. The second passivation film 412 may be formed by forming an organic SOG film with an organic material. For example, MSQ (Methyl silsesquioxane), Par (polyarylene), PAE (polyarylene ether), BCB (Benzocyclobutene) or the like may be used to form the film.

For example, the above-described materials are used to form the second passivation film 412 under the following conditions.
    Film Forming Method: Spin coating method
    Film Thickness: 50 to 100 nm
    Detail Conditions
        Coating Rotations: 1500 to 2500 rpm
        Baking Conditions: 300 to 350° C., 30 to 90 seconds
        Heat Processing Conditions for Bridging: 300 to 350° C., 5 to 60 seconds Eighth Embodiment Device Configuration and so Forth FIG. 36 is a diagram illustrating the principal portion configuration of a solid-state imaging device according to an eighth embodiment.

Figure 36:
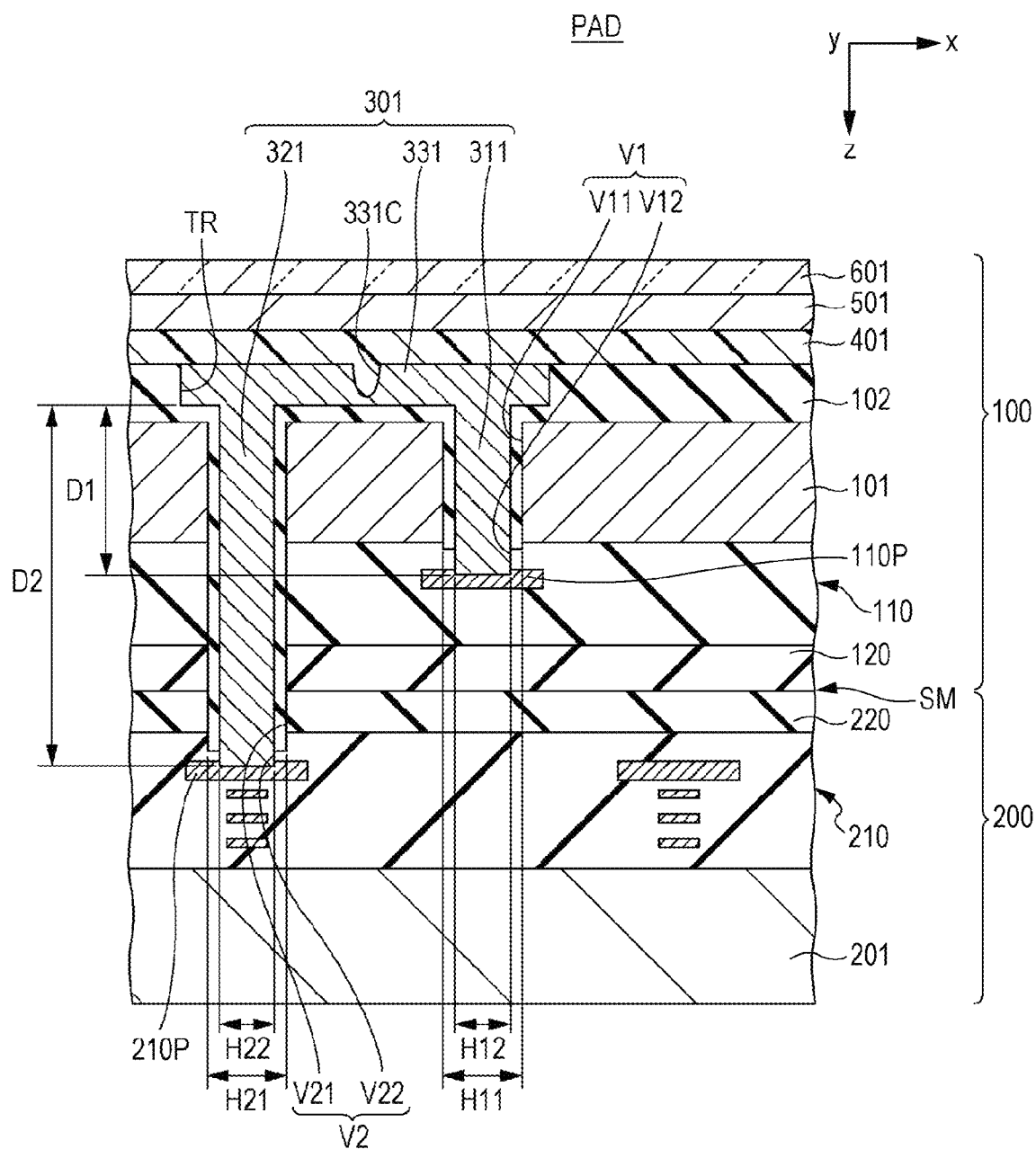
FIG. 36 is a diagram illustrating a configuration of the principal portions of a solid-state imaging device according to an eighth embodiment.

Now, similar to FIG. 20, FIG. 36 illustrates a cross-section taken along line XX-XX in FIG. 18.

As shown in FIG. 36, the configuration of the passivation film 401 according to the present embodiment differs from the case in the sixth embodiment. Other than this point, and points relating thereto, the present embodiment is similar to the sixth embodiment. Therefore, duplicate portions will be omitted from description.

The passivation film 401 is formed in a single layer, as shown in FIG. 36, not as a layered body wherein multiple layers are layered together. The passivation film 401 herein is formed so as to fill in the inner faces of the concave portion 331C provided on the upper face of the connective wiring 331 and to cover the upper face of the insulating film 102. For example, the passivation film 401 is formed under the following conditions.

Film Forming Conditions of Passivation Film 401
    Material: SiN
    Film Forming Method: ALD method
    Film Thickness: 30 to 50 nm
    Detailed Conditions
        Gas Flow Rate: DCS (dichlorosilane): $NH_3$=1:2
        High Frequency Power: 30 to 700 W
        Pressure: 90 to 600 Pa Temperature: 300 to 350° C.

Time: 10 seconds to 2 minutes

The above-described film forming method enables control of an even thickness at the atomic layer level, whereby a film having high film quality and high coverage of the stepped form can be formed. Accordingly, coverage is sufficiently high, whereby even if the film is not thick as in the case of the parallel plate type CVD method, the inner portion of the concave portion 331C can be readily filled in.

Conclusion

As described above, in the passivation film 401 forming processes according to the present embodiment, a SiN insulating film is formed with an "ALD method", whereby the passivation film 401 is formed. Therefore, as described above, the inner portion of the concave portion 331C can be appropriately filled in. Accordingly, according to the present embodiment, product yield and device reliability can be improved. Also, the image quality of imaging images can be improved.

Note that according to the above-described embodiment, description is given in the case of forming a SiN film with the ALD method as the passivation film 401, but is not limited to this. The passivation film 401 may be formed by forming a SiON film, SiC film, or SiCN film with the ALD method. Also, the passivation film 401 may be formed by forming a SiN film, SiON film, SiC film, or SiCN film with the HDP CVD method. Additionally, the passivation film 401 may be formed by layering these as appropriate.

Others

The present embodiment is not to be limited to the descriptions given above, and types of modifications can be employed.

In the above-described embodiment, description is given in the case of providing a pad opening by forming an upper-side opening portion and a lower opening portion of which the width is narrower than the upper-side opening portion, so as to be layered in the depth direction z, but is not limited to this. The pad opening may be provided by forming three or more opening portions having different widths, so as to be layered in the depth direction z. Also, other than the case of having a step between the upper side opening portion and lower opening portion, the pad opening may be provided so as to have no step. That is to say, the pad opening may be provided having the same width from upper portion to lower portion.

In the above-described embodiment, description is given in the case of bonding together the sensor substrate 100 and logic substrate 200 with plasma joining, but is not limited to this. For example, an adhesive may be used to bond the two together.

In the above-described embodiment, description is given in the case of manufacturing the sensor substrate 100 which is a rear-projection type CMOS from a silicon substrate, but is not limited to this. The sensor substrate 100 may be manufactured from a so-called SOI (Silicon on Insulator) substrate.

In the above-described embodiment, description is given in the case of providing four types as a pixel transistor, which are a transfer transistor, amplifying transistor, selecting transistor, and reset transistor, but is not limited to this. For example, in the case of providing three types as a pixel transistor, which are a transfer transistor, amplifying transistor, and reset transistor, the present technology may be applied.

In the above-described embodiment, description is given in the case of providing one each of a transfer transistor, amplifying transistor, selecting transistor, and reset transistor for one photodiode, but is not limited to this. For example, in the case of providing one each of an amplifying transistor, selecting transistor, and reset transistor for multiple photodiodes, the present technology may be applied.

In the above-described embodiment, description is given in the case of applying the present technology to a camera is described, but is not limited to this. The present technology may also be applied to other electronic devices having a solid-state imaging device, such as a scanner or copier.

In the above-described embodiment, description is given in the case that the sensor substrate 100 is a "rear projection type" of CMOS image sensor, but is not limited to this. Also, besides the CMOS image sensor, the present technology may be applied in the case of a CCD type image sensor.

In the above-described embodiment, description is given in the case of bonding together the sensor substrate 100 and logic substrate 200, but is not limited to this. The present technology may also be used in the case of bonding together semiconductor chips other than the sensor substrate 100 and logic substrate 200.

In the above-described embodiment, description is given in the case of simultaneously removing the upper and lower portions of multiple pad wirings with etching processing to simultaneously form multiple pad openings having different depths. However, this is not limited. Additionally, multiple pad openings having different breadths (width, diameter) may be formed simultaneously with etching processing.

In the above-described embodiment, description is given in the case of forming a connecting conductive layer 301 by forming copper (Cu) into a film using an electroplating method, but is not limited to this. Besides electroplating, the present technology may be applied to a case of forming a film with a non-electroplating method. In the case of a non-electroplating method also, bubbles can occur when the plating liquid is stirred, or when a wafer is placed in the plating tank, and accordingly defects such as those described above can occur. Also, besides copper (Cu), the present technology may be applied in the case of forming a connecting conductive layer 301 by forming a film with gold (Au), silver (Ag), nickel (Ni), indium (In), tungsten (W), or an alloy of these.

Also, in the above-described embodiment, description is given in the case that a large void is generated from minute pits with the heat processing, and subsequently the inner portion of the void is exposed by film-thinning processing and a concave portion is provided on the upper face of the connective wiring, but is not limited to this. The present technology may be applied in the case of providing a concave portion on the upper face of the connective wiring with another method.

Additionally, the above-described embodiments may be combined as appropriate.

Figure 37:
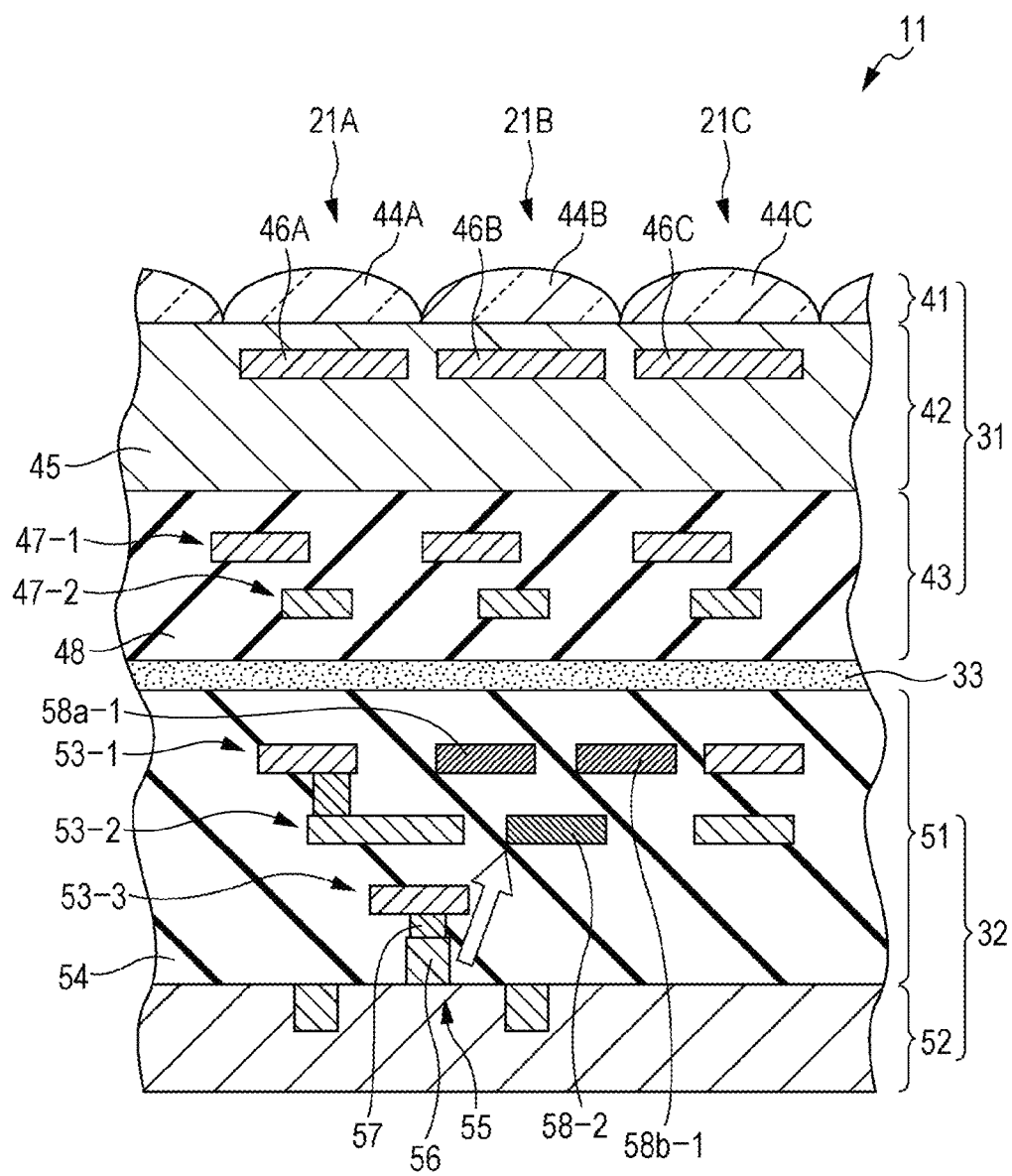
FIG. 37 is a cross-sectional diagram illustrating a configuration example of a layered-type imaging device.

FIG. 37 is a cross-sectional diagram showing a configuration example of a layered type imaging device 11. FIG. 37 shows a cross-section of the vicinity of three adjacent pixels 21A through 21C, of multiple pixels 21 disposed in an array form. As shown in FIG. 37, the layered type imaging device 11 is configured by a sensor chip 31 and signal processing chip 32 being adhered together with an adhesive layer 33.

The sensor chip 31 is made up of an OCL (On Chip Lens) layer 41, semiconductor substrate 42, and wiring layer 43, in sequence from the upper side in FIG. 37. Note that a solid-state imaging device 21 is a so-called rear-projection type CMOS image sensor, whereby incident light is input as to the back face (the face facing the upper side in FIG. 37) which faces the opposite side from the front face of the semiconductor substrate 42, on which a wiring layer 43 is provided as to the semiconductor substrate 42 of the sensor chip 31.

In the OCL layer 41, multiple small lenses 44 are disposed for each pixel 21, and FIG. 37 shows three lenses 44A through 44C that are disposed corresponding to the pixels 21A through 21C.

In the semiconductor substrate 42, for example, on the inner portion of a P-type silicon layer (P-well) 45, multiple PDs 46 which are photoelectric converters are disposed for each pixel 21, and FIG. 37 shows three PDs 46A through 46C that are disposed corresponding to the pixels 21A through 21C. The semiconductor substrate 42 is a light receiving layer that receives the incident light which is incident into the layered-type imaging device 11, the PDs 46A through 46C receive the incident light collected by the lenses 44A through 44C and perform photoelectric conversion, and accumulate the load generated therein.

The wiring layer 43 is made up by a wiring 47, which performs load readouts of the PD 46 formed in the semiconductor substrate 42, embedded in an inter-layer insulating film 48, and in the example in FIG. 37, a layer wherein the wiring 47-1 is disposed and a layer wherein the wiring 47-2 is disposed form a two-layer configuration.

The signal processing chip 32 is made up of a wiring layer 51 and semiconductor substrate 52 having been layered together in sequence from the upper side of FIG. 37. A logic circuit for driving the sensor chip 31 (e.g., see FIG. 1) and a memory and so forth are formed in the signal processing chip 32.

The wiring layer 51 is configured such that multiple wirings 53 are embedded in the inter-layer insulating film 54, and in the example in FIG. 37, a layer wherein the wiring 53-1 is disposed, a layer wherein the wiring 53-2 is disposed, and the wiring 53-3 form a three-layer configuration. The wiring 53 performs sending/receiving of signals between the sensor chip 31 and signal processing chip 32, and sending/receiving of signals between the logic circuit on the signal processing chip 32.

The semiconductor substrate 52 has a circuit layer wherein multiple transistors 55 are formed, which makes up a logic circuit of the signal processing chip 32, and in the example in FIG. 37, only one transistor 55 is shown and the other transistors 55 are omitted from the diagram.

As shown in FIG. 37, a gate electrode 56 of the transistor 55 is formed so as to be layered on the semiconductor substrate 52, i.e., so as to protrude to the wiring layer 51 side, and the gate electrode 56 and wiring 53-3 are connected with a contact unit 57.

In the layered-type imaging device 11, a blocking film 58 is disposed between the semiconductor substrate 42 on which the PDs 46 are formed and the semiconductor substrate 52 on this the transistors 55 are formed. For example, the blocking film 58 is disposed in the wiring layer 51, in a region wherein the wiring 53 is not formed, but using the same material as the wiring 53 and at the same depth in the layer as the wiring 53 is formed (i.e. so as to form the same plane as the wiring 53).

In the example in FIG. 37, a two-layer construction is shown, wherein the blocking films 58a-1 and 58b-1 that are disposed in the same layer as the wiring 53-1 and a blocking film 58-2 that is disposed in the same layer as the wiring 53-2. For example, aluminum (thickness: 600 nm) is used for the material for the wiring 53 and blocking film 58, and as a barrier metal, TiN (30 nm)/Ti (60 nm) is used.

That is to say, in the process to form the wiring 53, the blocking film 58 can be formed at the same time as the wiring 53, and new processes to form the blocking film 58 do not have to be added. That is to say, the blocking film 58 does not add a new blocking layer, but is provided using the wiring 53. Also, the wiring 53 is connected to the PDs 46 of the sensor chip 31 and the logic circuit of the signal processing chip 32, but the blocking film 58 is formed so as to be independent therefrom (as a separate dummy pattern from the pattern of the wiring 53).

By providing such a blocking film 58, the layered-type imaging device 11 can block the light emitted by a hot carrier of the transistor 55 (white arrow in FIG. 37) with the blocking film 58, and can suppress the emitted light from negatively influencing the PDs 46.

Figure 38:
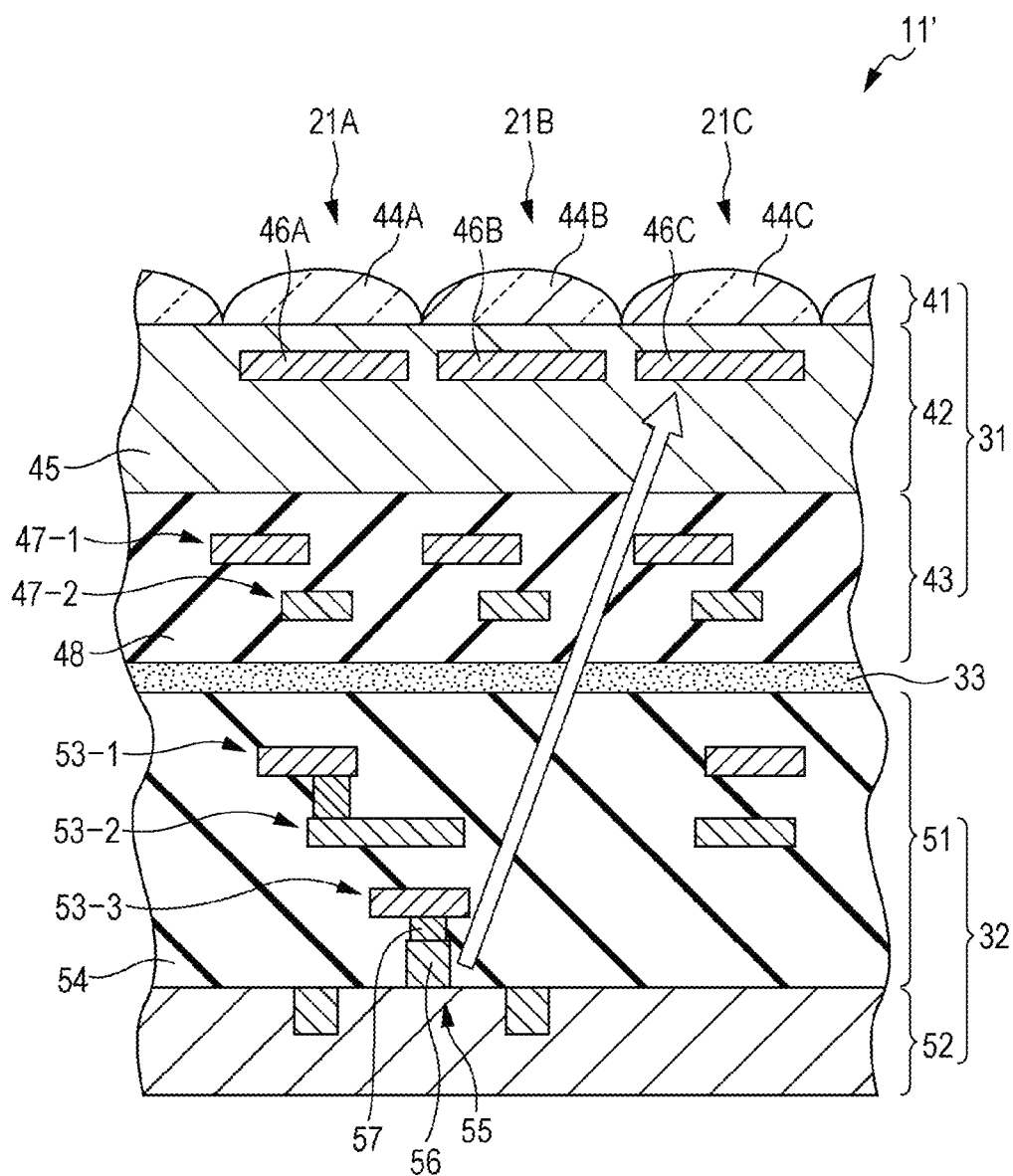
FIG. 38 is a cross-sectional diagram illustrating a layered-type imaging device in a configuration example according to the related art.

Now, the light emitting from the hot carrier of the transistor 55 causing adverse effects on the PDs 46 will be described with reference to FIG. 38. FIG. 38 shows a layered-type imaging device 11' of a configuration example according to the related art in which a blocking film 58 is not formed. In such a configuration, light emitted by a hot carrier of the transistor 55 may have been received by a PD 46C, for example, as shown in the white arrow in FIG. 38. Thus, in the pixel signal output from the PD 46C, the light amount receiving the light emitted by a hot carrier of the transistor 55 is added to the light amount of the incident light collected by the lens 44C, and accordingly the emitted light can cause adverse effects by appearing in an image as noise.

Conversely, as shown in FIG. 37, in the layered-type imaging device 11, the blocking film 38 can block the light emitted by a hot carrier of the transistor 55 from being transported, and the adverse effects from the emitted light thereof can be suppressed, whereby image quality deterioration can be prevented.

Note that the blocking film 58 only have to be disposed between the semiconductor substrate 42 on which the PDs 46 are formed and the semiconductor substrate 52 on which the transistors 55 are formed are disposed, and may also be formed only on the wiring layer 43 instead of the wiring layer 51, or may be formed on both the wiring layers 51 and 43.

Now, the wiring 53 formed in the wiring layer 51 is generally in a layout following strict design rules stipulated by processing conditions such as lithography, dry etching, or CMP (Chemical Mechanical Polishing). Therefore, in the case of using the wiring layer 51 to form a blocking film 58, the blocking film 58 is not laid out with just light blocking as an objective, but the blocking film 58 has to be laid out so that light can be effectively blocked while following the layout rules. For example, an example of a design rule for the wiring width of the wiring 53 and minimum wiring spacing (the spacing between wirings 53 having the smallest possible wiring width thereof) is shown in FIG. 39.

As shown in FIG. 39, the design rules of the wiring 53 is set such that, in the case that the wiring width of the wiring 53 is 1.6 μm or less, the minimum wiring spacing of the wirings 53 is set to 0.4 μm. Also, in the case that the wiring width of the wiring 53 is greater than 1.6 μm and is 4.6 μm or less, the minimum wiring spacing of the wirings 53 is set to 0.5 μm; in the case that the wiring width of the wiring 53 is greater than 4.6 μm and is 6.0 μm or less, the minimum wiring spacing of the wirings 53 is set to 0.8 μm. Also, in the case that the wiring width of the wiring 53 is greater than 6.0 μm and is 10.0 μm or less, the minimum wiring spacing of the wirings 53 is set to 1.5 μm; in the case that the wiring width of the wiring 53 is greater than 10.0 μm, the minimum wiring spacing of the wirings 53 is set to 3.0 μm.

Figure 40:
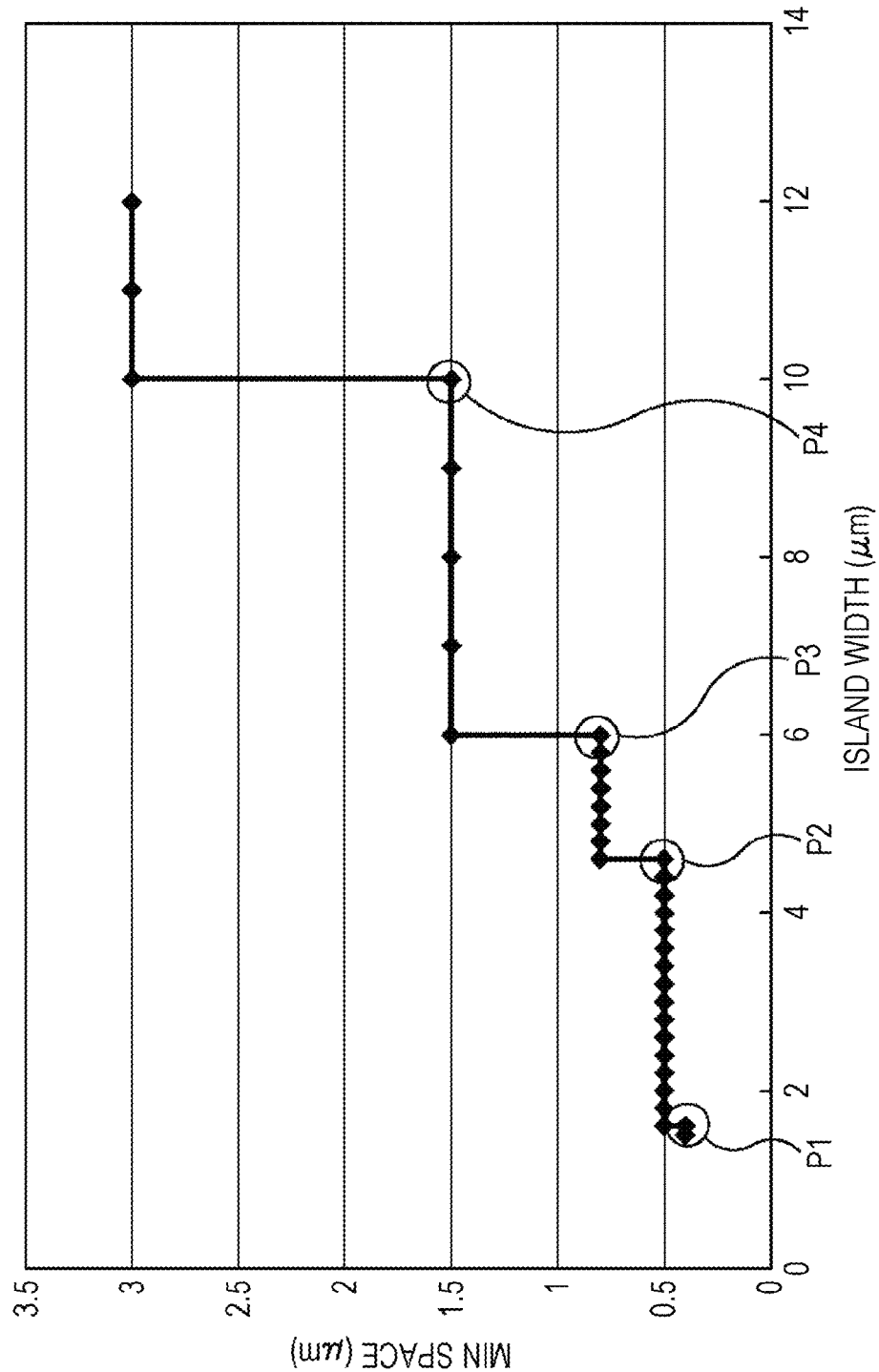
FIG. 40 is a diagram illustrating the relation between width of a blocking film and minimum spacing according to the design rules.

In the case of using a layer of wiring 53 to lay out square blocking films 58 according to such design rules, the relation between the width of the blocking film 38 and the minimum spacing of the blocking films 58 (the spacing between blocking films 58 having the smallest possible width thereof) is shown in FIG. 40. In FIG. 40, the horizontal axis shows the width of the blocking film 58 (Island Width) and the vertical axis shows the minimum space (Min Space) of the blocking films 58.

As shown in FIG. 40, the relation between the width and the minimum spacing of the blocking films 58 is such that, according to the design rules shown in FIG. 39, corresponding to the increase in the width of the blocking film 58, the minimum width of the blocking films 58 gradually increases. Now, if the ratio of the area blocked by the blocking films 58 as to the entire area in which the blocking films 58 are disposed is a duty ratio, the duty ratio is at maximum at the point when the width of the blocking films 58 are greatest at the minimum spacing, for each minimum spacing of blocking films 58.

For example, in the case that the minimum spacing of the blocking films 58 is 0.4 µm, the duty ratio is greatest at a point P1 where the width of the blocking film 58 is 1.6 µm. Also, in the case that the minimum spacing of the blocking films 58 is 0.5 µm, the duty ratio is greatest at a point P2 where the width of the blocking film 58 is 4.6 µm. Similarly, in the case that the minimum spacing of the blocking films 58 is 0.8 µm, the duty ratio is greatest at a point P3 where the width of the blocking film 58 is 6.0 µm, and in the case that the minimum spacing of the blocking films 58 is 1.5 µm, the duty ratio is greatest at a point P4 where the width of the blocking film 58 is 10.0 µm.

In the layered-type imaging device 11, the blocking films 58 are formed so that the relationship between the width and minimum spacing of the blocking films 58 has the maximum duty ratio, and FIGS. 41A through 41D show a layout of the blocking films 58 formed so as to have the maximum duty ratio.

Figure 41A:
FIGS. 41A through 41D are diagrams illustrating a blocking film layout formed so as to have the maximum duty ratio.
Figure 41B:
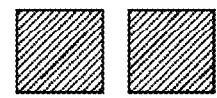

FIG. 41A shows the blocking films 58 in a layout of the minimum spacing and widths of 0.4 µm and 1.6 µm, respectively, and the duty ratio at this layout is 64%. FIG. 41B shows the blocking films 58 in a layout of the minimum spacing and widths of 0.5 µm and 4.6 µm, respectively, and the duty ratio at this layout is 81%.

Figure 41C:
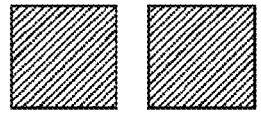
Figure 41D:
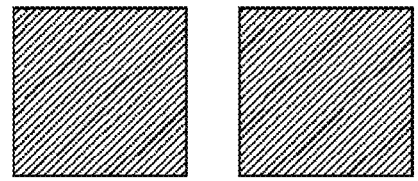

FIG. 41C shows the blocking films 58 in a layout of the minimum spacing and widths of 0.8 µm and 6.0 µm, respectively, and the duty ratio at this layout is 78%. FIG. 41D shows the blocking films 58 in a layout of the minimum spacing and widths of 1.5 µm and 10.0 µm, respectively, and the duty ratio at this layout is 76%.

Figure 42:
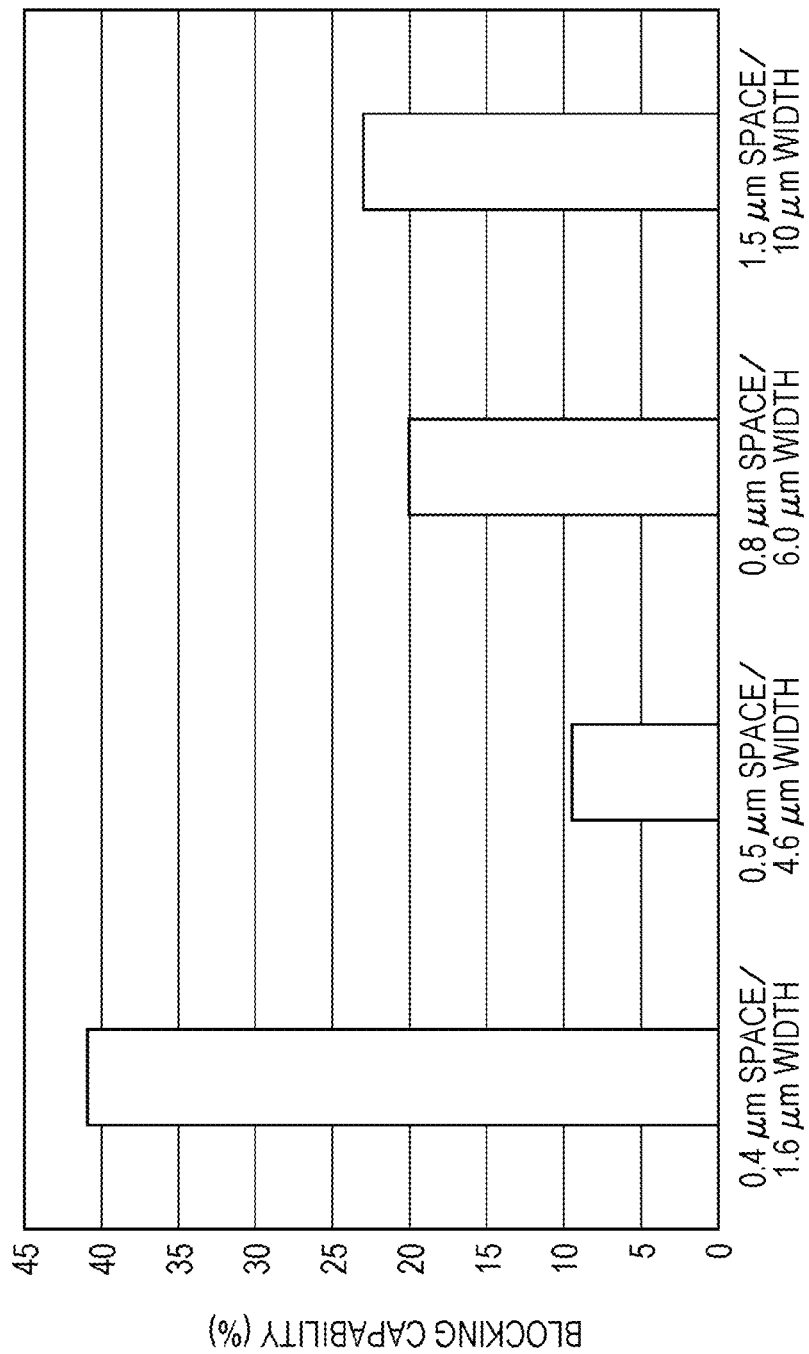
FIG. 42 is a diagram illustrating blocking capability by each layout.

FIG. 42 shows the blocking capability of each layout shown in FIGS. 41A through 41D. Note that the blocking capability is defined as the transmittance in the case of 540 nm of light irradiating orthogonally as to the layer of the blocking film 58 when one layer of blocking film 58 is disposed. That is to say, we can say that the lower the transmittance is, the higher the blocking capability is.

As shown in FIG. 42, in the case of a blocking film 58 layout having the minimum spacing and width of 0.5 µm and 4.6 µm, respectively, the highest blocking capability is the result obtained. For example, as shown in FIGS. 41A through 41D, we can assume that such results would be obtained, from the duty ratio at this layout having been the highest, or the minimum spacing between the blocking films 58 being similar or less than the wavelength of light used in the event of finding the transmittance.

Also, in the case that the minimum spacing of the blocking films 58 is smallest, i.e. in the case that the minimum spacing of the blocking films 58 is 0.4 µm, the blocking capability is lowest, and the result is that blocking capability is not increased by simply narrowing the minimum spacing of the blocking film 58. That is to say, as shown in FIGS. 41A through 41D, in the case of laying out the blocking films 58 with the minimum spacing and widths as 0.4 µm and 1.6 µm, respectively, the duty ratio has the lowest value, whereby we can assume that the blocking capability is low.

Thus, in the layered-type imaging device 11, by employing a layout wherein the minimum spacing of the blocking films 58 is 0.5 µm which is less than the wavelength of the light to be blocked, and the width is 4.6 µm which is the greatest width at the spacing thereof according to the design rules, the blocking capability can be maximized.

Figure 43A:
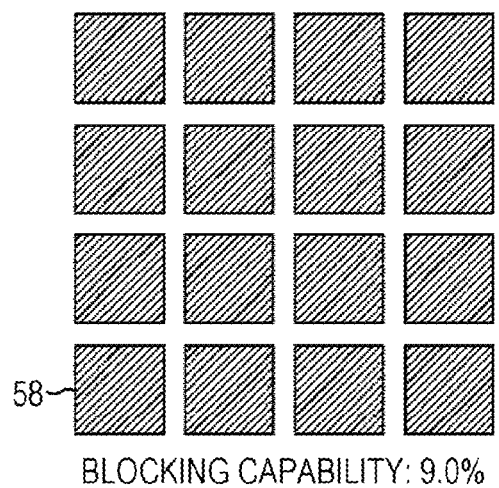
FIGS. 43A and 43B are diagrams illustrating an example of a blocking film laid out in two patterns.
Figure 43B:
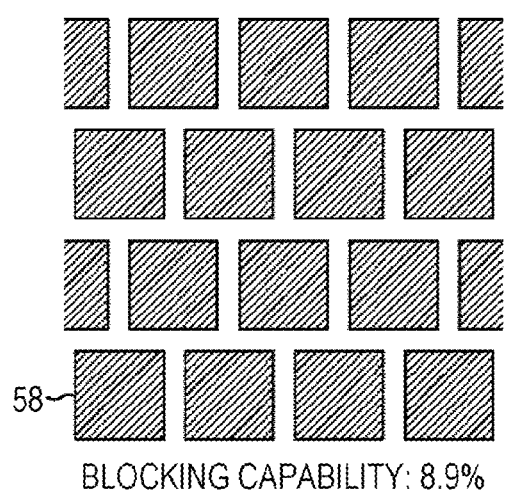

Now, even if the minimum spacing and widths of the blocking films 58 are the same, when disposing the blocking films 58 on a plane, the blocking films 58 can be laid out in multiple patterns. For example, FIGS. 43A and 43B show an example of blocking film 58 layouts in two patterns. FIG. 43A shows a layout wherein the blocking films 58 are disposed in the row direction and column direction so as to be in one row. FIG. 43B shows a layout wherein the blocking films 58 are disposed in one row in the row direction, and shifted by a half-cycle of a disposing cycle of the blocking film 58 for each row in the column direction.

Also, if the blocking capabilities in the two layouts shown in FIGS. 43A and 43B are similarly found as that described with reference to FIG. 42, the blocking capability in the layout shown in FIG. 43A is 9.0%, and the blocking capability of the layout shown in FIG. 43B is 8.9%. That is to say, the result is obtained indicating that if the minimum spacing and width of the blocking films 58 are the same, even if the layout is different, the blocking capability is approximately the same.

Thus, by forming the blocking films 58 in a rectangular shape, in the wiring layer 51, in a layout according to the design rules shown in FIG. 39, the influence from the light emitted by the hot carrier of the transistors 55 can be reduced to 10% or less.

Next, a configuration example of the blocking films 58 in a two-layer construction will be described with reference to FIGS. 44A and 44B. In the case of forming the blocking films 58 in a two-layer configuration, blocking capability differs when the amount of shift in the position of the blocking film 58-1 in the first layer and the blocking film 58-2 in the second layer differs.

Figure 44A:
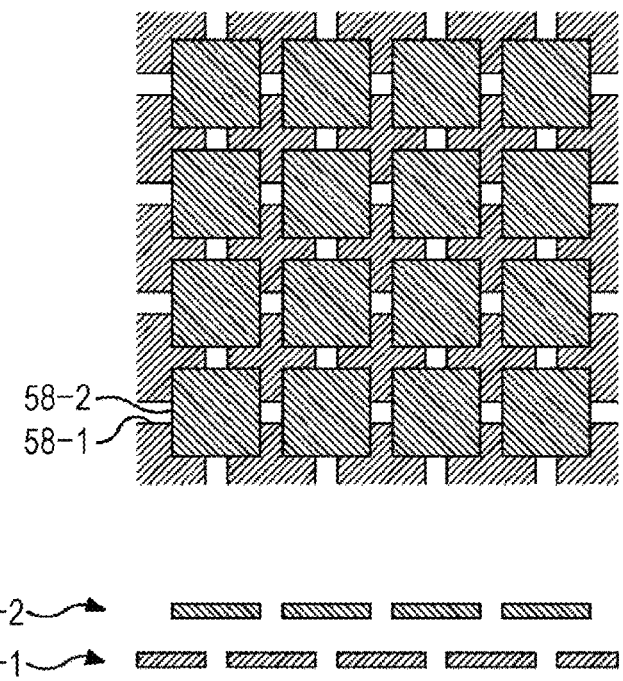
FIGS. 44A and 44B are diagrams illustrating a configuration example of a blocking film in a two-layer configuration.
Figure 44B:
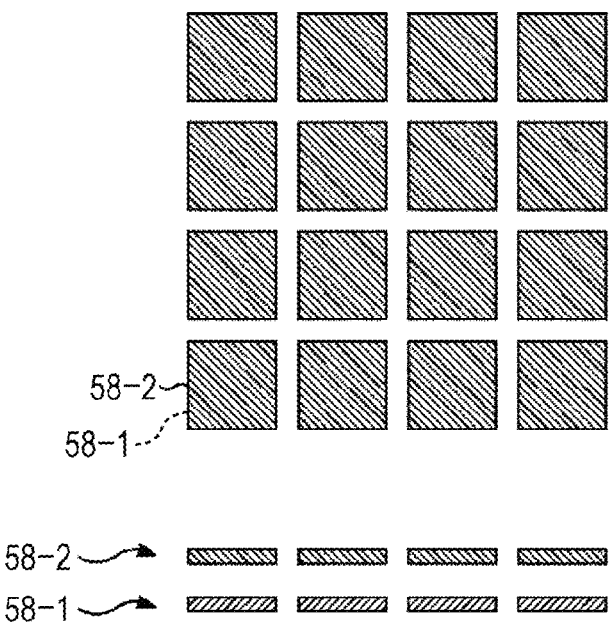

FIG. 44A shows a two-layer layout wherein the shift between the position of the blocking film 58-1 in the first layer and the blocking film 58-2 in the second layer is half the disposing cycle of the blocking film 58 (half-cycle shifting pattern). Also, FIG. 44B shows a two-layer layout pattern wherein the position of the blocking film 58-1 in the first layer and the blocking film 58-2 in the second layer do not shift, i.e. the disposing cycles of the blocking films 58-1 and 58-2 match (same cycle pattern).

With such a two-layer construction layout, when the minimum spacing and the width of the blocking films 58-1 and 58-2 are set as 0.5 mm and 4.6 mm, respectively, the spacing between the blocking film 58-1 and 58-2 is set as 800 nm, and the material and thickness thereof is the same as the blocking film 58 described above, the results thereof are shown in FIG. 45.

FIG. 45 shows the results of calculating the blocking capabilities of when the half-cycle shifting pattern is used and when the same cycle pattern is used. As shown in FIG. 45, the results of the blocking capability when laying out the blocking films 58 in a half-cycle shifting pattern is 0.6%, and the blocking capability when laying out the blocking films 58 in a same cycle pattern is 3%. That is to say, the half-cycle shifting pattern has a result of a higher blocking capability than the same cycle pattern.

Thus, as shown in FIG. 37, in the case of a two-layer construction of the blocking films 58-1 and 58-2, not matching the disposing cycle of the blocking films 58 in the upper and lower layers is favorable. Note that the blocking capability is the highest with a layout having a shift in position between the blocking films 58-1 and 58-2 that is half the disposing cycle of the blocking film 58, but for example, a layout having ⅓ the disposing cycle of the blocking film 58 may be used.

Figure 46:
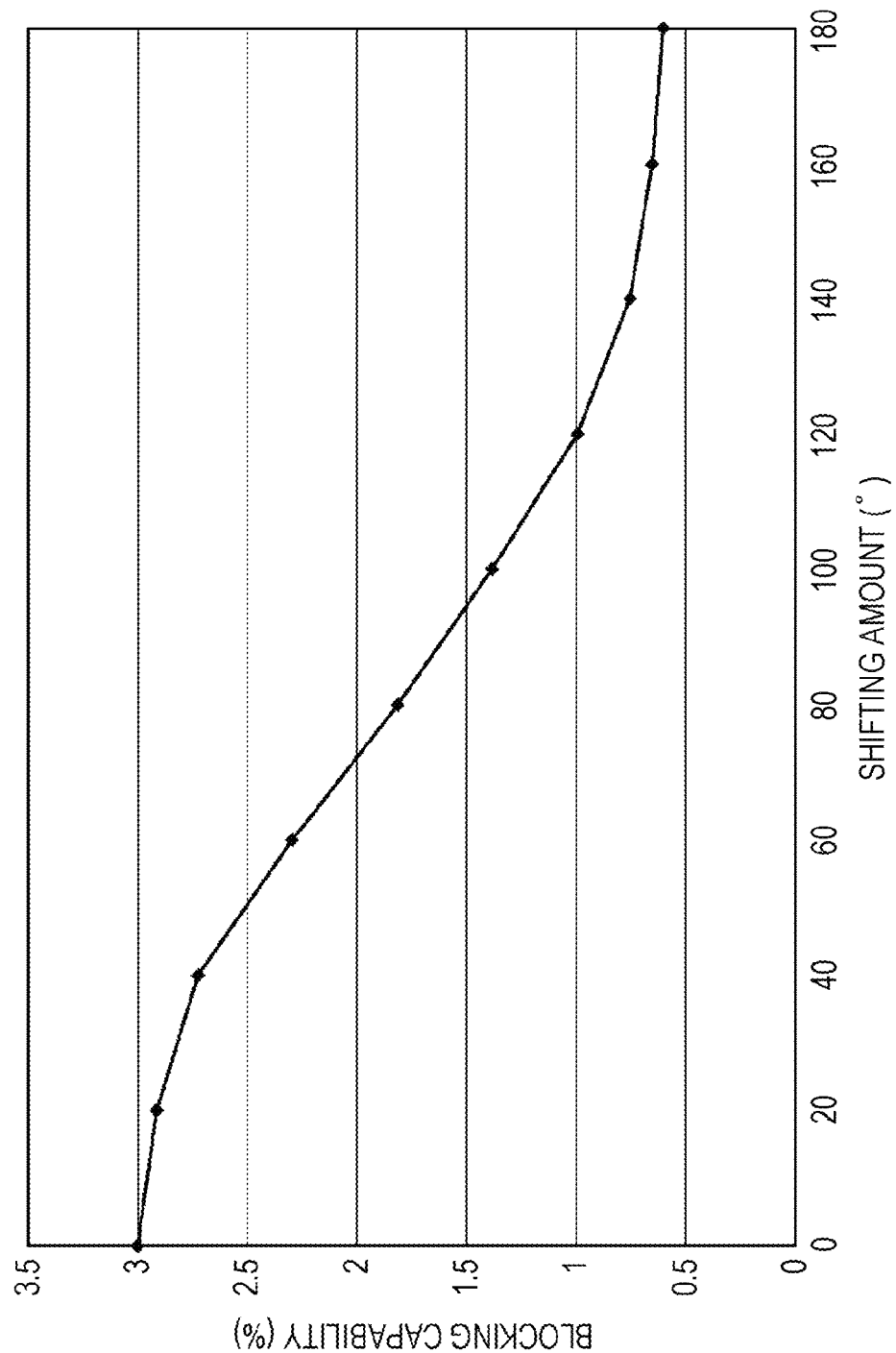
FIG. 46 is a diagram illustrating the relation between shifting amount of the blocking firm disposal cycle and the blocking capability.

For example, FIG. 46 shows the relation between the shift amount when the disposing cycle of the blocking films 58 is shifted in each of the upper and lower layers, and the blocking capability, in the case of a two-layer construction with the blocking films 58-1 and 58-2.

As shown in FIG. 46, the blocking capability (3%) is the lowest value when the shifting amount is 0°, and the blocking capability (0.6%) is the highest value when the shifting amount is 180°. With this range, for example, if the shifting amount is 140°, a certain amount of blocking capability (e.g. 90% or greater blocking capability when the shifting amount is 180°) can be obtained. Thus, employing a two-layer layout pattern so that the shift in position between the blocking film 58-1 in the first layer and the blocking film 58-2 in the second layer is 140° or greater is favorable. Note that the relation between the shifting amount and the blocking capability can be set appropriately according to the spacing between the blocking films 58-1 and 58-2 (wiring spacing in the vertical direction).

Figure 47:
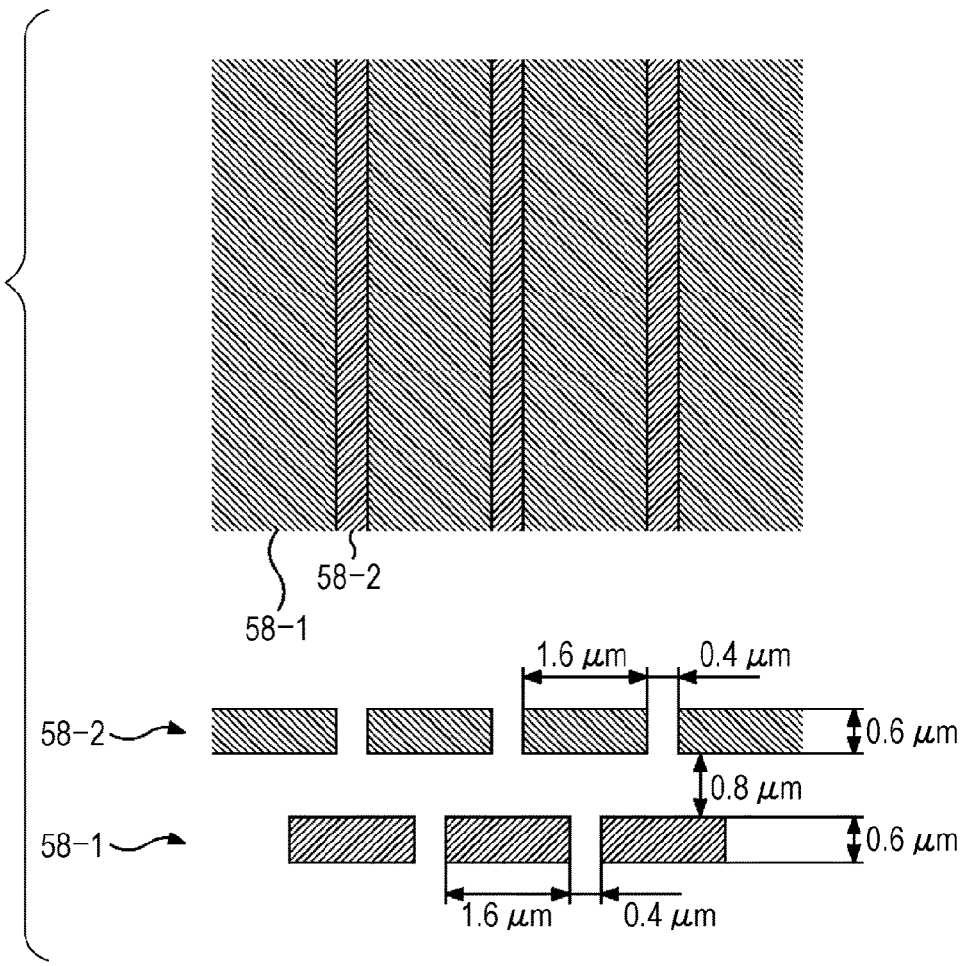
FIG. 47 is a diagram describing a blocking film layout that employs a line shape.

Next, a layout of blocking films 58 employing a line form will be described with reference to FIG. 47. Also, for example, as a blocking film 58 form, besides the rectangular shape such as described above, for example a line shape can be employed. FIG. 47 shows a plan view and cross-sectional view of the blocking films 58 in a line shape layout.

The line shape blocking films 58 are also laid out according to the above-described design rules. In the example in FIG. 47, a layout is shown of the blocking films 58-1 and 58-2 in a two-layer construction with a spacing of 0.8 μm, having the minimum spacing and width of 0.4 μm and 1.6 μm respectively. Also, the shift in position of the blocking films 58-1 and 58-2 are half the disposing cycle of the blocking films 58. Thus, by employing a line shape blocking film 58, the blocking film 58 and wiring 53 can be shared, whereby freedom of design can be improved.

Figure 48:
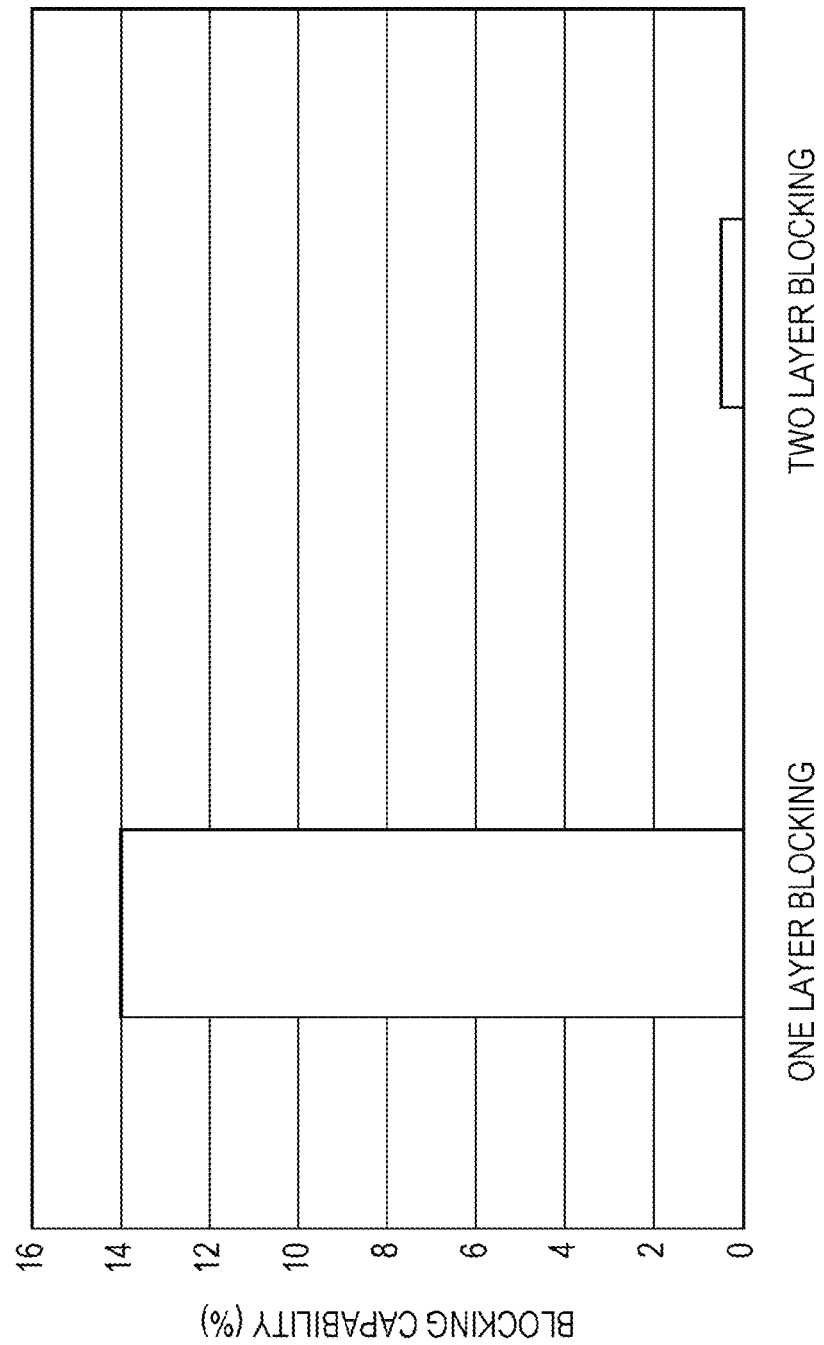
FIG. 48 is a diagram illustrating the blocking capability in a blocking film layout that employs a line shape.

FIG. 48 shows the result of finding the blocking capability of the layout in FIG. 47, similar to the description with reference to FIG. 42. As shown in FIG. 48, the blocking capability, in the case of laying out the blocking films 58-1 and 58-2 in a two-layer construction in a line shape, is 0.5%. Also, the blocking capability, in the case of laying out the blocking films 58 in a one-layer construction in a line shape, is 14%.

That is to say, when employing the blocking films 58 in a line shape, blocking capability can be greatly improved by using a two-layer construction rather than a one-layer configuration. Also, the duty ratio for the layout shown in FIG. 47 is 80%, and is a smaller value than the duty ratio for the layout shown in FIGS. 44A and 44B, but by forming a two-layer configuration, greater blocking results can be obtained.

Next, a layout, wherein the blocking films 58-2 in the second layer are only disposed in the locations where there is a space between the blocking films 58-1 in the first layer, will be described with reference to FIG. 49. Note that in FIG. 49, the first layer has the blocking films 58, but for example, the blocking films 58-2 of the second layer may be disposed at spaces between the wirings 53 or spaces between the wiring 53 and blocking film 58-1 in the first layer.

Figure 49:
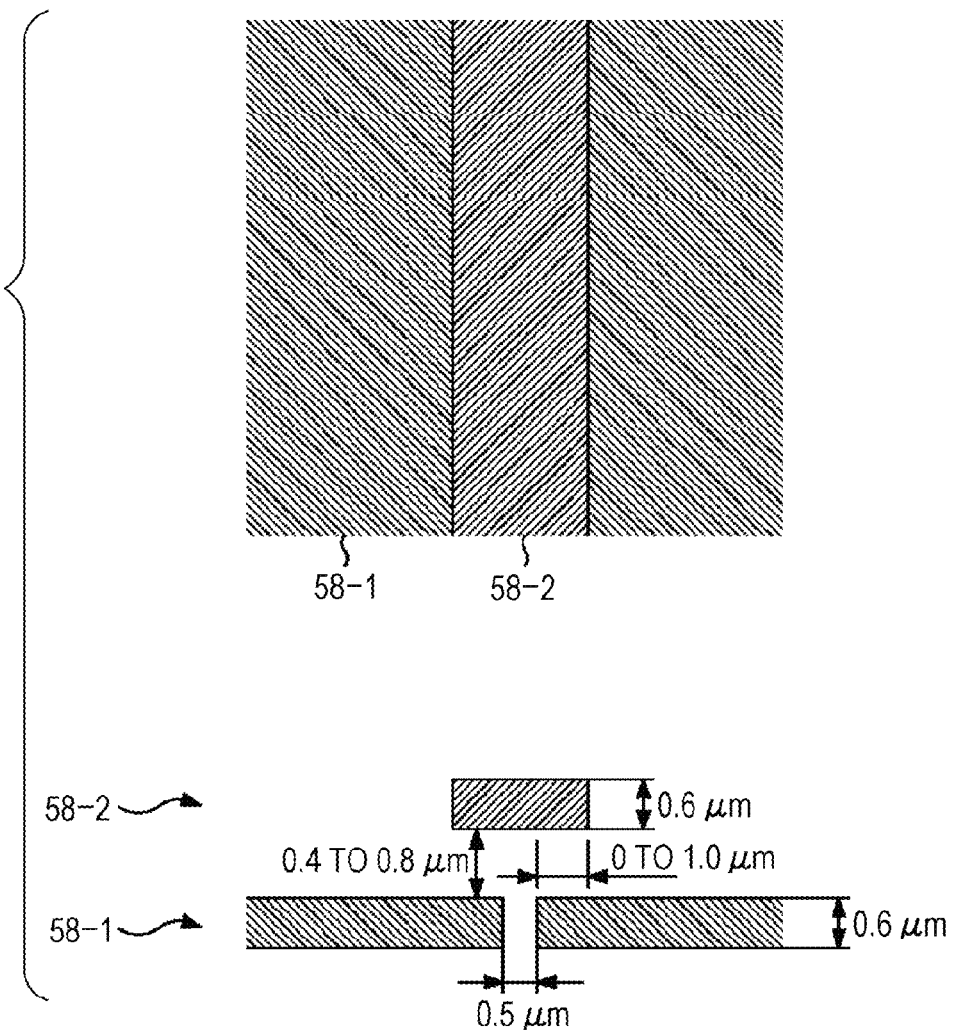
FIG. 49 is a diagram describing a layout wherein only the portions that are spaces in the first layer of blocking film have the second layer of blocking film disposed.

As shown in FIG. 49, blocking capability can be improved also with a layout wherein blocking films 58-2 of the second layer are disposed at only the locations that are spaces in the blocking films 58-1 in the first layer. Note that with this type of layout, density of the blocking films 58-2 of the second layer is lower, and accordingly lower blocking capability is a concern.

Figure 50:
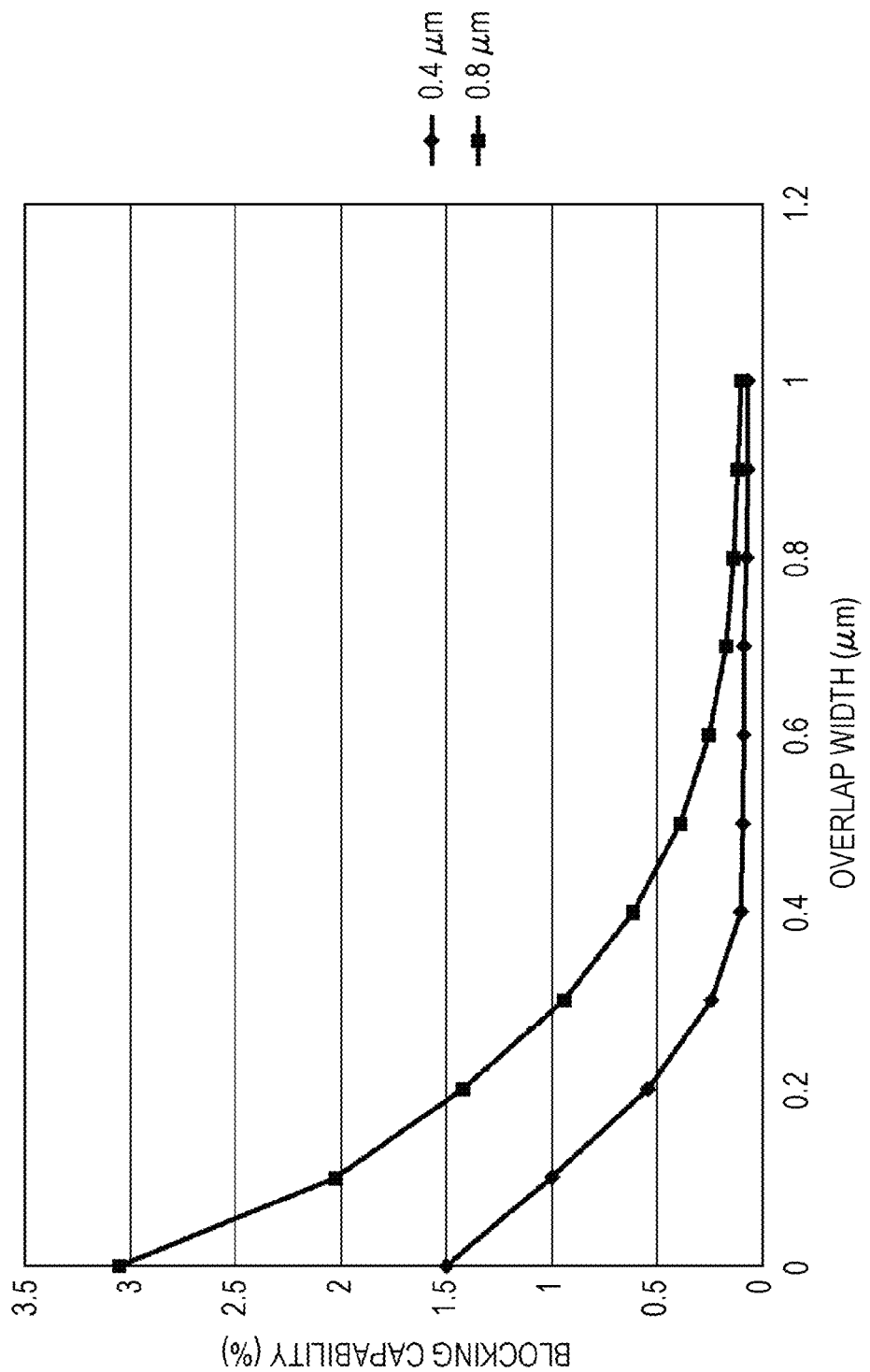
FIG. 50 is a diagram illustrating the relation between overlap width and blocking capability.

Thus, using the width of overlap when viewing the blocking films 58-1 and 58-2 in a plane view as a parameter, the results of find blocking capabilities are shown in FIG. 50. Note that the blocking capability is the result of the overlap width being 0 to 1.0 μm and the spacing in the first layer and second layer being 0.4 and 0.8 μm. In FIG. 50, the horizontal axis shows the overlap width, and the vertical axis shows the blocking capability.

As shown in FIG. 46, when the spacing between the first and second layers is 0.4 μm, a result is obtained indicating that if the overlap width is 0.4 μm or greater, the blocking capability saturates (becomes roughly the same as the blocking capability when the overlap width is 1 μm). Also, when the space between the first and second layers is 0.8 μm, a result is obtained indicating that if the overlap width is 0.8 μm or greater, the blocking capability saturates. That is to say, a result is obtained indicating that, if the overlap width is equal to or greater than roughly the same spacing as the first and second layer, even if the overlap width is further widened, blocking capability does not show a great change.

Thus, in the layer-type imaging device 11, the overlap width of the blocking films 58-2 is roughly the same as the spacing between the first and second layers. That is to say, the width of the blocking films 58-2 in the second layer is stipulated to be an sum of twice the value of the spacing between the first and second layers plus the spacing between the blocking film 58-1 in the first layer, whereby sufficient blocking capability can be obtained.

Figure 51:
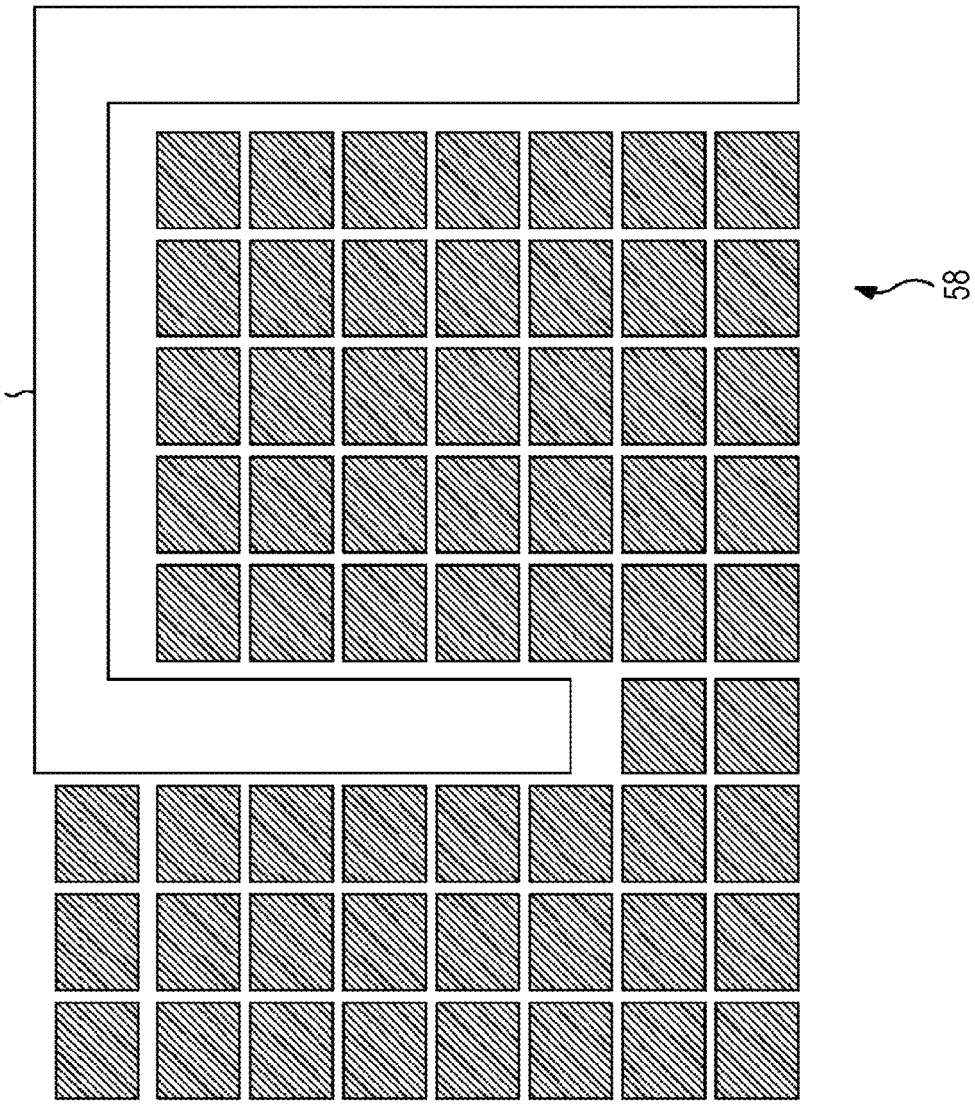
FIG. 51 is a diagram illustrating a planar configuration of a wiring layer.

Next, a planar configuration of the wiring layer 51 will be described with reference to FIG. 51. In the example in FIG. 51, rectangular shaped blocking films 58 are disposed so as to fill in the spaces that a wiring 53 disposed in the wiring layer 51 is not provided, and with the layout according to the design rules, the wiring 53 and blocking films 58 coexist. At this time, the width and minimum spacing of the blocking films 58 are set between the wirings 53, so as to have the highest blocking capability, according to a pattern in which the wiring 53 is disposed. Thus, transmitting light that transmits through the wiring layer 51 can be suppressed to a minimum. Note that line shape blocking films 58 may be disposed so as to fill in the spaces where the wirings 53 disposed on the wiring layer 51 are not provided.

Also, according to the present technology, for example, light that is noise, which is other than the light subject to detection, can be applied to a solid-state imaging device that emits light from a predetermined location, and is not limited to blocking the light emitted from the hot carrier as described above, but can be applied to a wide range.

Also, the layer-type imaging device 11 in a configuration such as that described above can be applied to types of electronic devices such as an imaging system such as a digital still camera or digital video camera, a cellular phone having an imaging function, or other devices having an imaging function.

Also, the layer-type imaging device 11 according to the present technology can be employed, not only in a rear-projection type CMOS type solid-state imaging device, but also in a front-projection type CMOS type solid state imaging device or CCD type solid-state imaging device.

Example of Electronic Device Using Solid-State Imaging Device

The solid-state imaging device relating to the present technology described above according to the present embodiments can be applied to electronic devices such as a camera system such as a digital still camera or digital video camera, a cellular phone having an imaging function, or other devices having an imaging function, for example.

Figure 52:
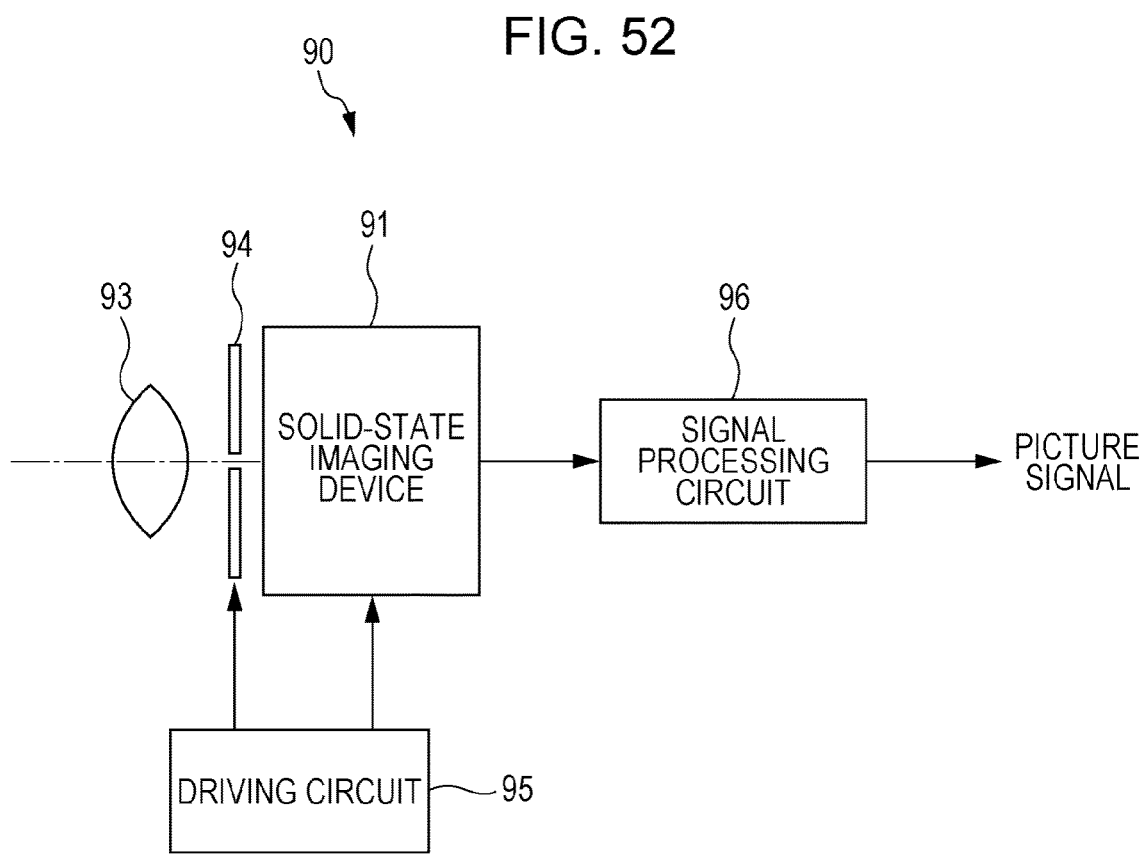
FIG. 52 is a configuration diagram of an electronic device using a solid-state imaging device obtained by applying the present technology.

FIG. 52 shows a configuration example of a camera using a solid-state imaging device as an example of an electronic device relating to the present technology. The camera relating to the present embodiment uses a video camera capable of still images or moving pictures, as an example. A camera 90 has a solid-state imaging device 91, an optical system 93 that guides incident light in an light receiving sensor unit of the solid-state imaging device 91, a shutter device 94, a driving circuit 95 that drives the solid-state imaging device 91, and a signal processing circuit 96 that processes the output signal of the solid-state imaging device 91.

The solid-state imaging device 91 applies a solid-state imaging device in a configuration described according to the embodiments described above. The optical system (optical lens) 93 forms image light (incident light) form a subject as an image on an imaging face of the solid-state imaging device 91. Thus, signal load is accumulated in the solid-state imaging device 91 for a fixed amount of time. This optical system 93 may be an optical lens system made up of multiple optical lenses. The shutter device 94 controls the light irradiation periods and light blocking periods to the solid-state imaging apparatus 91. The driving circuit 95 supplies a driving signal to the solid-state imaging device 91 and shutter device 94, and with the supplied driving signal (timing signal), controls the signal output operations of the solid-state imaging device 91 to the signal processing circuit 95, and controls the shutter operations of the shutter device 94. That is to say, the driving circuit 95 performs signal transfer operations from the solid-state imaging device 91 to the signal processing circuit 96 by supplying a driving signal (timing signal). The signal processing circuit 96 performs various types of signal processing as to the signal transferred from the solid-state imaging device 91. The picture signal subjected to signal processing is stored in a storage medium such as memory, or is output to a monitor.

According to the electronic device relating to the above-described present embodiments, a solid-state imaging device having favorable light receiving properties of one of the above-described first through fifth embodiments is used, whereby high color images and miniaturization of the electronic device having an imaging function can be achieved.

The present disclosure contains subject matter related to that disclosed in Japanese Priority Patent Application JP 2011-157977 filed in the Japan Patent Office on Jul. 19, 2011, Japanese Priority Patent Application JP 2011-162228 filed in the Japan Patent Office on Jul. 25, 2011, and Japanese Priority Patent Application JP 2011-196785 filed in the Japan Patent Office on Sep. 9, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A manufacturing method of a semiconductor device, comprising:
forming a first circuit substrate on which a first wiring is provided;
forming a second circuit substrate on which a second wiring is provided;
facing said first circuit substrate to an upper face of said second circuit substrate, and layering and bonding thereto;
forming a first opening on an upper face of said first wiring on a layered body of said first circuit substrate and said second circuit substrate, and forming a second opening on an upper face of said second wiring, wherein said first opening extends along a first line through an entire thickness of said first circuit substrate, and a portion of a first wiring layer that includes the first wiring, and wherein said second opening extended along a second line through all of said first semiconductor substrate, an entire thickness of the first wiring layer that includes the first wiring, and a portion of a second wiring layer that includes the second wiring;
forming a connecting conductive layer by filling in a metallic material within said first opening and said second opening to provide a first plug and a second plug, wherein the first plug is in electrical contact with the first wiring, and wherein said second plug is in electrical contact with said second wiring, and wherein said first line is separate and spaced apart from said second line within a plane parallel to the upper face of said second circuit substrate, and to provide connective wiring to electrically connect said first plug and said second plug, wherein said connective wiring is formed adjacent a first surface of the first circuit substrate on a side of the first circuit substrate that is opposite said second circuit substrate, wherein said connective wiring extends along a third line that is perpendicular to the first and second lines and that is parallel to the first surface of the first circuit substrate, and wherein said first wiring is electrically connected to said second wiring through said first plug, said connecting conductive layer, and said second plug;
forming a passivation film so as to cover an upper face of said connective wiring in said connecting conductive layer;
wherein, in said forming of said passivation film, said passivation film is formed by forming an insulating film of one of $SiO_2$, SiOC, or SiOF, with a high-density plasma CVD method, O3 TEOS CVD method, or ALD method.

2. The manufacturing method of a semiconductor device of claim 1, further comprising:
forming an insulating film that covers at least a portion of the first connecting conductive layer and at least a portion of the first circuit substrate.

3. The manufacturing method of a semiconductor device of claim 1, wherein the at least one photodiode is formed in the first circuit substrate.

4. The manufacturing method of a semiconductor device of claim 2, wherein the passivation film covers at least a portion of the insulating film.

5. A semiconductor device comprising:
a layered body including a first circuit substrate on which a first wiring layer that includes a first wiring is provided is faced and bonded to an upper face of a second circuit substrate on which a second wiring layer that includes a second wiring is provided;
a connecting conductive layer that is provided on an upper face side of said layered body, and that electrically connects said first wiring and said second wiring; and
a passivation film provided on the upper face of said layered body so as to cover said connecting conductive layer;

said connecting conductive layer further including
- a first plug and a second plug provided by filling a metallic material in a first opening formed on an upper face of said first wiring of the layered body of said first circuit substrate and said second circuit substrate, and in a second opening formed on an upper face of said second wiring thereof, wherein said first plug extends along a first line through an entire thickness of the first circuit substrate, and a portion of the first wiring layer to electrically contact the first wiring, wherein said second plug extends along a second line through all of the first semiconductor substrate, an entire thickness of the first wiring layer, and a portion of the second wiring layer to contact that second wiring, and wherein said third line is parallel to, separate from, and spaced apart from the second line in a plane parallel to the upper face side of the layered body; and
- a connective wiring formed with a metallic material so as to electrically connect said first plug and said second plug, wherein the connective wiring extends along a third line that is perpendicular to the first and second lines and that is parallel to the upper face side of the layered body;

wherein said passivation film is formed by forming an insulating film of one of $SiO_2$, SiOC, or SiOF, with a high-density plasma CVD method, O3 TEOS CVD method, or ALD method.

6. The semiconductor device of claim 5, further comprising an insulating film, wherein the insulating film covers at least a portion of the connective wiring and at least a portion of the first circuit substrate.

7. The semiconductor device of claim 5, wherein the passivation film covers at least a portion of the insulating film.

8. The semiconductor device of claim 5, wherein the first substrate includes at least one photodiode.

9. An electronic device comprising:
- a layered body including a first circuit substrate on which a first wiring layer that includes a first wiring is provided is faced and bonded to an upper face of a second circuit substrate on which a second wiring layer that includes a second wiring is provided;
- a connecting conductive layer that is provided on an upper face side of said layered body, and that electrically connects said first wiring and said second wiring; and
- a passivation film provided on the upper face of said layered body so as to cover said connecting conductive layer;

said connecting conductive layer further including
- a first plug and a second plug provided by filling a metallic material in a first opening formed on an upper face of said first wiring of the layered body of said first circuit substrate and said second circuit substrate, and in a second opening formed on an upper face of said second wiring thereof, wherein said first plug extends along a first line through an entire thickness of the first circuit substrate, and a portion of the first wiring layer to electrically contact the first wiring, wherein said second plug extends along a second line through all of the first semiconductor substrate, an entire thickness of the first wiring layer, and a portion of the second wiring layer to contact the second wiring, and wherein said third line is parallel to, separate from, and spaced from the second line in a plane parallel to the upper face side of the layered body; and
- a connective wiring formed with a metallic material so as to electrically connect said first plug and said second plug, wherein the connective wiring extends along a third line that is perpendicular to the first and second lines and that is parallel to the upper face side of the layered body;

wherein said passivation film is formed by forming an insulating film of one of $SiO_2$, SiOC, or SiOF, with a high-density plasma CVD method, O3 TEOS CVD method, or ALD method.

10. The electronic device of claim 9, further comprising an insulating film, wherein the insulating film covers at least a portion of the connective wiring and at least a portion of the first circuit substrate.

11. The electronic device of claim 9, wherein the passivation film covers at least a portion of the insulating film.

12. The electronic device of claim 9, wherein the first substrate includes at least one photodiode.

* * * * *